US012707715B2

(12) United States Patent
Liaw

(10) Patent No.: US 12,707,715 B2
(45) Date of Patent: Aug. 11, 2026

(54) SEMICONDUCTOR STRUCTURE AND METHOD FOR MANUFACTURING THE SAME

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 651 days.

(21) Appl. No.: 18/155,354

(22) Filed: Jan. 17, 2023

(65) Prior Publication Data

US 2024/0243133 A1 Jul. 18, 2024

(51) Int. Cl.
*H10D 84/90* (2025.01)

(52) U.S. Cl.
CPC ......... *H10D 84/907* (2025.01); *H10D 84/953* (2025.01)

(58) Field of Classification Search
CPC .................................................. H10D 30/6735
See application file for complete search history.

(56) References Cited

U.S. PATENT DOCUMENTS 9,209,247 B2 12/2015 Colinge et al.
9,236,267 B2 1/2016 De et al.
9,412,817 B2 8/2016 Yang et al.
9,412,828 B2 8/2016 Ching et al.
9,472,618 B2 10/2016 Oxland
9,502,265 B1 11/2016 Jiang et al.
9,520,482 B1 * 12/2016 Chang .................. H10D 84/038
9,536,738 B2 1/2017 Huang et al.
9,576,814 B2 2/2017 Wu et al.
9,608,116 B2 3/2017 Ching et al.
11,349,002 B2 * 5/2022 Lin .................... H10D 30/6219
11,990,525 B2 * 5/2024 Lin ...................... H10D 84/038
2015/0054078 A1 * 2/2015 Xie ...................... H10D 86/215 257/288
2019/0295898 A1 * 9/2019 Xie ...................... H10D 84/038
2019/0326395 A1 * 10/2019 Ando ................... H10D 64/017
2020/0006336 A1 * 1/2020 Lung ...................... H10D 62/83
(Continued)

*Primary Examiner* — Mounir S Amer
*Assistant Examiner* — Alexander Belousov
(74) *Attorney, Agent, or Firm* — Cooper Legal Group, LLC

(57) ABSTRACT

A method for manufacturing a semiconductor structure includes defining active areas extending in an X-direction, arranged in a Y-direction, and on a substrate. Each of the active areas has nanostructures. The method further includes forming dummy gate structures across the active areas in the Y-direction, forming merged source/drain features in the active areas and on opposite sides of the dummy gate structures in the X-direction, forming dielectric structures in the active areas to cut each of the merged source/drain features into a first source/drain feature and a second source/drain feature, and to cut each of the dummy gate structures into segments, and replacing the segments of the dummy gate structures with gate structures wrapping around the nanostructures in the active areas. The dielectric structures are in contact with sidewalls of the first source/drain features, the second source/drain features, and the gate structures.

20 Claims, 51 Drawing Sheets

(56) References Cited

U.S. PATENT DOCUMENTS

| | | | | |
|---|---|---|---|---|
| 2021/0074697 | A1* | 3/2021 | Baek | H10D 62/151 |
| 2021/0408263 | A1* | 12/2021 | Lin | H10D 30/6219 |
| 2022/0102509 | A1* | 3/2022 | Lin | H10D 30/6219 |
| 2022/0293752 | A1* | 9/2022 | Lin | H10D 84/0188 |
| 2024/0204082 | A1* | 6/2024 | Chan | H10D 30/43 |
| 2024/0243133 | A1* | 7/2024 | Liaw | H10D 84/907 |
| 2024/0313072 | A1* | 9/2024 | Lin | H10D 62/116 |
| 2024/0371728 | A1* | 11/2024 | Chu | H01L 23/481 |
| 2025/0142892 | A1* | 5/2025 | Xie | H10D 64/017 |

* cited by examiner

SEMICONDUCTOR STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins.

However, as GAA transistors and circuit cells continue to be scaled down, existing contact features for source/drain features impact the isolation margin as well as cost. Accordingly, although existing technologies for fabricating circuit cells including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
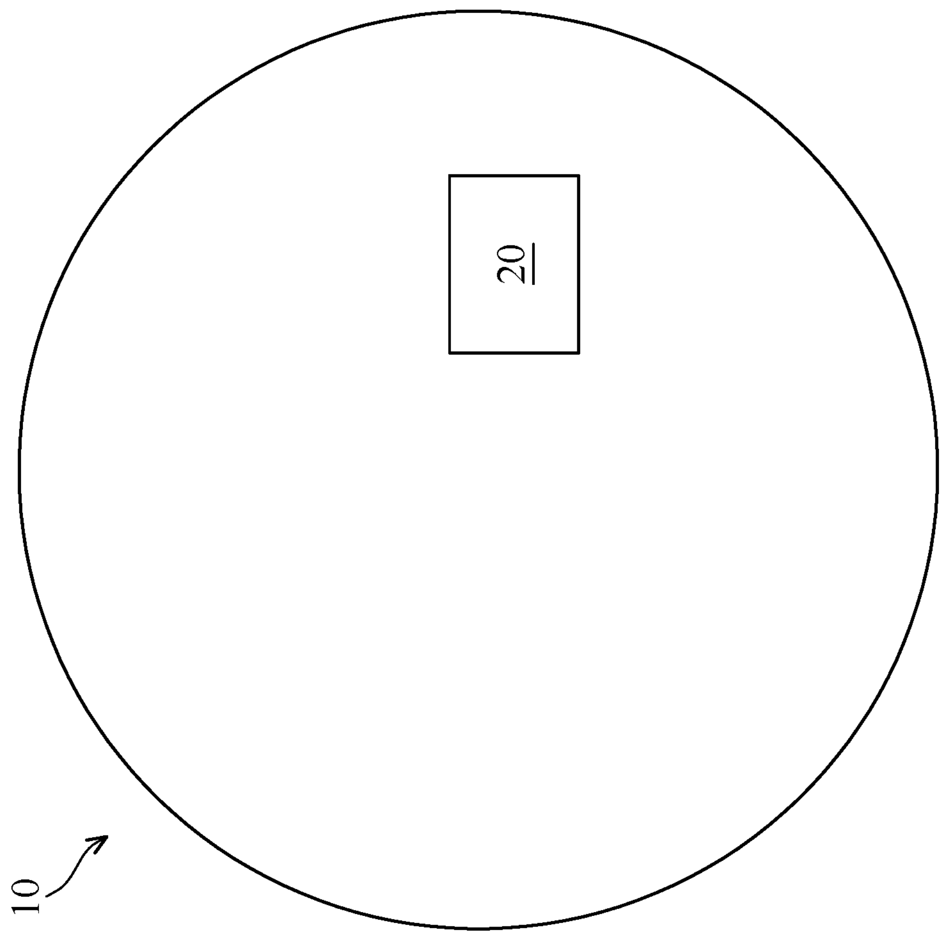
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures of circuit cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include a dielectric structure for cutting each of features (merged source/drain features and channels) in one large active area into two portions (or segments) for two transistors in different circuit cells, respectively. The details of the present disclosure are described below in conjunction with the accompanying drawings, which illustrate the layout and structure of circuit cells, according to some embodiments.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. As shown in FIG. 1, the IC chip 10 includes a logic region 20. The logic region 20 may include an array of circuit cells having various logic cells or standard (STD) cells. The logic cells or STD cells may include transistors and interconnect structures that combine to provide a logic device and/or a logic function, such as an inverter, an AND, an NAND, an OR, an NOR, a NOT, an XOR, an XNOR, other suitable logic devices, or combinations thereof. FIG. 1 has been simplified for the sake of clarity to better understand the inventive concepts of the present disclosure. Additional features can be added in the IC chip 10, and some of the features described herein can be replaced, modified, or eliminated in other embodiments of the IC chip 10.

FIGS. 2A to 2E are circuit schematics of various STD cells in the array of circuit cells in the logic region 20 of the IC chip 10, in accordance with some embodiments of the present disclosure.

Figure 2C:
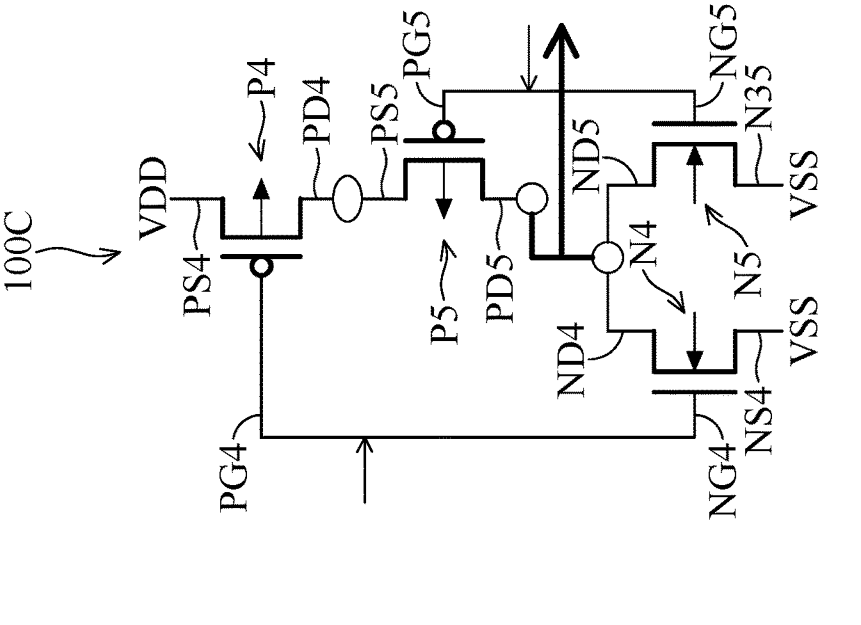
FIGS. 2A, 2B, 2C, 2D, and 2E are circuit schematics of various STD cells in the array of circuit cells in the logic region of the IC chip, in accordance with some embodiments of the present disclosure.
Figure 2B:
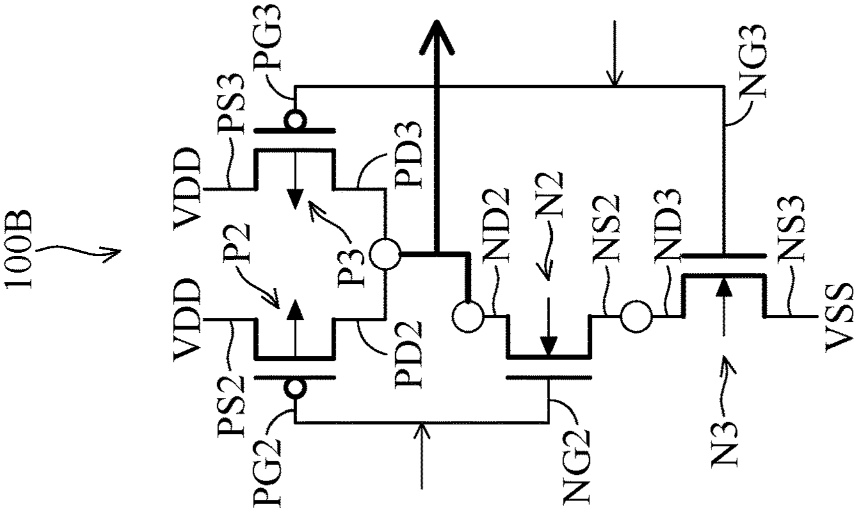
Figure 2A:
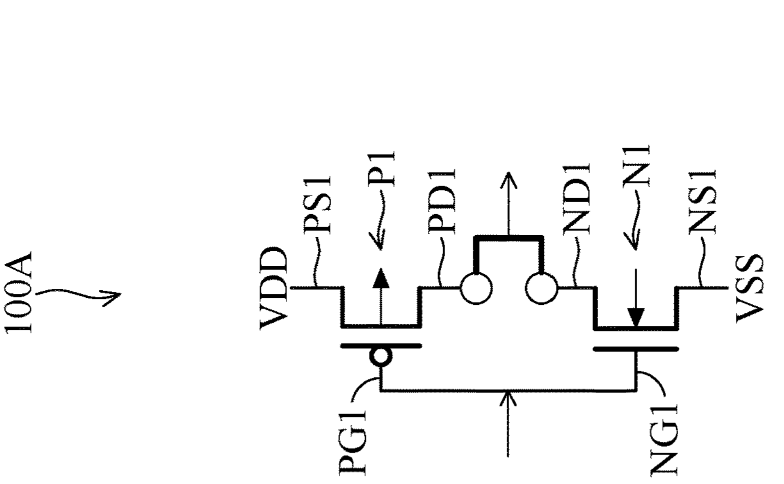

FIG. 2A shows an inverter 100A including an n-type transistor N1 and a P-type transistor P1. The n-type transistor N1 includes a source terminal NS1, a drain terminal ND1, and a gate terminal NG1, and the P-type transistor P1 includes a source terminal PS1, a drain terminal PD1, and a gate terminal PG1.

As shown in FIG. 2A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

FIG. 2B shows a NAND (also referred to as a NAND logic gate, a NAND device or a NAND cell) 100B including n-type transistors N2, N3 and P-type transistors P2, P3. The n-type transistor N2 includes a source terminal NS2, a drain terminal ND2, and a gate terminal NG2, and the n-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 2B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as "common drain." The source terminals PS2 and PS3 are coupled to the VDD voltage. The source terminal NS3 is coupled to VSS voltage. The source terminal NS2 and drain terminal ND3 are coupled with each other.

FIG. 2C shows a NOR (also referred to as a NOR logic gate, a NOR device or a NOR cell) 100C including n-type transistors N4, N5 and P-type transistors P4, P5. The n-type transistor N4 includes a source terminal NS4, a drain terminal ND4, and a gate terminal NG4, and the n-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 2C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as "common drain." The source terminal PS4 is coupled to the VDD voltage. The source terminals NS4 and NS5 are coupled to VSS voltage. The source terminal PS5 and drain terminal PD4 are coupled with each other.

Figure 2D:
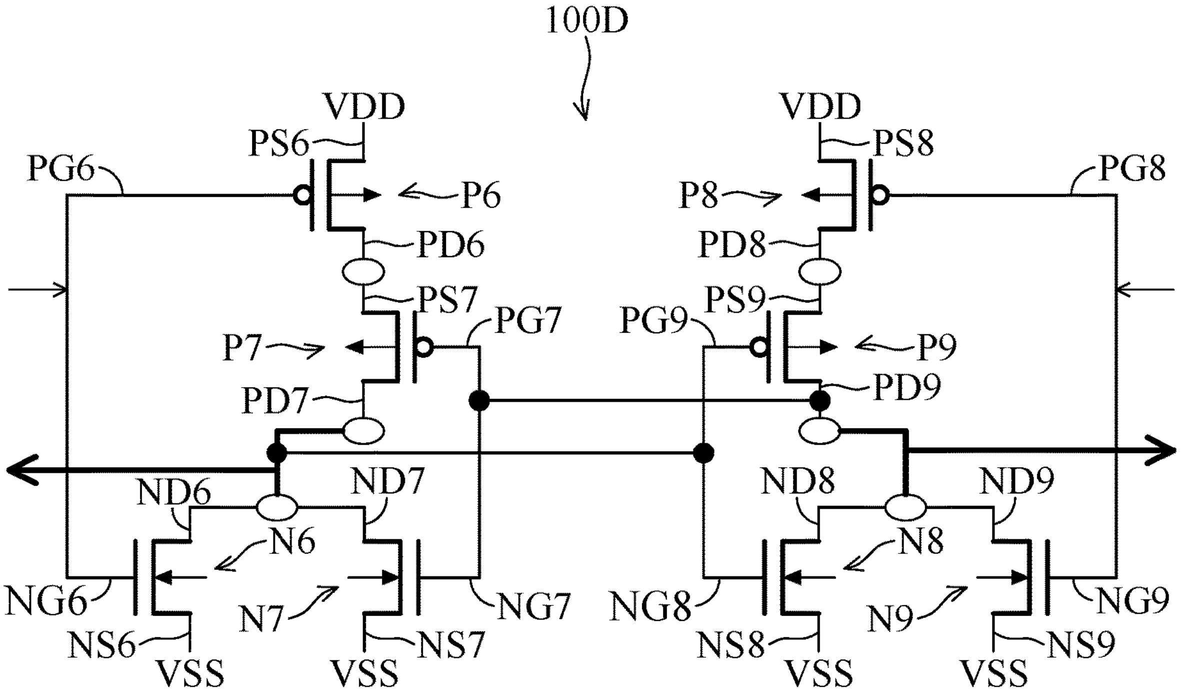

FIG. 2D shows a flip-flop (also referred to as a flip-flop device or a flip-flop cell) 100D including n-type transistors N6, N7, N8, N9 and P-type transistors P6, P7, P8, P9. The n-type transistor N6 includes a source terminal NS6, a drain terminal ND6, and a gate terminal NG6; the n-type transistor N7 includes a source terminal NS7, a drain terminal ND7, and a gate terminal NG7; the n-type transistor N8 includes a source terminal NS8, a drain terminal ND8, and a gate terminal NG8; and the n-type transistor N9 includes a source terminal NS9, a drain terminal ND9, and a gate terminal NG9. The P-type transistor P6 includes a source terminal PS6, a drain terminal PD6, and a gate terminal PG6; the P-type transistor P7 includes a source terminal PS7, a drain terminal PD7, and a gate terminal PG7; the P-type transistor P8 includes a source terminal PS8, a drain terminal PD8, and a gate terminal PG8; and the P-type transistor P9 includes a source terminal PS9, a drain terminal PD9, and a gate terminal PG9.

As shown in FIG. 2D, the flip-flop 100D is a set-reset (SR) NOR latch. The NOR latch may include a pair of cross-coupled NOR. Specifically, the output terminal of a first NOR is coupled to the second input terminal of a second NOR, and the output terminal of the second NOR is coupled to the second input terminal of the first NOR. The details of the other connections of the flip-flop 100D are similar to the NOR 100C, and may not be described in detail herein.

Figure 2E:
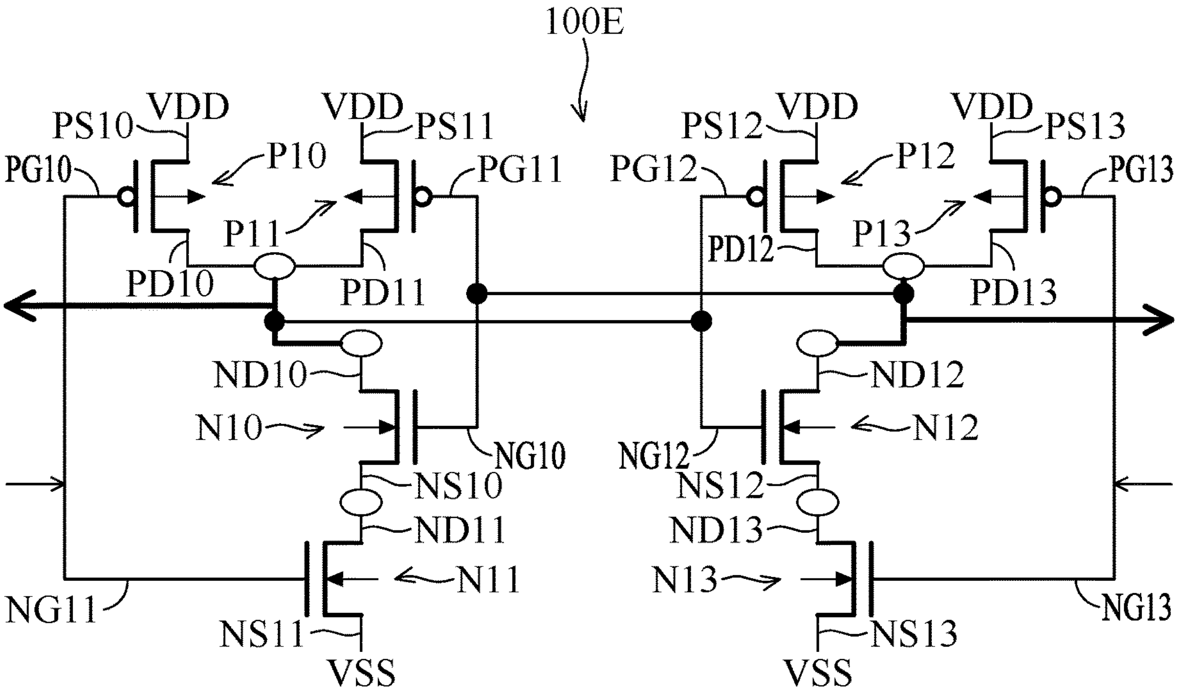

FIG. 2E shows a flip-flop 100E including n-type transistors N10, N11, N12, N13 and P-type transistors P10, P11, P12, P13. The n-type transistor N10 includes a source terminal NS10, a drain terminal ND10, and a gate terminal NG10; the n-type transistor N11 includes a source terminal NS11, a drain terminal ND11, and a gate terminal NG11; the n-type transistor N12 includes a source terminal NS12, a drain terminal ND12, and a gate terminal NG12; and the n-type transistor N13 includes a source terminal NS13, a drain terminal ND13, and a gate terminal NG13. The P-type transistor P10 includes a source terminal PS10, a drain terminal PD10, and a gate terminal PG10; the P-type transistor P11 includes a source terminal PS11, a drain terminal PD11, and a gate terminal PG11; the P-type transistor P12 includes a source terminal PS12, a drain terminal PD12, and a gate terminal PG12; and the P-type transistor P13 includes a source terminal PS13, a drain terminal PD13, and a gate terminal PG13.

As shown in FIG. 2E, the flip-flop 100E is a SR NAND latch. The NAND latch may include a pair of cross-coupled NAND. Specifically, the output terminal of a first NAND is coupled to the first input terminal of a second NAND, and the output terminal of the second NAND is coupled to the first input terminal of the first NAND. The details of the other connections of the flip-flop 100E are similar to the NAND 100B, and may not be described in detail herein.

Figure 3:
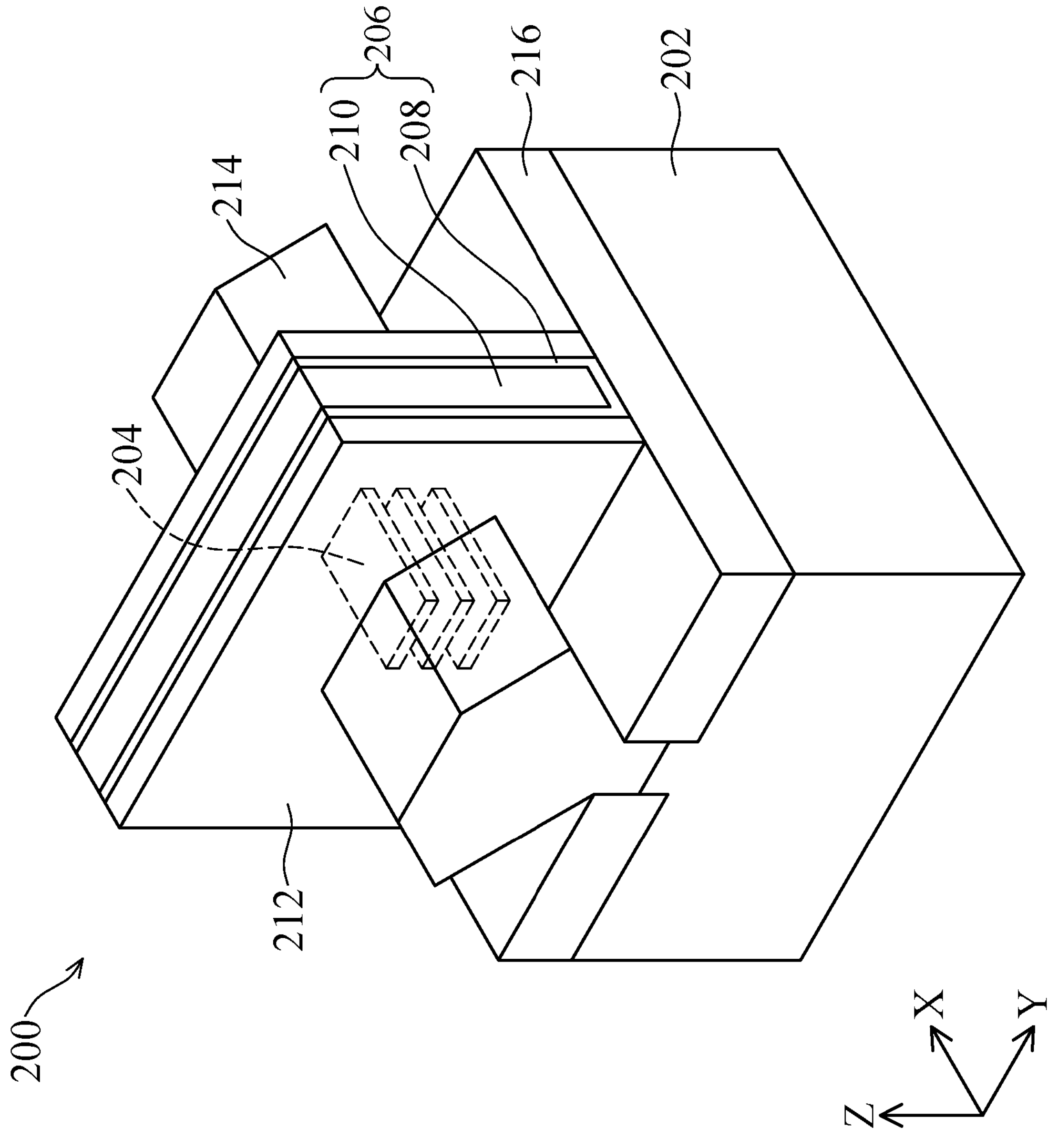
FIG. 3 is a perspective view of a GAA transistor in the array of circuit cells, in accordance with some embodiments of the present disclosure.

Each of the circuit cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 3. However, it should be understood that the application should not be limited to a particular type of device, except as specifically claimed.

Referring to FIG. 3, a perspective view of an exemplary GAA transistor 200 is illustrated. The GAA transistor 200 is formed over a substrate 202. The substrate 202 may contains a semiconductor material, such as bulk silicon (Si). The GAA transistor 200 also includes one or more nanostructures 204 (dash lines) extending in an X-direction and vertically stacked (or arranged) in a Z-direction. More specifically, the nanostructures 204 are spaced from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 2, may refer to FIGS. 4C, 4D, and 4H). As shown in FIG. 2, gate spacers 212 are on sidewalls of the gate structure 206 and over the nanostructures 204 (not shown in FIG. 2, may refer to FIG. 4H)

The GAA transistor 200 further includes source/drain features 214. As shown in FIG. 2, two source/drain features 214 are on opposite sides of the gate structure 206. The nanostructures 204 (dash lines) extends in the X-direction to connect one source/drain feature 214 to the other source/drain feature 214. The source/drain features 214 may also be referred to as source/drain, or source/drain regions. In some embodiments, source/drain feature(s) may refer to a source or a drain, individually or collectively dependent upon the context.

Isolation structure 216 is over the substrate 202 and under the gate dielectric layer 208, the gate electrode 210, and the gate spacers 212. The isolation structure 216 is used for isolating the GAA transistor 200 from other devices. In some embodiments, the isolation structure 216 may include different structures, such as shallow trench isolation (STI) structure, deep trench isolation (DTI) structure. Therefore, the isolation structure 216 is also referred as to as a STI feature or DTI feature.

Figure 4A:
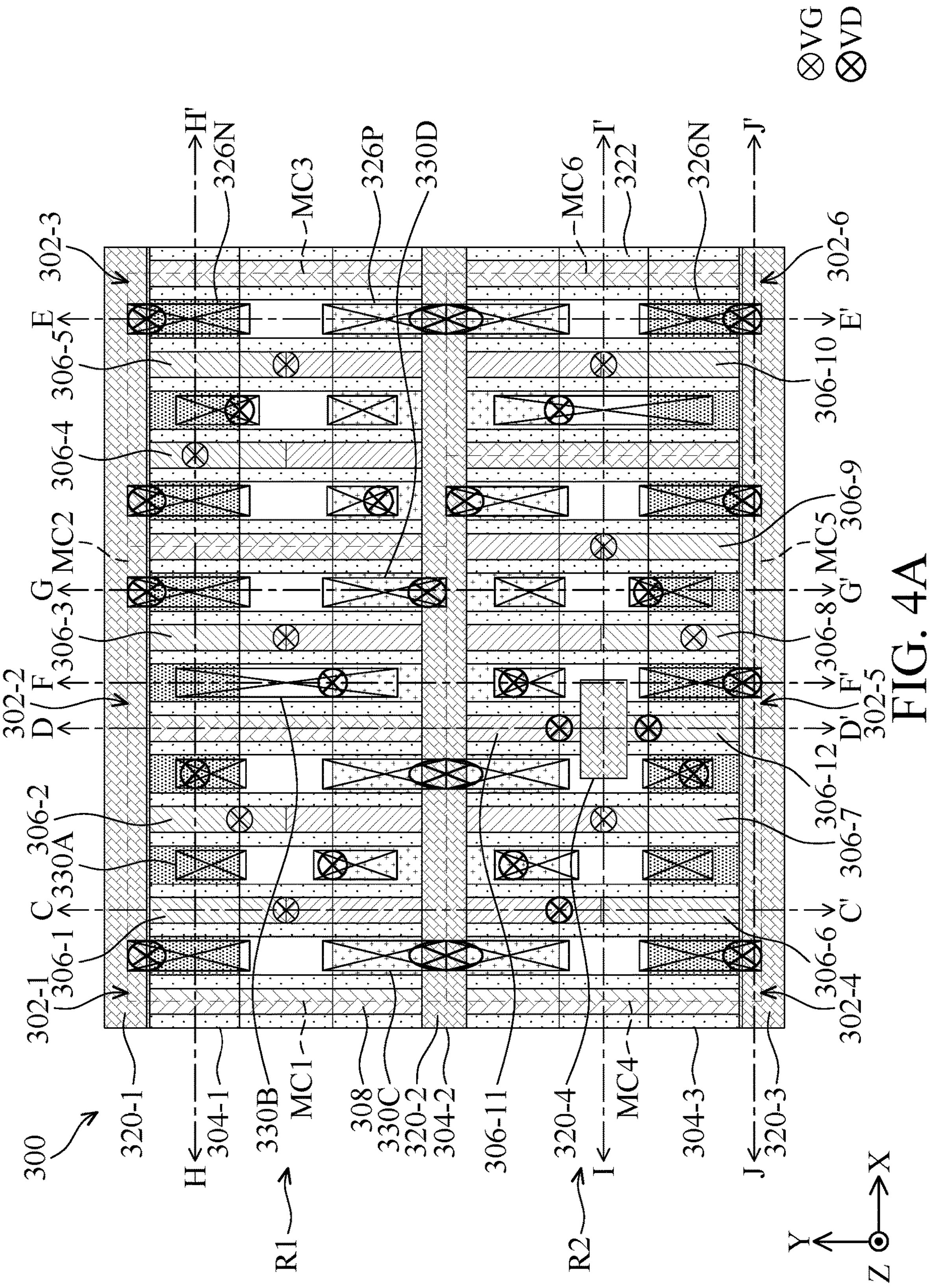
FIGS. 4A and 4B illustrate fragmentary diagrammatic top views (or layouts) of an array of circuit cells in the logic region of the IC chip, in accordance with some embodiments of the present disclosure.
Figure 4B:
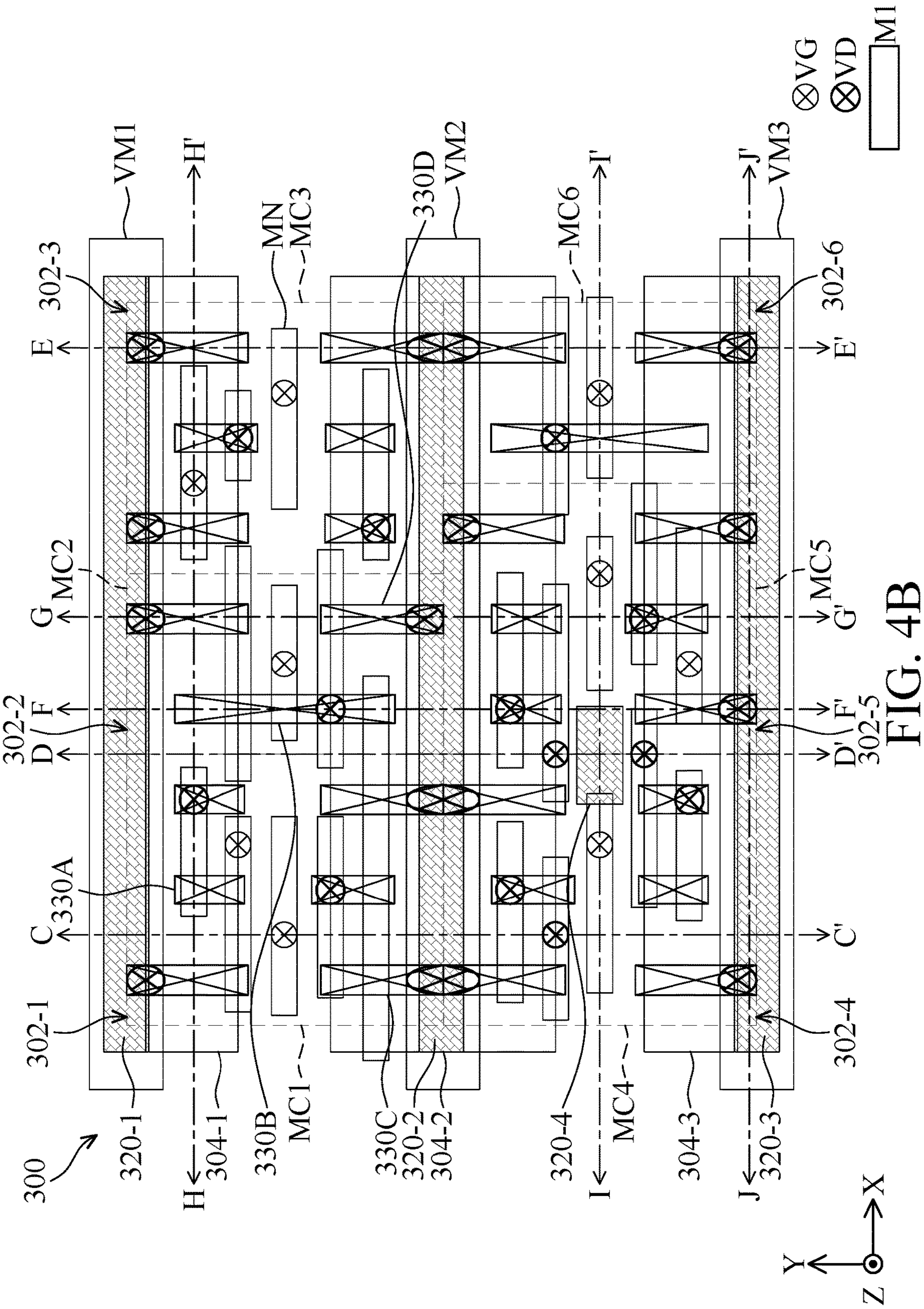

FIGS. 4A and 4B illustrate fragmentary diagrammatic top views (or layouts) of an array 300 of circuit cells in the logic region 20 of the IC chip 10, in accordance with some embodiments of the present disclosure. FIG. 4A illustrates features of transistors and vias connected to contact features and/or gate structures of the transistors, and FIG. 4B illustrates the contact features of the transistors, the vias, and metal lines.

Figure 4C:
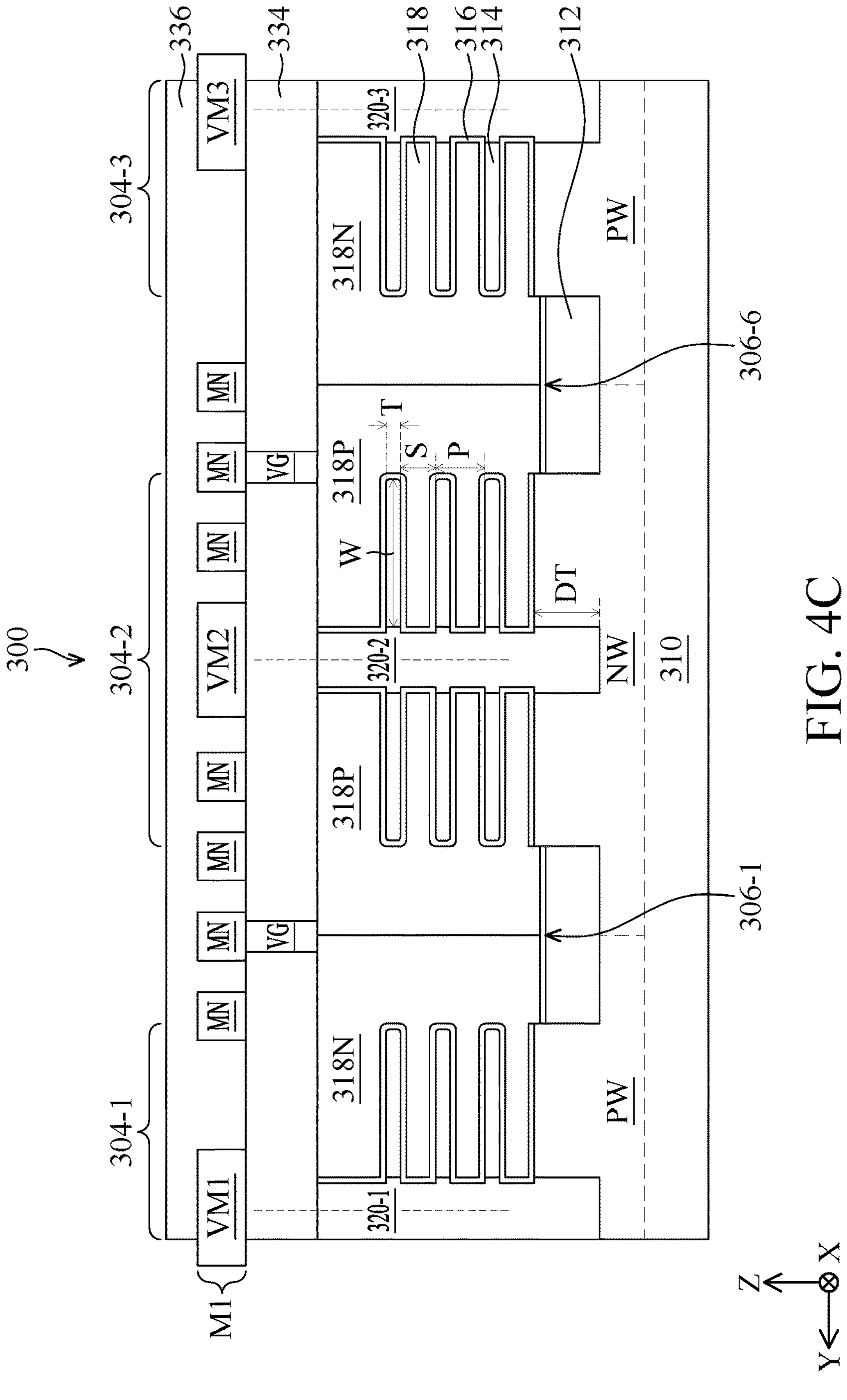
FIG. 4C illustrates a Y-Z cross-sectional view of the array of the circuit cells along a line C-C' in FIGS. 4A and 4B, in accordance with some embodiments of the present disclosure.
Figure 4D:
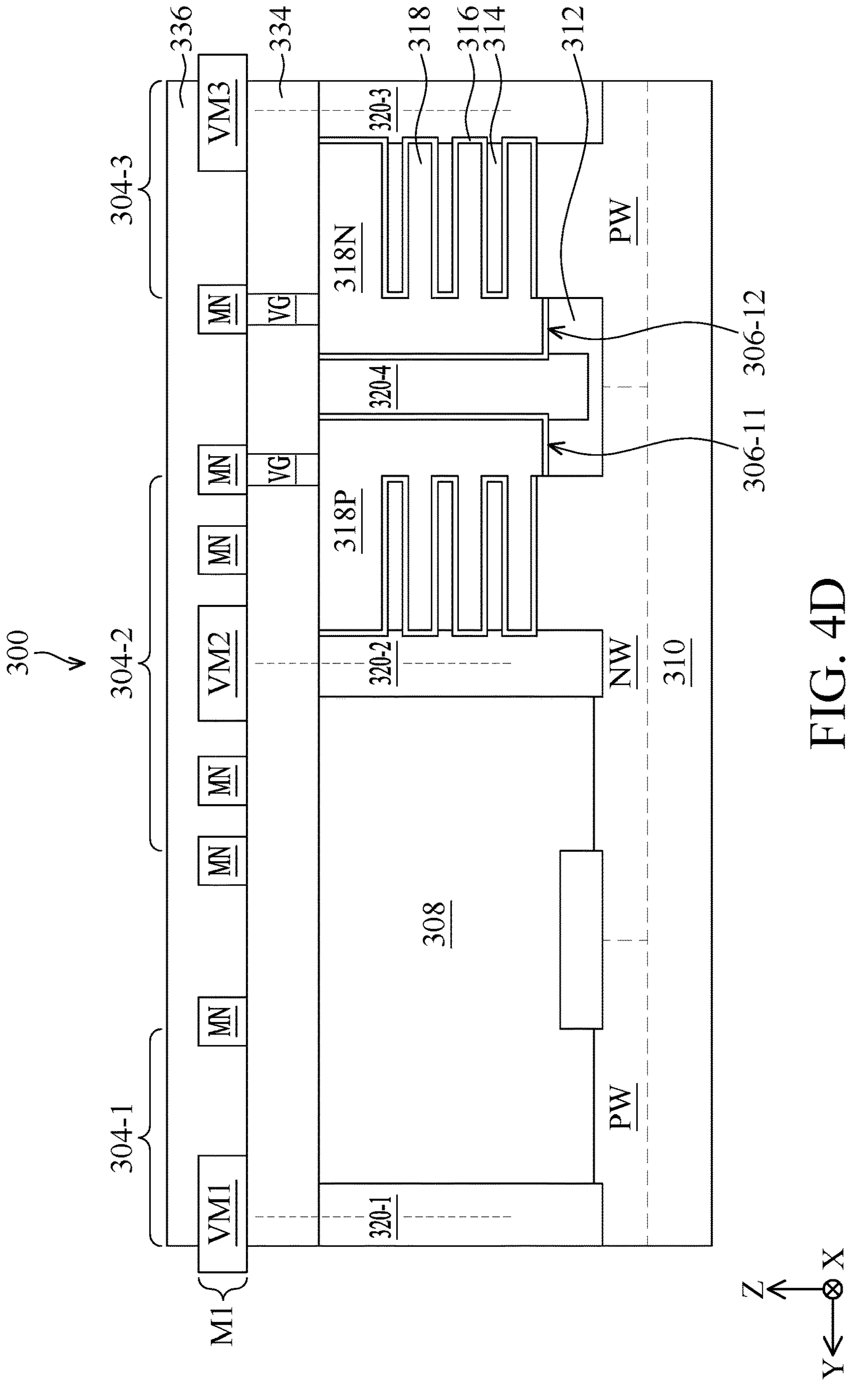
FIG. 4D illustrates a Y-Z cross-sectional view of the array of the circuit cells along a line D-D' in FIGS. 4A and 4B, in accordance with some embodiments of the present disclosure.
Figure 4E:
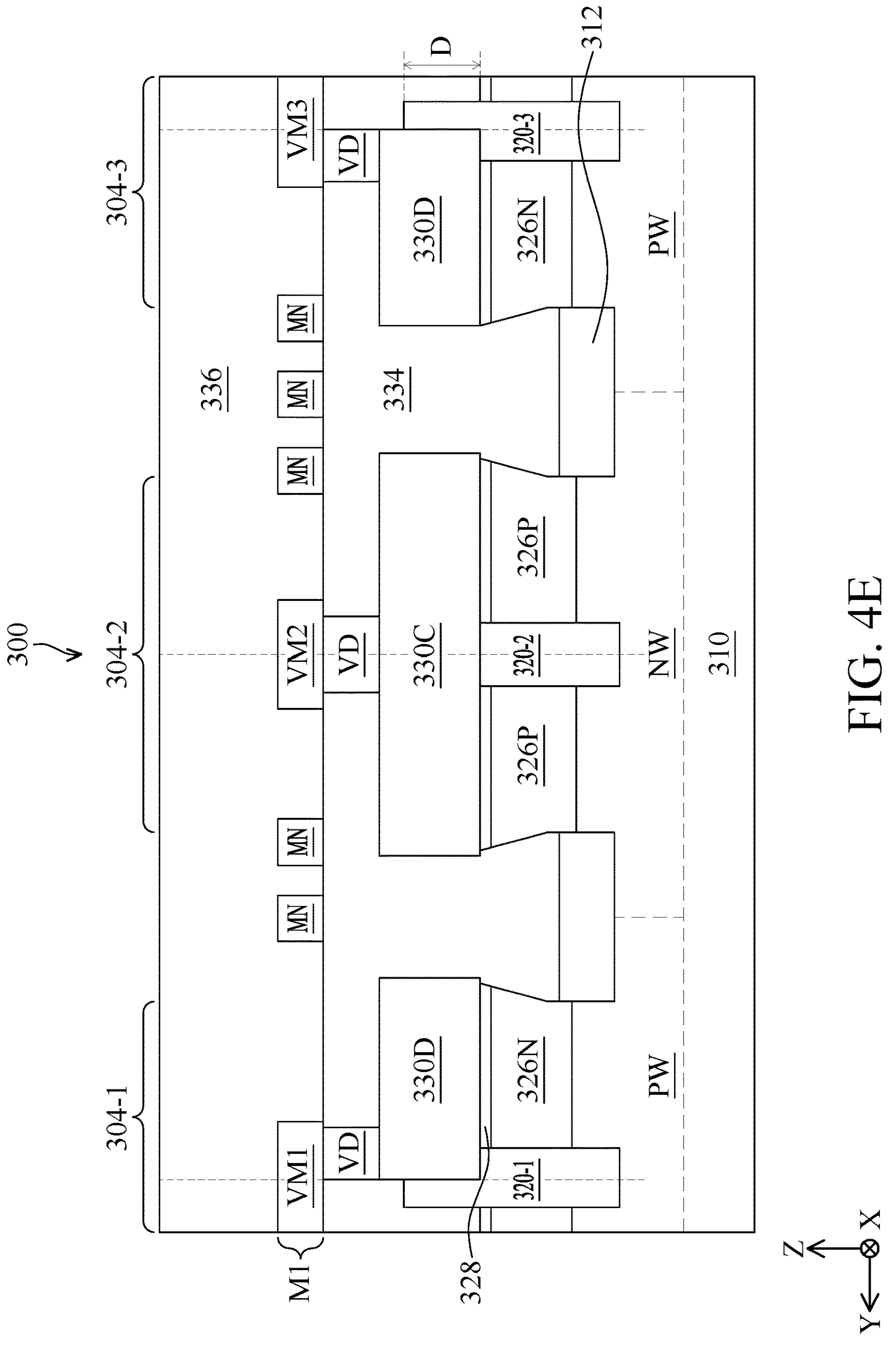
FIG. 4E illustrates a Y-Z cross-sectional view of the array of the circuit cells along a line E-E' in FIGS. 4A and 4B, in accordance with some embodiments of the present disclosure.
Figure 4F:
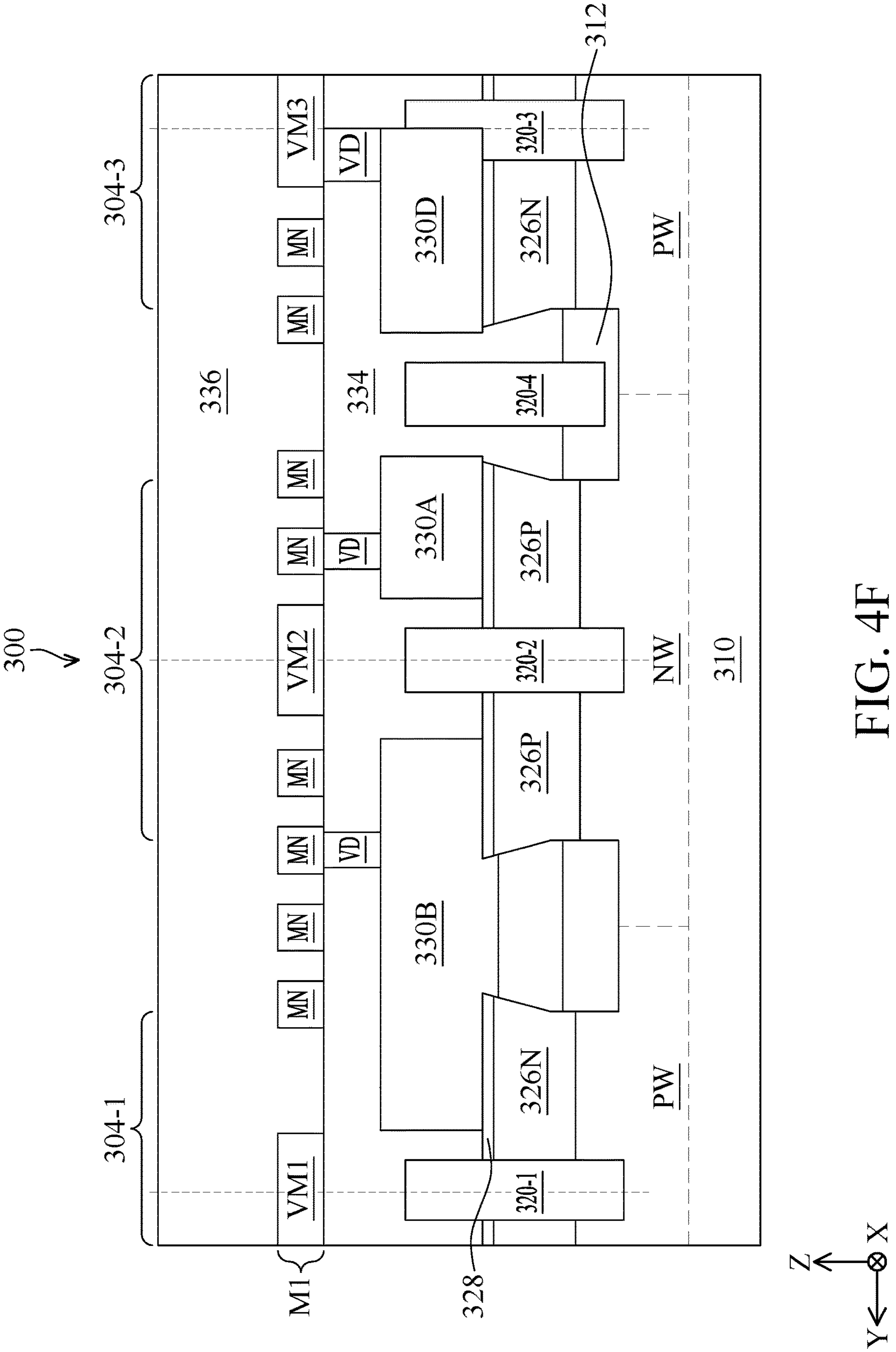
FIG. 4F illustrates a Y-Z cross-sectional view of the array of the circuit cells along a line F-F' in FIGS. 4A and 4B, in accordance with some embodiments of the present disclosure.
Figure 4G:
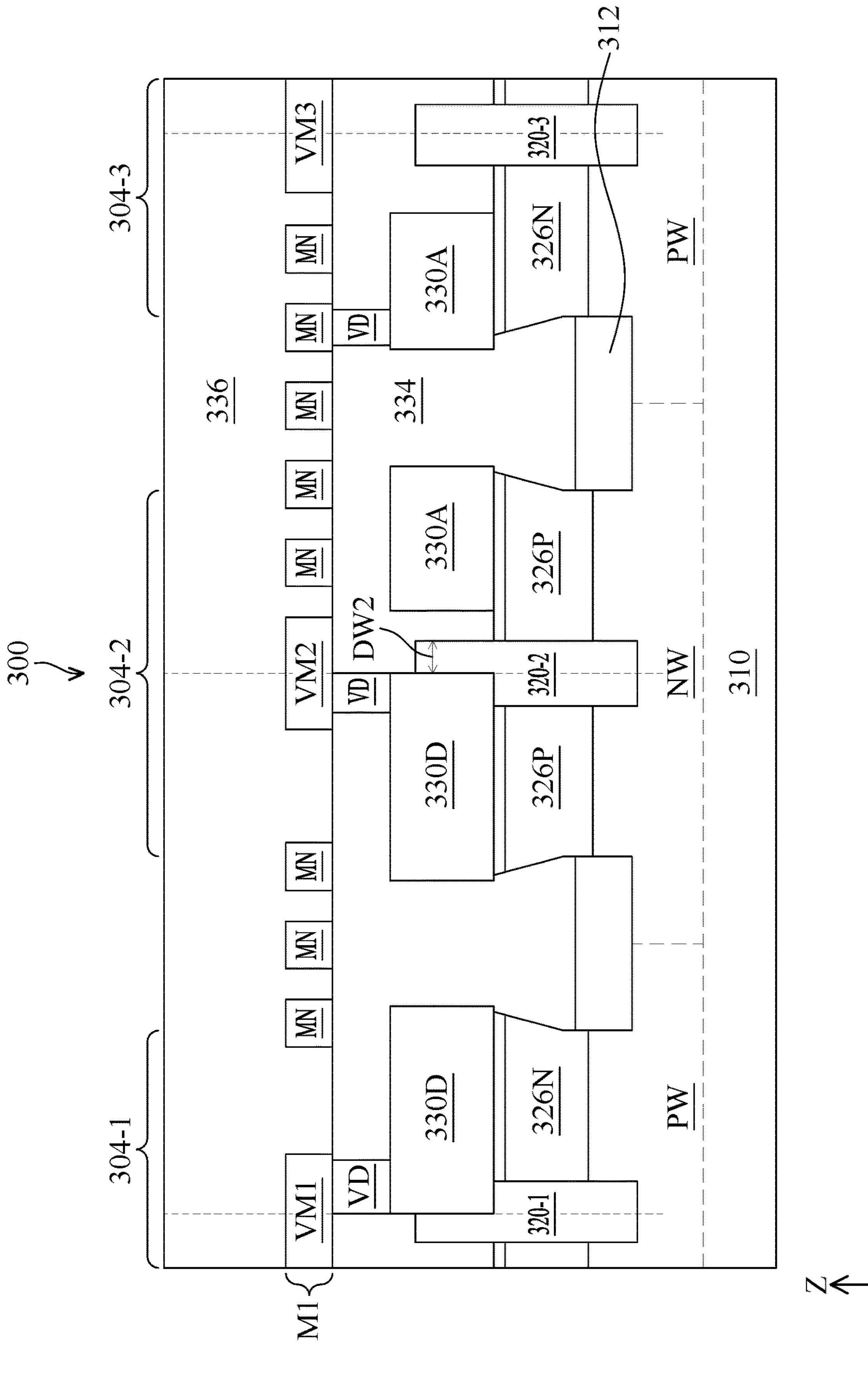
FIG. 4G illustrates a Y-Z cross-sectional view of the array of the circuit cells along a line G-G' in FIGS. 4A and 4B, in accordance with some embodiments of the present disclosure.
Figure 4H:
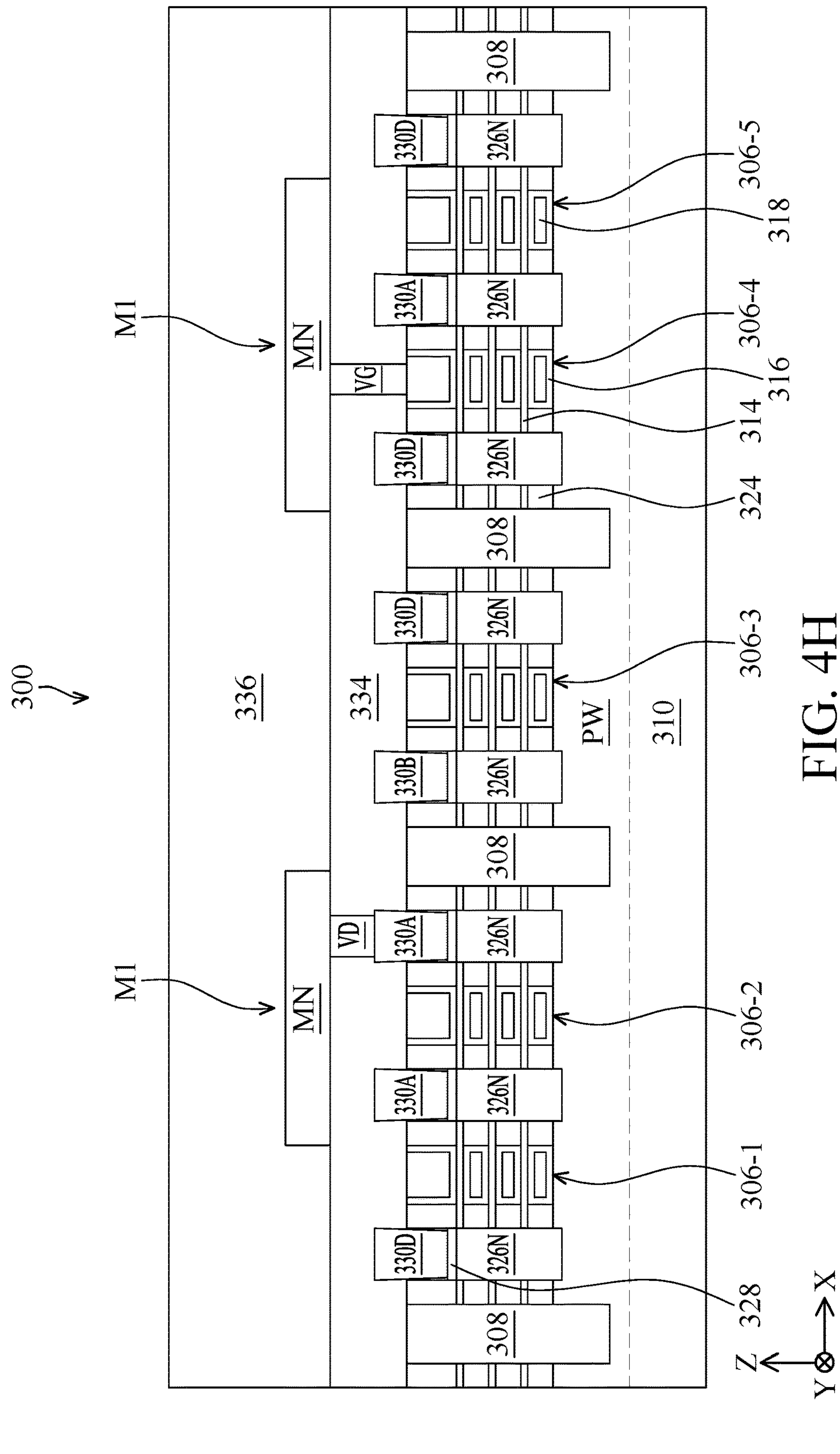
FIG. 4H illustrates an X-Z cross-sectional view of the array of the circuit cells along a line H-H' in FIGS. 4A and 4B, in accordance with some embodiments of the present disclosure.
Figure 4I:
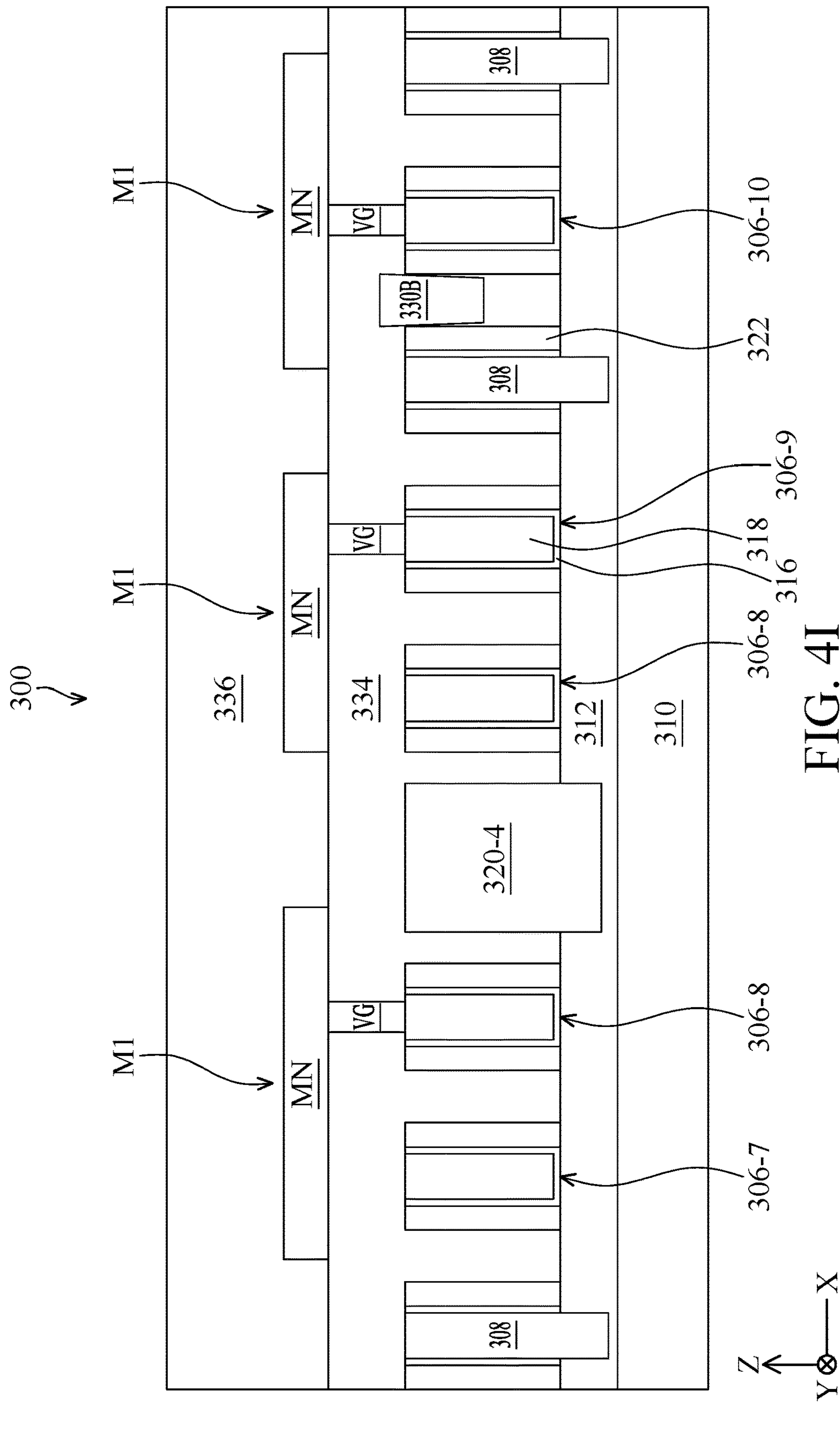
FIG. 4I illustrates an X-Z cross-sectional view of the array of the circuit cells along a line I-I' in FIGS. 4A and 4B, in accordance with some embodiments of the present disclosure.
Figure 4J:
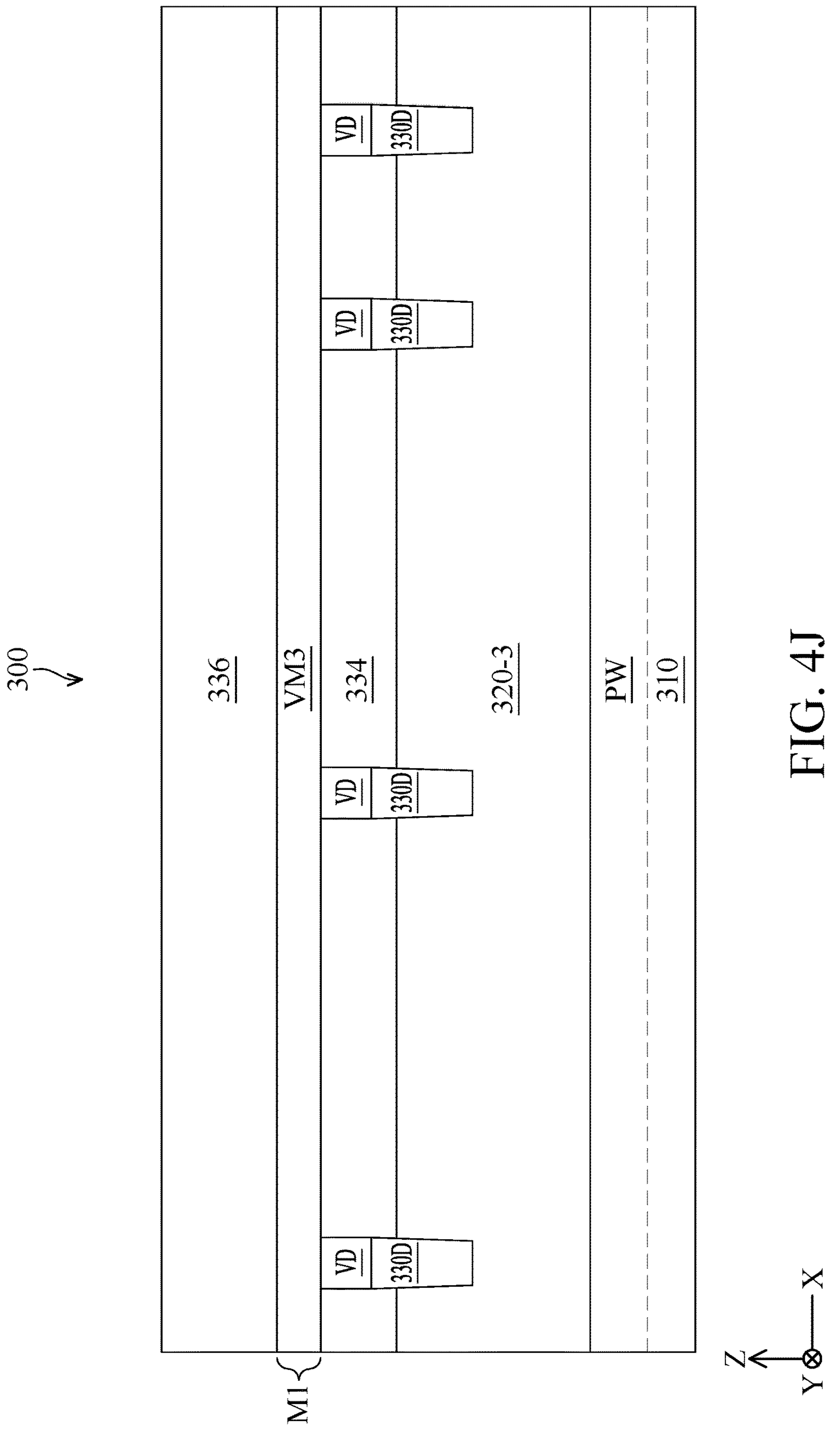
FIG. 4J illustrates an X-Z cross-sectional view of the array of the circuit cells along a line J-J' in FIGS. 4A and 4B, in accordance with some embodiments of the present disclosure.

FIG. 4C illustrates a Y-Z cross-sectional view of the array 300 of the circuit cells along a line C-C' in FIGS. 4A and 4B, in accordance with some embodiments of the present disclosure. FIG. 4D illustrates a Y-Z cross-sectional view of the array 300 of the circuit cells along a line D-D' in FIGS. 4A and 4B, in accordance with some embodiments of the present disclosure. FIG. 4E illustrates a Y-Z cross-sectional view of the array 300 of the circuit cells along a line E-E' in FIGS. 4A and 4B, in accordance with some embodiments of the present disclosure. FIG. 4F illustrates a Y-Z cross-sectional view of the array 300 of the circuit cells along a line F-F' in FIGS. 4A and 4B, in accordance with some embodiments of the present disclosure. FIG. 4G illustrates a Y-Z cross-sectional view of the array 300 of the circuit cells along a line G-G' in FIGS. 4A and 4B, in accordance with some embodiments of the present disclosure. FIG. 4H illustrates an X-Z cross-sectional view of the array 300 of the circuit cells along a line H-H' in FIGS. 4A and 4B, in accordance with some embodiments of the present disclosure. FIG. 4I illustrates an X-Z cross-sectional view of the array 300 of the circuit cells along a line I-I' in FIGS. 4A and 4B, in accordance with some embodiments of the present disclosure. FIG. 4J illustrates an X-Z cross-sectional view of the array 300 of the circuit cells along a line J-J' in FIGS. 4A and 4B, in accordance with some embodiments of the present disclosure.

The array 300 may include circuit cells, for example standard circuit cells (also referred to STD cells). As discussed above, the STD cells may include logic circuits or logic devices, including but not limited to logic circuits such as inverters, NANDs, NORs, flip-flops, or a combination thereof. For the sake of providing an example, the array 300 shows a row R1 having circuit cell 302-1 (which includes a NAND) with a cell boundary MC1, circuit cell 302-2 (which includes an inverter) with a cell boundary MC2, and circuit cell 302-3 (which includes an NOR) with a cell boundary MC3; and a row R2 having circuit cell 302-4 (which includes a NAND) with a cell boundary MC4, circuit cell 302-5 (which includes an NOR) with a cell boundary MC5, and circuit cell 302-6 (which includes an inverter) with a cell boundary MC6, as shown in FIGS. 4A and 4B. It should be understood that the circuit cells 302-1 to 302-6 are merely examples. The present disclosure applies to other types of STD cells as well, for example cells including NORs, ANDs, ORs, flip-flops, or a combination thereof.

The array 300 includes active areas, such as active areas 304-1 to 304-3, (may be collectively referred to as active areas 304) that extend lengthwise in the X-direction, as shown in FIGS. 4A and 4B. Each of active areas 304 includes channel regions, source regions, and drain regions (where source regions and drain regions are collectively referred to as source/drain regions herein) of transistors (e.g., the GAA transistor 200) of the array 300. The active area 304-2 is disposed over an n-type well (or N-Well) NW, and the active areas 304-1 and 304-3 are disposed over p-type wells (or P-Wells) PW that are on both sides of the n-type well NW in a Y-direction.

The array 300 further includes gate structures, such as gate structures 306-1 to 306-12 (may be collectively referred to as gate structures 306). The gate structures 306-1 to 306-12 extend substantially parallel to one another, extend lengthwise in the Y-direction perpendicular to the X-direction, and are separated from each other in the X-direction. The gate structures 306-1 to 306-12 are disposed over the channel regions in the respective active areas 304-1 to 304-12 (i.e., the (vertically stacked) nanostructures) and disposed between respective source/drain regions of the active areas 304-1 to 304-12 (i.e., p-type source/drain features and/or n-type source/drain features, respectively). In some embodiments, the gate structures 306-1 to 306-10 wrap and/or surround suspended, vertically stacked nanostructures 314 in the channel regions of the active areas 304-1 to 304-3 (as shown in FIGS. 4C, 4D, and 4H).

The active areas 304-1 to 304-12 and the gate structures 306-1 to 306-12 are configured to provide each of circuit cells 302-1 to 302-6 (may be collectively referred to as circuit cells 302) with transistors. In the circuit cell 302-1, the gate structure 306-1 engages the active area 304-1 to construct a transistor as the n-type transistor N3 of the NAND 100B discussed above, the gate structure 306-1 engages the active area 304-2 to construct a transistor as the p-type transistor P3 of the NAND 100B discussed above, the gate structure 306-2 engages the active area 304-1 to construct a transistor as the n-type transistor N2 of the NAND 100B discussed above, and the gate structure 306-2 engages the active area 304-2 to construct a transistor as the p-type transistor P2 of the NAND 100B discussed above.

In the circuit cell 302-2, the gate structure 306-3 engages the active area 304-1 to construct a transistor as the n-type transistor N1 of the inverter 100A discussed above, and the gate structure 306-3 engages the active area 304-2 to construct a transistor as the p-type transistor P1 of the inverter 100A discussed above.

In the circuit cell 302-3, the gate structure 306-4 engages the active area 304-1 to construct a transistor as the n-type transistor N5 of the NOR 100C discussed above, the gate structure 306-4 engages the active area 304-2 to construct a transistor as the p-type transistor P5 of the NOR 100C discussed above, the gate structure 306-5 engages the active area 304-1 to construct a transistor as the n-type transistor N4 of the NOR 100C discussed above, and the gate structure 306-5 engages the active area 304-2 to construct a transistor as the p-type transistor P4 of the NOR 100C discussed above.

In the circuit cell 302-4, the gate structure 306-6 engages the active area 304-2 to construct a transistor as the p-type transistor P3 of the NAND 100B discussed above, the gate structure 306-6 engages the active area 304-3 to construct a transistor as the n-type transistor N3 of the NAND 100B discussed above, the gate structure 306-7 engages the active area 304-2 to construct a transistor as the p-type transistor P2 of the NAND 100B discussed above, and the gate structure 306-7 engages the active area 304-3 to construct a transistor as the n-type transistor N2 of the NAND 100B discussed above.

In the circuit cell 302-5, the gate structure 306-8 engages the active area 304-2 to construct a transistor as the p-type transistor P5 of the NOR 100C discussed above, the gate structure 306-8 engages the active area 304-3 to construct a transistor as the n-type transistor N5 of the NOR 100C discussed above, the gate structure 306-9 engages the active area 304-2 to construct a transistor as the p-type transistor P4 of the NOR 100C discussed above, and the gate structure 306-9 engages the active area 304-3 to construct a transistor as the n-type transistor N4 of the NOR 100C discussed above.

In the circuit cell 302-6, the gate structure 306-10 engages the active area 304-2 to construct a transistor as the p-type transistor P1 of the inverter 100A discussed above, and the gate structure 306-10 engages the active area 304-3 to construct a transistor as the n-type transistor N1 of the inverter 100A discussed above.

The array 300 further includes dielectric gate structures 308 for separating the circuit cells 302-1 to 302-12 from each other. The dielectric gate structures 308 extend lengthwise in the Y-direction. The dielectric gate structures 308 and the circuit cells 302-1 to 302-6 (or the gate structures 306-1 to 306-12) are arranged in the X-direction. More specifically, in the row R1 of the array 300, four dielectric gate structures 308 and the circuit cells 302-1 to 302-3 (or the gate structures 306-1 to 306-5) are arranged in the X-direction, and four dielectric gate structures 308 separate or isolate the circuit cells 302-1 to 302-3 from each other. Similarly, in the row R2 of the array 300, three dielectric gate structures 308 and the circuit cells 302-4 to 302-6 (or the gate structures 306-6 to 306-12) are arranged in the X-direction, and three dielectric gate structures 308 separate or isolate the circuit cells 302-4 to 302-6 from each other.

Referring to FIGS. 4C to 4J, the array 300 includes a substrate 310, over which the various features are formed, such as the gate structures 306 and dielectric gate structures 308 above. The substrate 310 may contains a semiconductor material, such as bulk silicon (Si). In some other embodiments, the substrate 310 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Alternatively, the substrate 310 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

The n-type well NW and p-type wells PW are formed in or on the substrate 310, as shown in FIGS. 4C to 4J. In the present embodiment, the p-type wells PW are p-type doped regions configured for n-type transistors, and the n-type well NW are n-type doped regions configured for p-type transistors. The n-type well NW is doped with n-type dopants, such as phosphorus, arsenic, other n-type dopant, or a combination thereof. The p-type wells PW are doped with p-type dopants, such as boron, indium, other p-type dopant, or a combination thereof. In some implementations, the substrate 310 includes doped regions formed with a combination of p-type dopants and n-type dopants. The various n-type and p-type wells can be formed directly on or in the substrate 310, for example, providing a p-well structure, an n-well structure, a dual-well structure, a raised structure, or combinations thereof. An ion implantation process, a diffusion process, and/or other suitable doping process can be performed to form the various wells.

Similar to the isolation structure 216 discussed above, the array 300 further includes an isolation structure (or isolation feature) 312 over the substrate 310 and between the adjacent active areas 304. The isolation structure 312 also isolates the adjacent active areas 304. The isolation structure 312 may include silicon oxide, silicon nitride, silicon oxynitride, other suitable isolation material (for example, including silicon, oxygen, nitrogen, carbon, or other suitable isolation constituent), or combinations thereof. The isolation structure 312 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the circuit cells 302-1 to 302-6 includes nanostructures 314 similar to the nanostructures 204 discussed above. As shown in FIGS. 4C, 4D, and 4H, the nanostructures 314 are suspended over the n-type well NW and p-type wells PW and in the active areas 304. In some embodiments, three nanostructures 314 are vertically stacked (or vertically arranged) from each other in the Z-direction for one transistor. However, there may be another appropriate number of nanostructures in one transistor. For example, there may be from 2 to 10 nanostructures 314 in one transistor. The nanostructures 314 further extend lengthwise in the X-direction (FIGS. 4A and 4H) and widthwise in the Y-direction (FIGS. 4C and 4D). In some embodiments, each of the nanostructures 314 has a width W in the Y-direction and in a range from about 4 nm to about 70 nm, as shown in FIG. 4C. In some embodiments, each of the nanostructures 314 has a thickness T in the Z-direction and in a range from about 4 nm to about 10 nm, as shown in FIG. 4C. As shown in FIG. 4C, in each of the transistors in the circuit cells 302-1 to 302-6, three nanostructures 314 are spaced from each other in the Z-direction by a distance S in a range from about 6 nm to about 20 nm. In some embodiments, the nanostructures 314 has vertically a pitch P in the Z-direction and in a range from about 10 nm to about 30 nm. The nanostructures 314 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 314 include silicon for n-type transistors. In other embodiments, the nanostructures 314 include silicon germanium for p-type transistors. In some embodiments, the nanostructures 314 are all made of silicon, and the type of the transistors depend on work function metal layer wrapping around the nanostructures 314. In some embodiments, the nanostructures 314 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

The gate structures 306-1 to 306-12 each has a gate dielectric layer 316 and a gate electrode layer 318. The gate dielectric layers 316 wrap around each of the nanostructures 314 and the gate electrode layers 318 wrap around the gate dielectric layer 316. In some embodiments, the gate structures 306 each further includes an interfacial layer (such as having silicon dioxide, silicon oxynitride, or other suitable materials) between the gate dielectric layer 316 and the nanostructures 314. The gate dielectric layers 316 may include oxide with nitrogen doped dielectric material (initial layer) combined with metal content high-K dielectric material (K value (dielectric constant)>13). For example, gate dielectric layers 316 may include hafnium oxide ($HfO_2$), which has a dielectric constant in a range from about 18 to about 40. Alternatively, the gate dielectric layers 316 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, (Ba, Sr)$TiO_3$ (BST), $Al_2O_3$, $Si_3N_4$, oxynitrides (SiON), combinations thereof, or other suitable material. The gate dielectric layers 316 may be formed by chemical oxidation, thermal oxidation, ALD, CVD, and/or other suitable methods.

Each of the gate electrode layers 318 is formed to wrap around the gate dielectric layer 316 and the center portions of the nanostructures 314, as shown in FIGS. 4C, 4D, and 4H. In some embodiments, the gate electrode layers 318 each may include an n-type work function metal layer 318N for n-type transistor or a p-type work function metal layer 318P for p-type transistor. In an embodiment, the n-type work function metal layer 318N is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer 318N may be deposited utilizing ALD, CVD, or the like. However, any suitable materials and processes may be utilized to form the n-type work function metal layer 318N. In an embodiment, the p-type work function metal layer 318P may be a material such as such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer 318P may be deposited using a deposition process such as ALD, CVD, or the like, although any suitable deposition process may be used.

The gate electrode layer 318 may include a single layer or alternatively a multi-layer structure. In some embodiments, the gate electrode layer 318 may further include a capping layer, a barrier layer, and a fill material (not shown). The capping layer may be formed adjacent to the gate dielectric layers 316 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

As discussed above, the dielectric gate structures 308 extend lengthwise in the Y-direction (e.g., parallel to the gate structures 306) to separate the circuit cells 302-1 to 302-6 from each other, as show in FIGS. 4A, 4H, and 4I. Unlike the gate structures 306, however, the dielectric gate structures 308 are not functional gate structures (e.g., do not contain the gate dielectric layer 316 and the gate electrode layer 318) and do not wrap around the nanostructures 314. Instead, the dielectric gate structures 308 may be made of electrically insulating materials (e.g., dielectric materials) to provide electrical isolation between various circuit cells. In some embodiments, the dielectric gate structures 308 may be single dielectric layer or multiple layers and selected from a group consisting of $SiO_2$, SiOC, SiON, SiOCN, carbon content oxide, nitrogen content oxide, carbon and nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, or combinations thereof.

As discussed above, the dielectric gate structures 308 and the gate structures 306 are arranged in the X-direction. In same row (the row R1 or R2) of the array 300, a gate pitch of the gate structures 306 and a gate pitch of one gate structure 306 to one dielectric gate structure 308 are substantially the same. Furthermore, a gate length of the gate structures 306 in the X-direction and a gate length of the dielectric gate structures 308 in the X-direction are the same. In some embodiments, the gate length of the gate structures 306 is in a range from about 4 nm to about 25 nm.

Similar to the gate spacers 212 discussed above, the array 300 further includes gate spacers 322 on sidewalls of the gate structures 306 and the dielectric gate structures 308, and over the nanostructures 314, as shown in FIGS. 4H and 4I. Further, the gate spacers 322 extend lengthwise in the Y-direction (e.g., parallel to the gate structures 306) and are on opposite sides (or on opposite sidewalls) of the gate structures 306 in the X-direction, as shown in FIG. 4A. The gate spacers 322 are over the nanostructures 314 and on top sidewalls of the gate structures 306 and the dielectric gate structures 308, and thus are also referred to as gate top spacers or top spacers. The gate spacers 322 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 322 may include a single layer or a multi-layer structure.

As shown in FIG. 4H, the array 300 further includes inner spacers 324 on the sidewalls of the gate structures 306 and the dielectric gate structures 308, and below the topmost nanostructures 314 and the gate spacers 322. Furthermore, the inner spacers 324 are laterally between source/drain features 326N (or 326P) and the gate structures 306 and between the source/drain features 326N (or 326P) and the dielectric gate structures 308. The inner spacers 324 are also vertically between adjacent nanostructures 314 and between bottommost nanostructures 314 and the substrate 310. The inner spacers 324 may include a dielectric material having higher K value (dielectric constant) than the gate spacers 322 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the gate spacers 322 have a thickness in the X-direction and in a range from about 4 nm to about 12 nm, and the inner spacers 324 have a thickness in the X-direction and in a range from about 4 nm to about 12 nm. In some embodiments, the thickness of the gate spacers 322 in the X-direction and the thickness of the inner spacers 324 in the X-direction are the same. In other embodiments, the thickness of the gate spacers 322 in the X-direction is less than the thickness of the inner spacers 324 in the X-direction due to the gate spacers 322 are trimmed during processes for forming source/drain contacts.

Referring to FIGS. 4A and 4E to 4H, the array 300 further includes source/drain features 326N and source/drain features 326P over the substrate 310 and in the source/drain regions of the active areas 304. More specifically, the source/drain features 326N and the source/drain features 326P are respectively disposed between the two respective gate structures 306 or one respective gate structure 306 and one respective dielectric gate structure 308. The source/drain features 326N/326P each is attached and electrically connected to the nanostructures 314. Further, the source/drain features 326N are disposed on opposite sides of the respective gate structure 306 and connected by the nanostructures 314 to form n-type transistor of the circuit cells 302. Similarly, the source/drain features 326P are disposed on opposite sides of the respective gate structure 306 and connected by the nanostructures 314 to form p-type transistor of the circuit cells 302. As shown in FIG. 4H, the dielectric gate structure 308 has a depth that deeper than (bottom surfaces of) the source/drain features 326N and 326P in a range from about 10 nm to about 150 nm.

The source/drain features 326N and 326P may be formed by using epitaxial growth. In some embodiments, the source/drain features 326N may include epitaxially-grown material selected from a group consisting of SiP, SiC, SiPC, SiAs, Si, or a combination thereof. In some embodiments, the epitaxially-grown material of the source/drain features 326N may be doped with n-type dopants (such as phosphorus, arsenic, other n-type dopant, or combinations thereof) having a doping concentration in a range from about $2\times10^{19}/cm^3$ to $3\times10^{21}/cm^3$. In some embodiments, the source/drain features 326P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 326P may be doped with p-type dopants (such as boron, indium, other p-type dopant, or combinations thereof) having a doping concentration in a range from about $1\times10^{19}/cm^3$ to $6\times10^{20}/cm^3$.

As shown in FIGS. 4A to 4J, dielectric structures 320-1 to 320-3 are formed to separate the circuit cells 302 in rows R1 and R2. In some embodiments, the dielectric structures 320-1 to 320-3 also separate the gate structures 306 and/or the dielectric gate structures 308 from gate structures and/or dielectric gate structures of other circuit cells (not shown) in other rows of the array 300. The dielectric structures 320-1 to 320-3 extend lengthwise in the X-direction (e.g., parallel to the active areas 304). The dielectric structures 320-1 to 320-3 are formed in and overlap with the active areas 304 in a top view, as shown in FIG. 4A. In some embodiments, the dielectric structures 320-1 to 320-3 are overlap with cell boundaries of the circuit cells 302 (e.g., MC1 to MC6).

The dielectric structures 320-1 to 320-3 are used for separating the gate structures 320, the dielectric gate structures 308, the source/drain features 326N/326P, and the nanostructures 314 aligned in the Y-direction and in different rows of array 300. Further, each of the dielectric structures 320-1 to 320-3 may be in contact with (sidewalls of) the nanostructures 314, the source/drain features 326N/326P, and the gate structures 306 in the adjacent rows of the array 300. In the present disclosure, the source/drain features 326N/326P and the nanostructures 314 in the same active area 304 are merged together before the formation of the dielectric structures 320-1 to 320-3. More specifically, for examples, before the formation of the dielectric structures 320-1 to 320-3, the source/drain features 326N/326P of the transistors of the circuit cell 302-1 and in the active area 304-2 are merged with the source/drain features 326N/326P of the transistors of the circuit cell 302-4 and in the active area 304-2 in the Y-direction. Further, the nanostructures 314 of the transistors of the circuit cell 302-1 and in the active area 304-2 are merged with the nanostructures 314 of the transistors of the circuit cell 302-4 and in the active area 304-2 in the Y-direction. Then, the dielectric structures 320-1 to 320-3 are formed to cut the merged source/drain features and the merged nanostructures 314. Therefore, the source/drain features 326N/326P and the nanostructures 314 in the same active area 304-2 are separated for different circuit cells 302-1 and 302-4. The detail of the formation of the dielectric structures 320-1 to 320-3 for cutting merged features are discussed in below.

Figure 5:
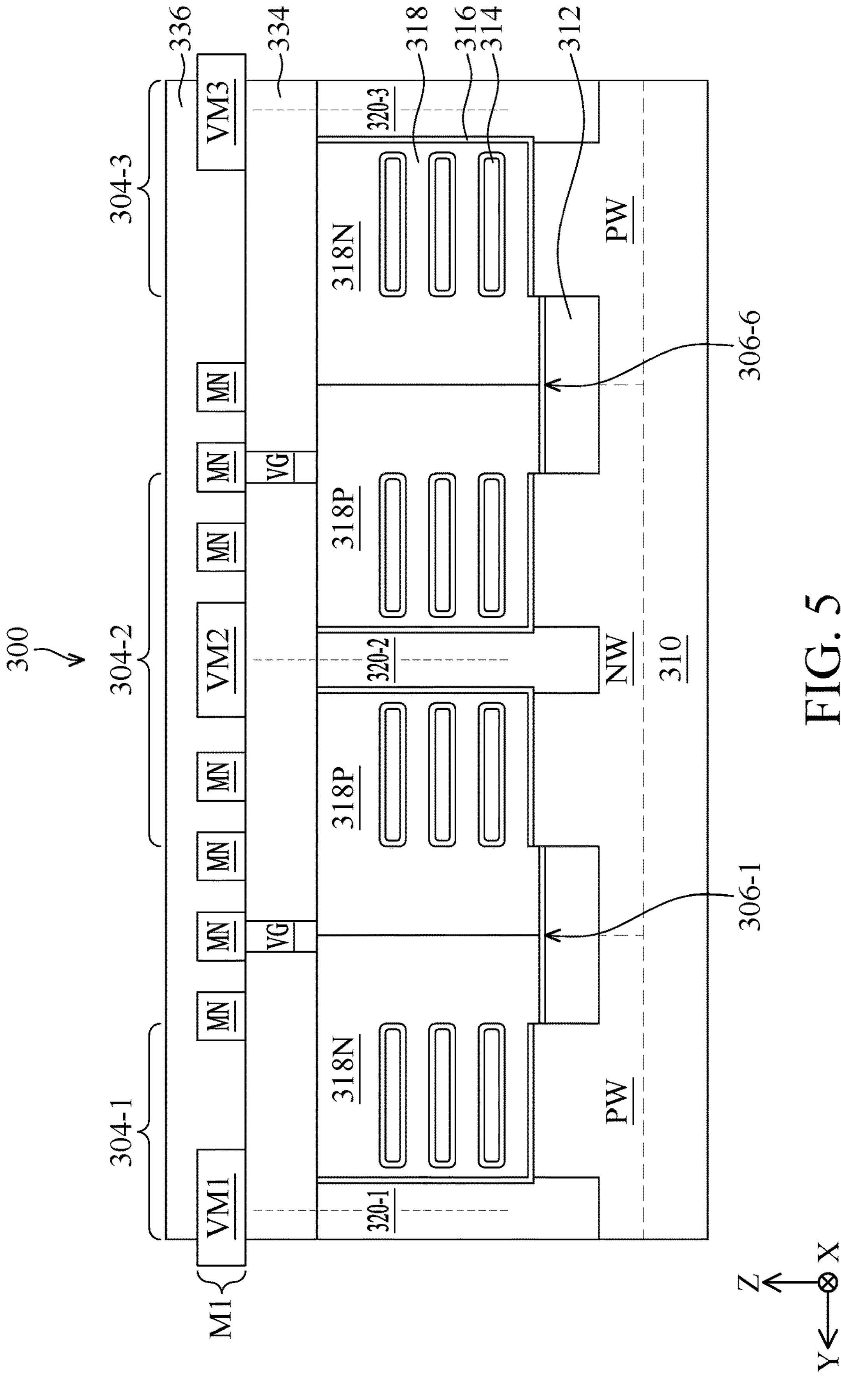
FIG. 5 illustrates a Y-Z cross-sectional view of the array of the circuit cells along a line C-C' in FIGS. 4A and 4B, in accordance with some alternative embodiments of the present disclosure.

As shown in FIGS. 4C and 4D, the nanostructures 314 are in contact with sidewalls of the dielectric structures 320. In some aspects, the nanostructures 314 are on opposite sides of the dielectric structures 320 in the Y-direction. In some embodiments, the nanostructures 314 are separated from the dielectric structures 320 in the Y-direction, as shown in FIG. 5. In this case, the gate structures 306 are formed between the nanostructures 314 and the dielectric structures 320 in the Y-direction. Further, the gate structures 306 are also in contact with the sidewalls of the dielectric structures 320, as shown in FIGS. 4C and 4D. In some embodiments, sidewalls of the gate dielectric layers 316 on the sidewalls of the dielectric structures 320 (e.g., 320-2) are offset from sidewalls of the nanostructures 314 on the same sidewalls of the dielectric structures 320 (e.g., 320-2) in the Y-direction, as shown in FIGS. 4C and 4D.

As shown in FIGS. 4E to 4G, the source/drain features 326N/326P are also in contact with sidewalls of the dielectric structures 320-1 to 320-3. The source/drain features 326N/326P are also on opposite sides of the dielectric structures 320 in the Y-direction. It should be noted that the source/drain features in contact with and on opposite sides of the respective dielectric structures 320 have the same type of dopant. For examples, as shown in FIGS. 4E to 4G, the source/drain features 326P in the active area 304-2 and on opposite sides of the dielectric structures 320-2 have the p-type dopants as discussed above.

As shown in FIGS. 4C to 4G, the dielectric structures 320-1 to 320-3 extend vertically (e.g., in the Z-direction) into the n-type well NW and p-type wells PW. In other words, the sidewalls and bottom surfaces of the dielectric structures 320-1 to 320-3 are in contact with the substrate 310. The depth DT of the dielectric structures 320-1 to 320-3 in the n-type well NW and p-type wells PW (or the substrate 310) is in a range from about 10 nm to about 150 nm, as shown in FIG. 4C. In other words, bottom surfaces of the dielectric structures 320-1 to 320-3 to topmost surfaces of the substrate 310 in the Z-direction is in a range from about 10 nm to about 150 nm. In some embodiments, a distance D from top surfaces (specifically, topmost surfaces) of the dielectric structures 320-1 to 320-3 to top surfaces of the source/drain features 326N/326P in the Z-direction is in a range from about 5 nm to about 50 nm, as shown in FIG. 4E. In some embodiments, a width DW1 of the dielectric structures 320-1 to 320-3 in the Y-direction is in a range from about 10 nm to about 60 nm, as shown in FIG. 4C.

Figure 6:
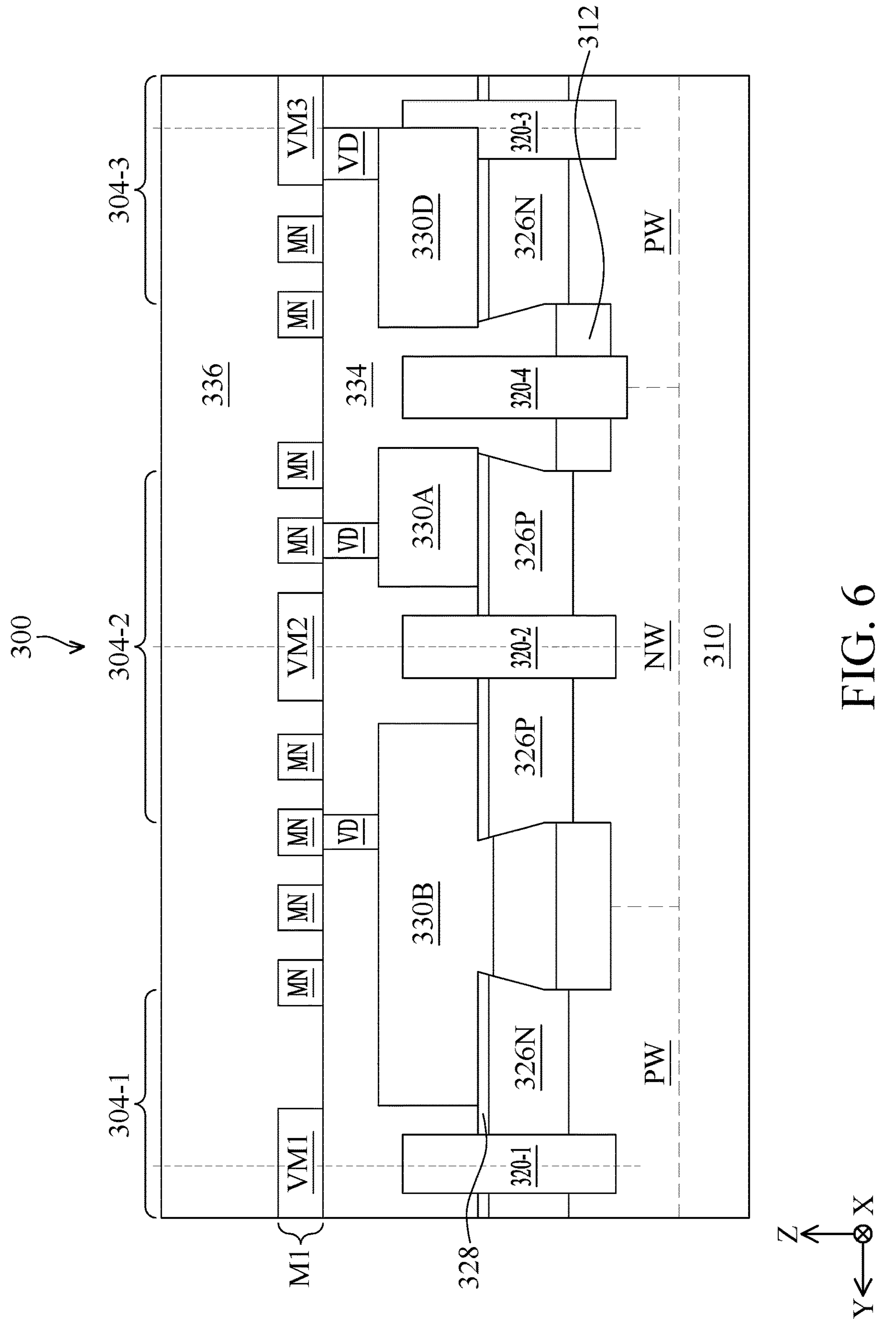
FIG. 6 illustrates a Y-Z cross-sectional view of the array of the circuit cells along a line F-F' in FIGS. 4A and 4B, in accordance with some alternative embodiments of the present disclosure.

The array 300 further includes a dielectric structure 320-4 is formed over the isolation structure 312 to separate the gate structures 306-11 and 306-12 in the same row R2 of the array 300. The dielectric structure 320-4 is between and in contact with (sidewalls of) the gate structures 306-11 and 306-12 in the Y-direction, as shown in FIGS. 4A and 4D. In some embodiments, the dielectric structure 320-4 is between the adjacent active areas 304-2 and 304-3. Further, the dielectric structure 320-4 is between the source/drain feature 326P on the sidewall of the 320-2 and the source/drain feature 326N on the sidewall of the 320-3 in the Y-direction, as shown in FIGS. 4A and 4F. In some embodiments, the dielectric structure 320-4 extends vertically (e.g., in the Z-direction) into the isolation structure 312 and is separated from the substrate 310. In other embodiments, the dielectric structure 320-4 extends passing through the isolation structure 312 and into the substrate 310, as shown in FIG. 6. In other words, the dielectric structure 320-4 is in contact with the substrate 310. Further, as shown in FIGS. 4C, 4D, and 4I, top surfaces of the dielectric structures 320-1 to 320-4 are substantially level with top surfaces of the gate structures 306 of the circuit cells 302. The material of the dielectric structures 320-1 to 320-4 may be single dielectric layer or multiple layers and selected from a group consisting of $Si_3N_4$, oxide, SiOC, SiON, SiOCN, carbon content oxide, nitrogen content oxide, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, high K material (K>=9), or combinations thereof.

Referring to FIGS. 4A, 4B, 4E, 4F, 4G, 4H, 4I and 4J, the array 300 further includes four types of source/drain contacts, source/drain contacts 330A to 330D (may be collectively referred to as source/drain contacts 330), over and electrically connected to the respective source/drain feature(s) 326N/326P. The source/drain contacts 330 extend in the Y-direction. The source/drain contacts 330 each is between the adjacent two of the gate structures 306 or is between adjacent one of the gate structures 306 and one of the dielectric gate structures 308. In some embodiments, the source/drain contacts 330B which electrically connected to power conductor (discussed in below) extend in the Y-direction to overlap the cell boundaries (e.g., the cell boundaries MC1 to MC6 discussed above) of the circuit cells in a top view, as shown in FIGS. 4A and 4B.

The source/drain contacts 330A are formed over and electrically connected to one of the source/drain features 326N/326P, as shown in FIGS. 4F and 4G. The source/drain contacts 330A are separated from the dielectric structures 320 in the Y-direction.

The source/drain contacts 330B are formed over and electrically connected to one of the source/drain features 326N in contact with the sidewall of one of the dielectric structures 320 (e.g., 320-1) and one of the source/drain features 326P in contact with the sidewall of another one of dielectric structures 320 (e.g., 320-2), as shown in FIG. 4F.

The source/drain contacts 330C are formed over and electrically connected to two of the source/drain features 326N (or 326P) in contact with the same dielectric structure 320. For examples, as shown in FIG. 4E, the source/drain contact 330C are over and electrically connected to two source/drain features 326P in contact with the dielectric structure 320-2. Such source/drain contacts 330C are further formed over, in contact with, and across one dielectric structure 320, such as dielectric structure 320-2. In some embodiments, top surfaces of the dielectric structure 320 in contact with the source/drain contacts 330 are lower than topmost surfaces of the dielectric structure 320, as shown in 4E, 4G, and 4J. As shown in FIGS. 4A, 4B, and 4E, each of the source/drain contacts 330C are shared by the circuit cells 302 in adjacent two rows R1 and R2 of the array 300.

Therefore, the source/drain contacts 330C may also be referred to as shared source/drain contacts.

The source/drain contacts 330D are formed over and electrically connected to one of the source/drain features 326N/326P. The source/drain contacts 330D are further partially cover the dielectric structures 320. For examples, as shown in FIG. 4G, the source/drain contact 330D is partially covers the dielectric structure 320-2. The dielectric structure 320-2 is in contact with sidewalls of the source/drain contact 330D. In some embodiments, a width DW2 of the dielectric structure 320-2 between the source/drain features 326P in the Y-direction and uncovered by the source/drain contact 330D is in a range from about 5 nm to about 30 nm. The source/drain contacts 330D over the dielectric structures 320-1 and 320-3 may be replaced with source/drain contacts 330C across the dielectric structures 320 to be connected to the source/drain features 326N in different rows of the array 300, in some embodiments.

The source/drain contacts 330 may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 330 may each include single conductive material layer or multiple conductive layers.

As shown in FIGS. 4E to 4H, the array 300 further includes silicide features 328 between the source/drain features 326N/326P and the source/drain contacts 330. The silicide features 328 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 4C to 4J, the array 300 further includes inter-layer dielectric (ILD) layer 332 over the substrate 310, the isolation structure 312, the gate structures 306, and the dielectric gate structure 308, between the source/drain features 326N/326P, and between the source/drain contacts 330, and includes an inter-metal dielectric (IMD) layer 334 over the ILD layer 332, the gate structures 306, the dielectric gate structure 308, and the source/drain contacts 330. It should be noted that the gate structures 306 are in direct contact with the ILD layer 332. For examples, top surfaces of the gate structures 306 are in direct contact with the ILD layer 332, as shown in FIG. 4H. This means that no additional hard mask layers or dielectric layers are formed over the gate structures 306 to separate from the ILD layer 332. Therefore, the processing cost for the array 300 is reduced.

The ILD layer 332 and the IMD layer 334 include a dielectric material including, for example, silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the ILD layer 332 and the IMD layer 334 are a dielectric layer that includes a low-k dielectric material (generally referred to as a low-k dielectric layer). The ILD layer 332 and the IMD layer 334 may include a multilayer structure having multiple dielectric materials.

Referring to FIGS. 4A to 4J, the array 300 further includes vias VG, vias VD, and metal layer M1. The vias VG and vias VD are disposed in the ILD layer 332 and the metal layer M1 are disposed in the IMD layer 334.

The metal layer M1 is over and electrically connected to respective gate structures 306 and respective source/drain contacts 330A and 330B. The vias VG are over the gate structures 306 and electrically connect the gate structures 306 to the metal layer M1. The vias VD are over the source/drain contacts 330 and electrically connect the source/drain contacts 330 to metal layer M1. The materials of the vias VG, the vias VD, and the metal layer M1 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

As shown in FIG. 4B to 4J, the metal layer M1 further include metal conductors MN, VM1, VM2, and VM3 extend in the X-direction. The metal conductors MN are disposed within the cell boundaries (e.g., the cell boundaries MC1 to MC6 of the circuit cells 302-1 to 302-6) in the top view, as shown in FIG. 4B. The metal conductors VM1, VM2, and VM3 are disposed overlap (or across) the boundaries (e.g., the cell boundaries MC1 to MC6 of the circuit cells 302-1 to 302-6) in the top view, as shown in FIG. 4B. The metal conductors VM1, VM2, and VM3 are also disposed overlap the active areas 320 in the top view. In some embodiments, a width of the metal conductors VM1, VM2, and VM3 in the Y-direction is greater than a width of the metal conductors MN in the Y-direction.

The metal layer M1 are respectively connected to respective gate structures 306 and respective source/drain contacts 330 through respective vias VG and VD. In some embodiments, the vias VG, VD and the metal layer M1 are used to construct connections of the transistors in the circuit cells 302-1 to 302-6. In some embodiments, the vias VD and the metal layer M1 are connected to power sources or voltage sources (not shown) to provide voltage (VDD or VSS) to the transistors in the circuit cells 302-1 to 302-6. In the present embodiment, the metal conductors VM1 and VM3 are connected to a VSS power source (not shown) and the metal conductor VM2 is connected to a VDD power source (not shown). Therefore, the metal conductor VM2 may be also referred to as the (VDD) power metal conductor, the (VDD) power line, or (VDD) power conductor, and the metal conductor VM1 and VM3 may be also referred to as the (VSS) power metal conductor, the (VSS) power line, or (VSS) power conductor.

As shown in FIG. 4B, the vias VD which electrically connected to the metal conductor VM2 have a larger via size than other vias VD and vias VG. Furthermore, the metal conductor VM2 has a wider width (compared to the width of the metal conductors MN) in the Y-direction. Therefore, due to small resistances of the larger size vias VD, and the larger size metal conductor VM2, the transistors in the circuit cells 302-1 to 302-6 may be provided with voltage (or power) with low voltage drop, thereby improving the performance of the array 300.

Figure 7A:
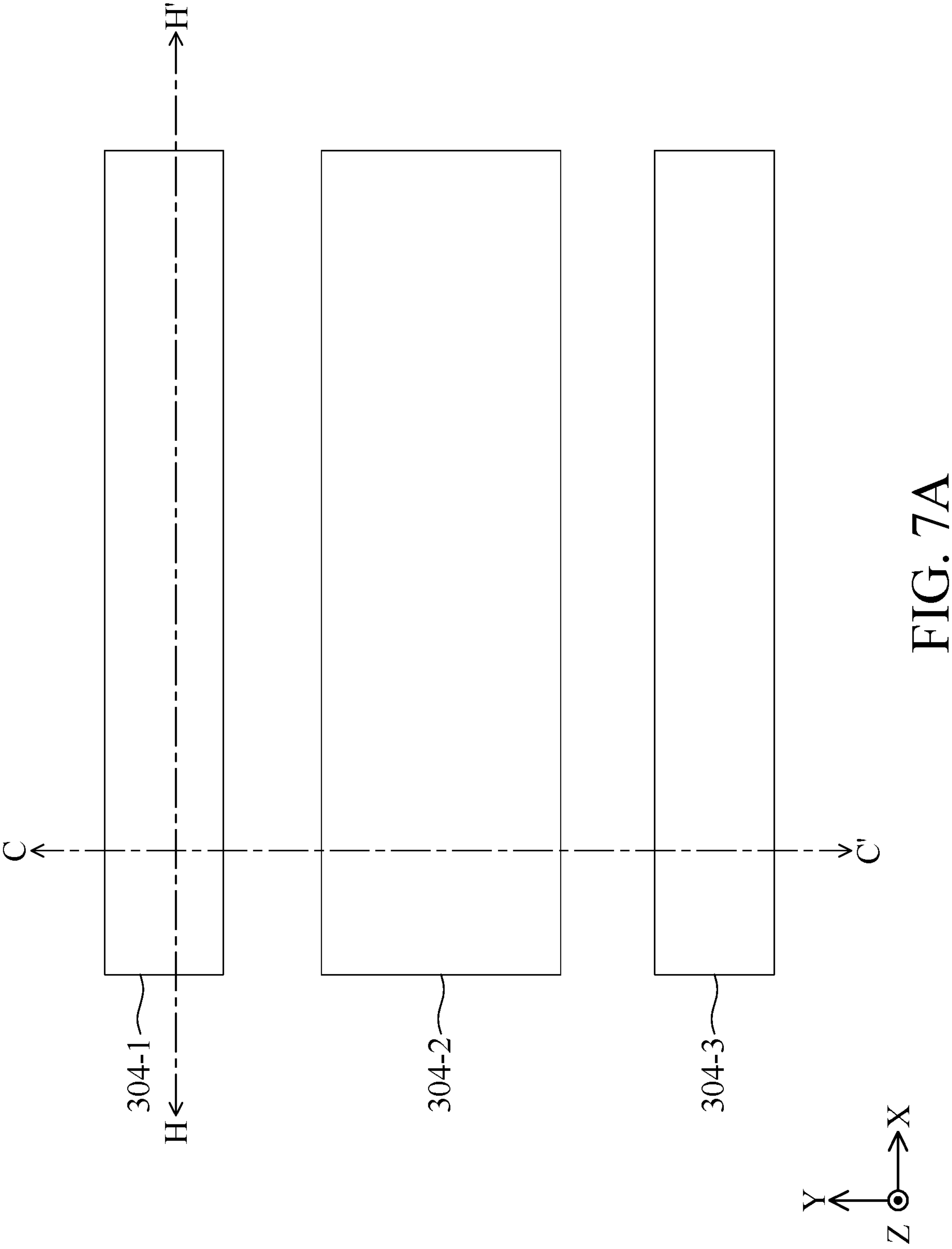
FIG. 7A is a fragmentary diagrammatic top view (or layout) of the array at a fabrication stage, in accordance with some embodiments of the present disclosure.
Figure 7B:
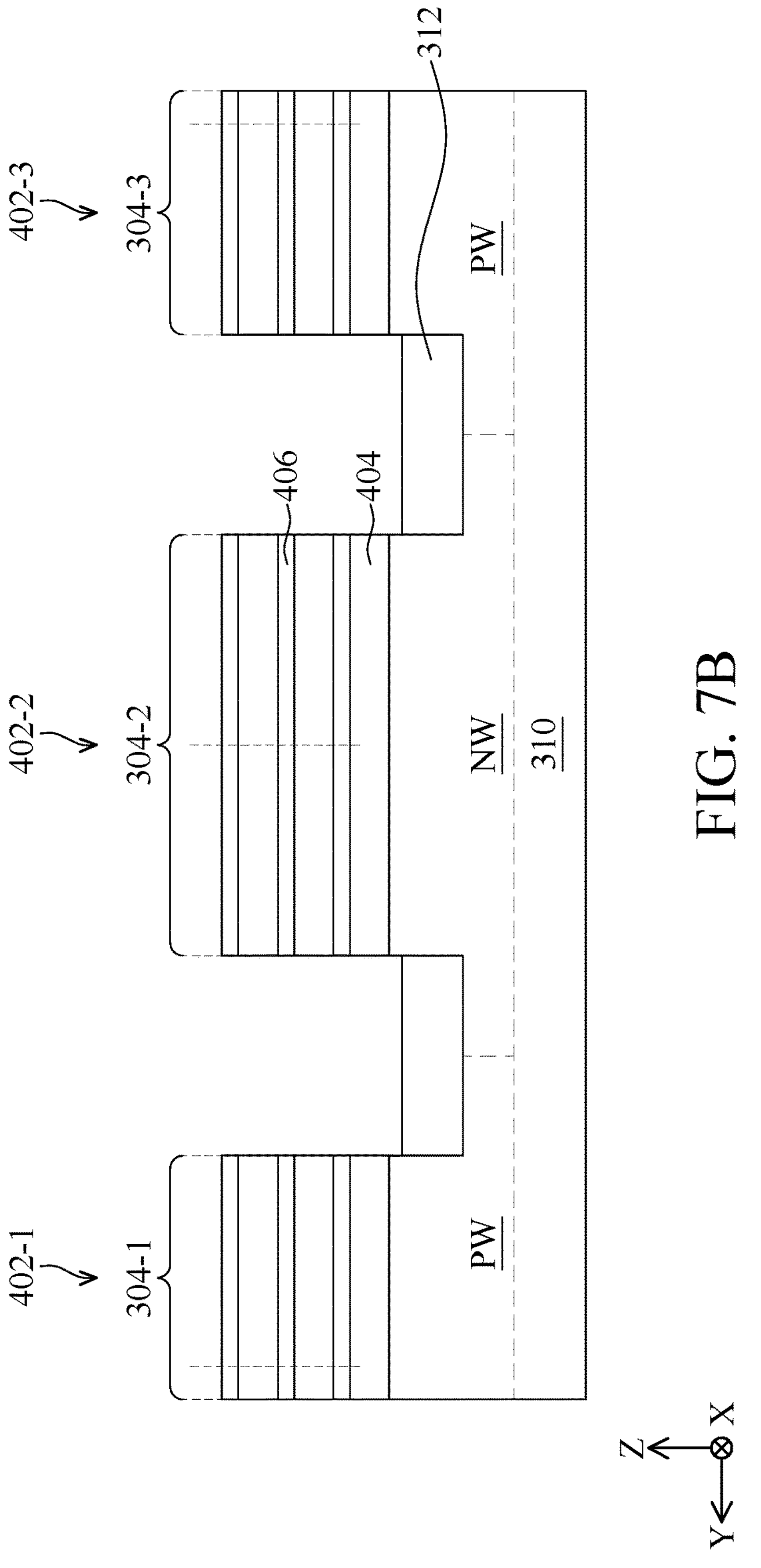
FIG. 7B is a Y-Z cross-sectional view of the array at the fabrication stage along a line C-C' of FIG. 7A, in accordance with some embodiments of the present disclosure.
Figure 7C:
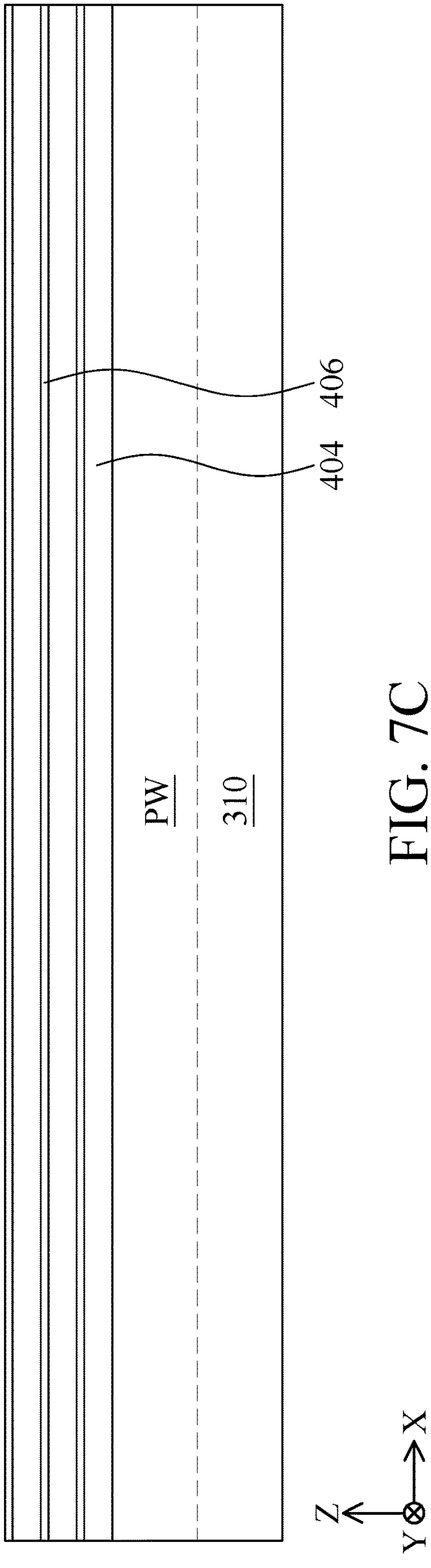
FIG. 7C is an X-Z cross-sectional view of the array at the fabrication stage along a line H-H' of FIG. 7A, in accordance with some embodiments of the present disclosure.

The following shows the formation of the array 300. FIG. 7A is a fragmentary diagrammatic top view (or layout) of the array 300 at a fabrication stage, in accordance with some embodiments of the present disclosure. FIG. 7B is a Y-Z cross-sectional view of the array 300 at the fabrication stage along a line C-C' of FIG. 7A, in accordance with some embodiments of the present disclosure. FIG. 7C is an X-Z cross-sectional view of the array 300 at the fabrication stage along a line H-H' of FIG. 7A, in accordance with some embodiments of the present disclosure.

Referring to FIGS. 7A to 7C, the active areas 304-1 to 304-3 are defined on the substrate 310. As shown in FIGS. 7B and 7C, the substrate 310 includes the n-type well NW doped with n-type dopants (i.e., phosphorus (P) or arsenic (As)) and the p-type wells PW doped with p-type dopants (i.e., boron (B)), as discussed above. The active areas 304-1 to 304-3 extend lengthwise in the X-direction and arranged in the Y-direction. Each of the active areas 304-1 to 304-3 has a fin (402-1 to 402-3) formed therein. The fins 402-1 to 402-3 (may be collectively referred to as fins 402) each has a base fin formed from a portion of the substrate 310 and a stack portion having semiconductor layers 404 and 406. The semiconductor layers 404 and 406 are alternatingly stacked in the Z-direction, as shown in FIGS. 7B and 7C. The semiconductor layers 404 and the semiconductor layers 406 may have different semiconductor compositions. In some embodiments, semiconductor layers 404 are formed of silicon germanium (SiGe) and the semiconductor layers 406 are formed of silicon (Si). In these embodiments, the additional germanium content in the semiconductor layers 404 allow selective removal or recess of the semiconductor layers 404 without substantial damages to the semiconductor layers 406, so that the semiconductor layers 404 are also referred to as sacrificial layers. The semiconductor layers 406 will be formed into the nanostructures 314 discussed above in sequent processes, so that the semiconductor layers 406 may be also referred to as nanostructures. In some embodiments, the semiconductor layers 404 and 406 are epitaxially grown over (on) the substrate 310 using the deposition technique discussed above.

After the definition of the active areas 304 and the formation of the fins 402, the isolation structure 312 discussed above is formed over the substrate 310. The isolation structure 312 is formed between the active areas 304. More specifically, the isolation structure 312 is formed between and around the base fins of the fins 402, as shown in FIG. 7B. In some embodiments, a dielectric material for the isolation structure 312 is first deposited over the substrate 310. Specifically, the dielectric material is deposited and formed over the fins 402 and the substrate 310 to cover the fins 402 and the substrate 310. In some aspects, the dielectric material is formed to wrap around the fins 402. The deposited dielectric material is then thinned and planarized, for example by a chemical mechanical polishing (CMP) process. The planarized dielectric material is further recessed by a dry etching process, a wet etching process, and/or a combination thereof to form the isolation structure 312. As shown in FIG. 1C, the stack portions of the fins 402 rise above the isolation structures 312 while the base fins are surrounded by the isolation structures 312. In other words, top surfaces (or topmost surfaces) of the substrate 310 are higher than top surfaces of the isolation structure 312. In some embodiments, before the formation of the isolation structure 202, a liner layer may be conformally deposited over the substrate 310 using ALD or CVD.

Figure 8A:
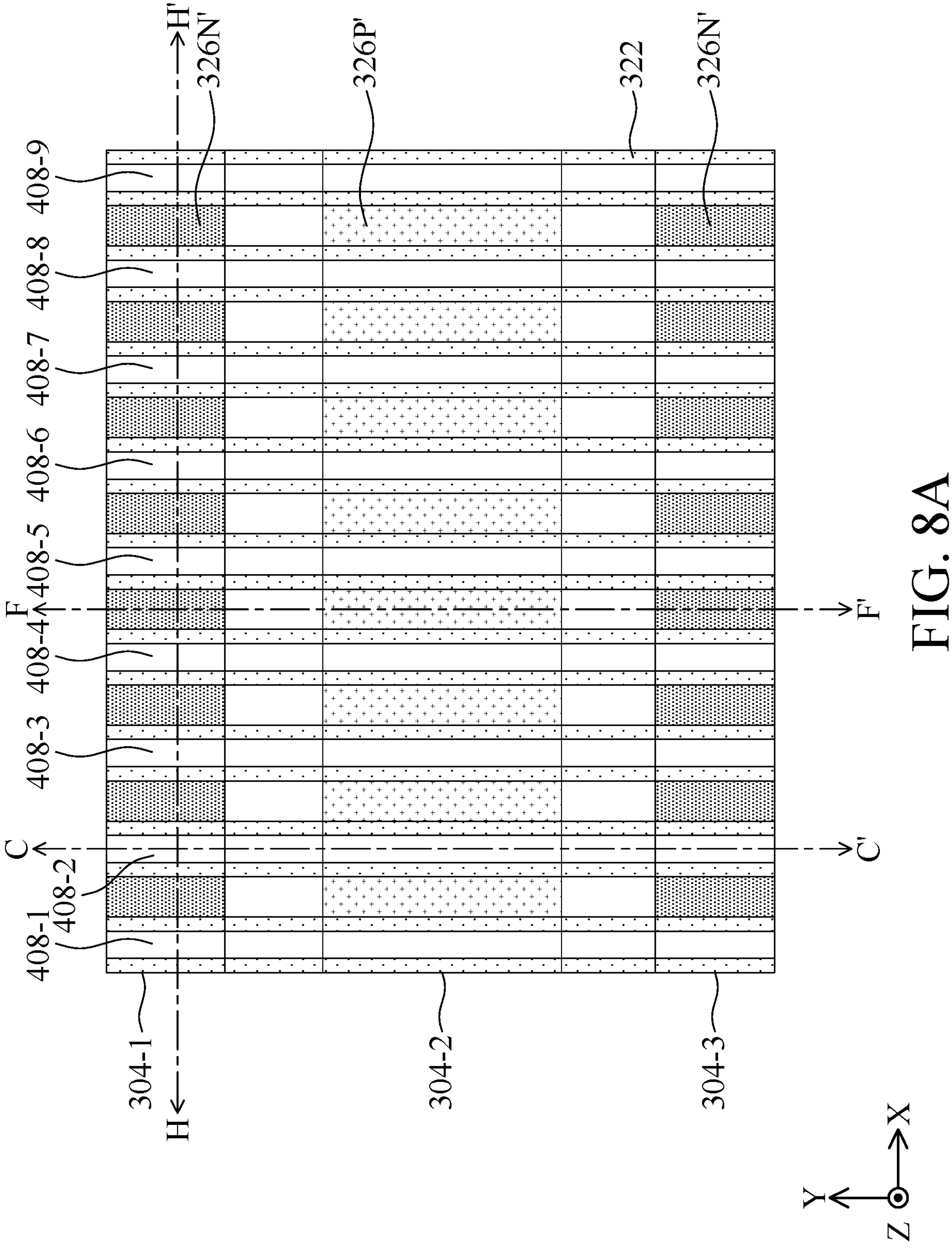
FIG. 8A is a fragmentary diagrammatic top view (or layout) of the array at a fabrication stage, in accordance with some embodiments of the present disclosure.
Figure 8B:
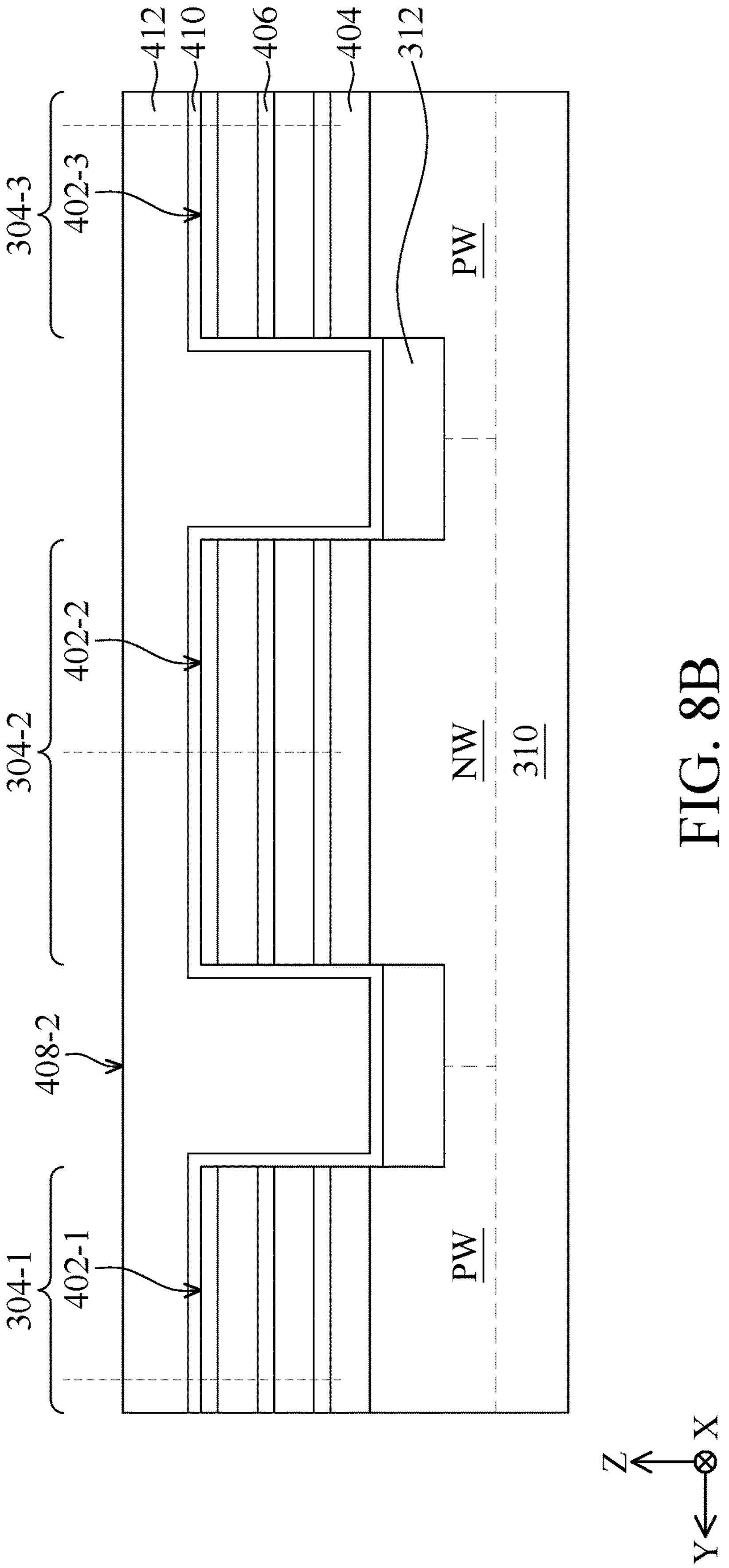
FIG. 8B is a Y-Z cross-sectional view of the array at the fabrication stage along a line C-C' of FIG. 8A, in accordance with some embodiments of the present disclosure.
Figure 8C:
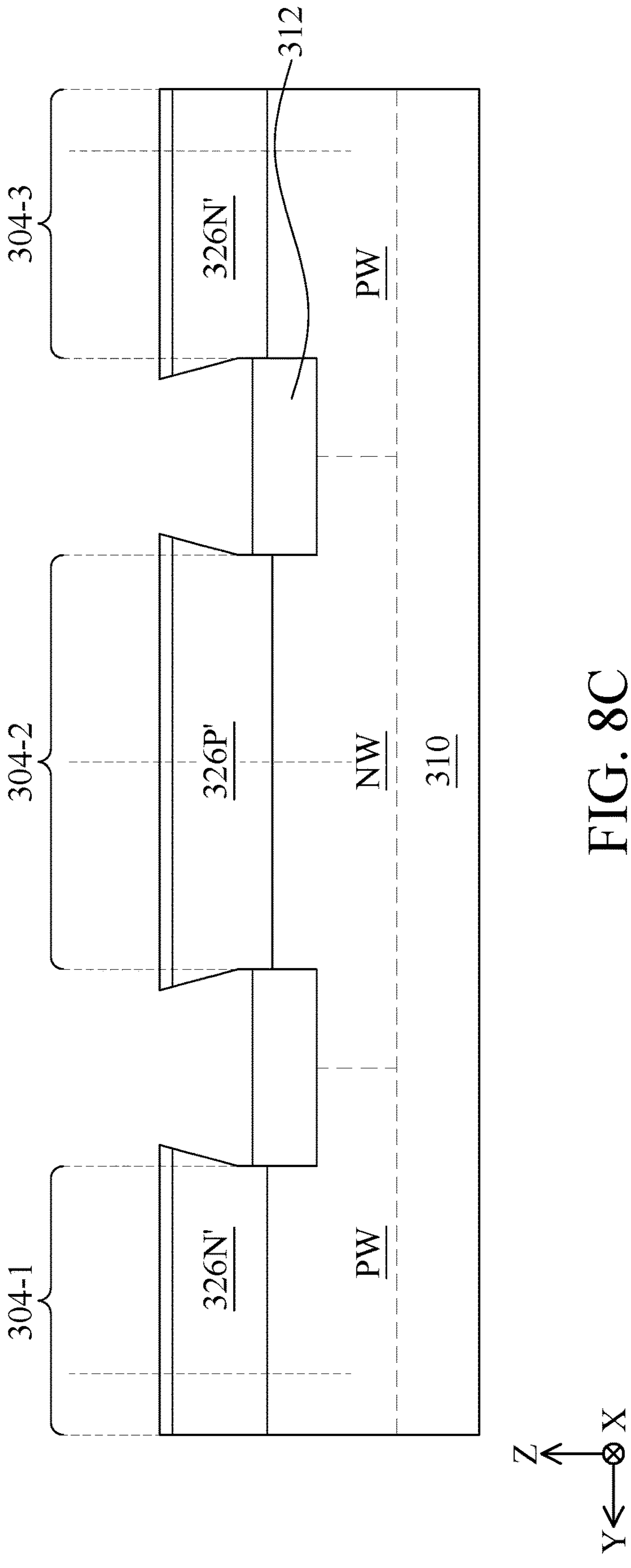
FIG. 8C is a Y-Z cross-sectional view of the array at the fabrication stage along a line F-F' of FIG. 8A, in accordance with some embodiments of the present disclosure.
Figure 8D:
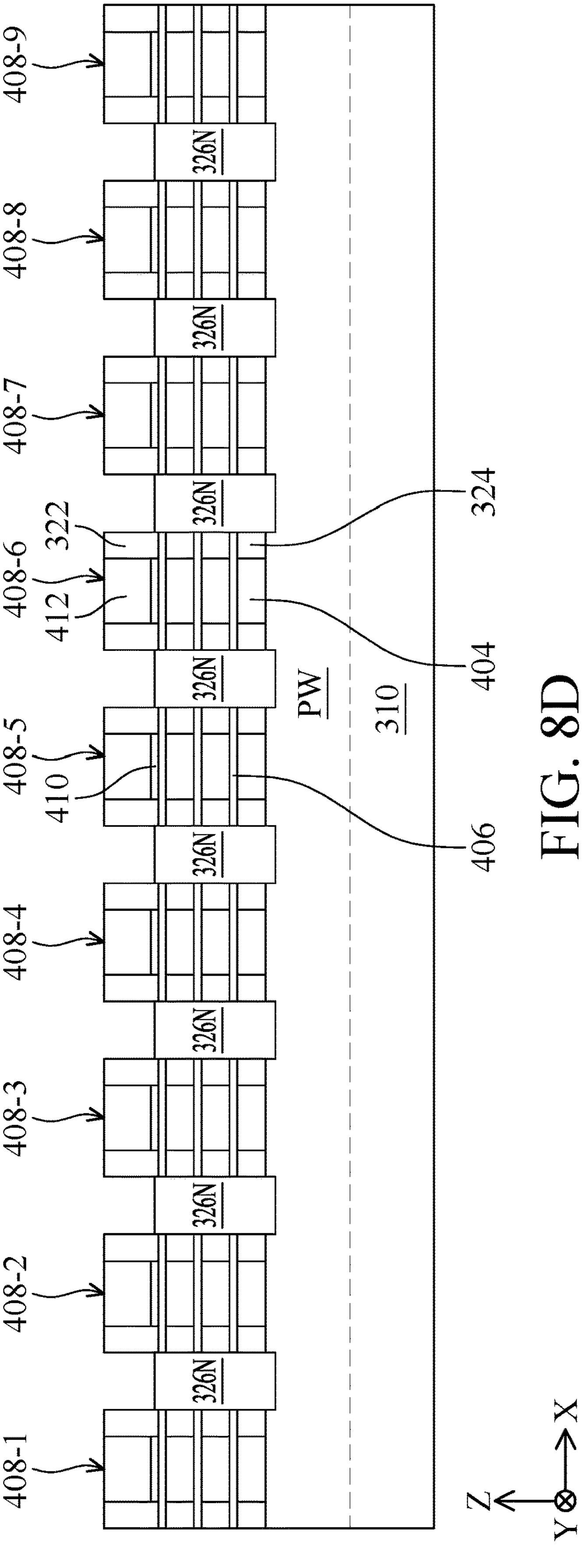
FIG. 8D is an X-Z cross-sectional view of the array at the fabrication stage along a line H-H' of FIG. 8A, in accordance with some embodiments of the present disclosure

FIG. 8A is a fragmentary diagrammatic top view (or layout) of the array 300 at a fabrication stage, in accordance with some embodiments of the present disclosure. FIG. 8B is a Y-Z cross-sectional view of the array 300 at the fabrication stage along a line C-C' of FIG. 8A, in accordance with some embodiments of the present disclosure. FIG. 8C is a Y-Z cross-sectional view of the array 300 at the fabrication stage along a line F-F' of FIG. 8A, in accordance with some embodiments of the present disclosure. FIG. 8D is an X-Z cross-sectional view of the array 300 at the fabrication stage along a line H-H' of FIG. 8A, in accordance with some embodiments of the present disclosure.

Referring to FIGS. 8A to 8D, dummy gate structures 408-1 to 408-9 (may be collectively referred to as dummy gate structures 408) may be formed over the fins 402 and over the isolation structure 312. The dummy gate structures 302 may be configured to extend lengthwise in the Y-direction and across the active areas 304 in the Y-direction, as shown in FIG. 8A. The dummy gate structures 408 further wrap around top surfaces and side surfaces of the fins 402, as shown in FIG. 8B. Each of the dummy gate structures 408 has a dummy interfacial layer 410 and a dummy gate electrode 412. In some embodiments, to form the dummy gate structures 408, a dummy interfacial material for dummy interfacial layers 410 is first formed over fins 402 and over the isolation structure 312. More specifically, the dummy interfacial material is conformally formed on the sidewalls of the fins 402 and over the top surfaces of the fins 402 and the isolation structure 312. In some embodiments, the dummy interfacial material may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material for dummy gate electrodes 412 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., physical vapor deposition (PVD), CVD, PECVD, and ALD).

After the formation of the dummy interfacial material and the dummy gate material, one or more lithography and etching processes may be performed to pattern the dummy gate material for the dummy gate electrodes 412 and the dummy interfacial material for the dummy interfacial layers 410, thereby forming the dummy gate structures 408-1 to 408-9 each having the dummy interfacial layer 410 and the dummy gate electrode 412. The dummy interfacial layers 410 may also be referred to as dummy gate dielectrics.

Still referring to FIGS. 8A to 8D, after the formation of the dummy gate structures 408, the gate spacers 322 discussed above are formed on sidewalls of the dummy gate structures 408 and over the semiconductor layers 404 and 406 of the fins 402. More specifically, the gate spacers 322 are formed on opposite sides of the dummy gate structures 408, as shown in FIG. 8D. In some embodiments, the gate spacers 322 may be formed by conformally depositing a spacer layer (containing the dielectric material) over the isolation structure 312, the fins 402, and dummy gate structures 408, followed by an anisotropic etching process to remove top portions of the spacer layer from the top surfaces of the isolation structure 312, the fins 402, and dummy gate structures 408. After the etching process, portions of the spacer layer on side all surfaces of the fins 402 and the dummy gate structures 408 substantially remain and become the gate spacers 322. In some embodiments, the anisotropic etching process is a dry (e.g., plasma) etching process. Additionally or alternatively, the formation of the gate spacers 322 may also involve chemical oxidation, thermal oxidation, ALD, CVD, and/or other suitable methods.

Still referring to FIGS. 8A to 8D, after the formation of the gate spacers 322, the inner spacers 324 discussed above are formed. In order to form the inner spacers 324, portions of the fins 402 that do not vertically overlap or be covered (e.g., in the Z-direction) by the dummy gate structures 408 and the gate spacers 322 are recessed to form openings exposing sidewalls of the semiconductor layers 404 of the fins 402 that vertically overlap or be covered by the dummy gate structures 408 and the gate spacers 322. Then, side portions of the semiconductor layers 404 below the gate spacers 322 are recessed and then filled with the dielectric material (for the inner spacers 324 discussed above) to form the inner spacers 324. A selective etching process is performed that selectively etches the side portions of the semiconductor layers 404. The selective etching process is a dry etching process, a wet etching process, other suitable etching process, or combinations thereof.

Still referring to FIGS. 8A to 8D, after the formation of the inner spacers 324, merged source/drain features 326N' and 326P' are formed. The merged source/drain features 326N' and 326P' are formed over the substrate 310 and in the source/drain regions of the active areas 304. More specifically, the merged source/drain features 326N' and 326P' are respectively disposed between the two respective dummy gate structures 408. The merged source/drain features 326N/326P each is attached to the semiconductor layers 406. Further, the merged source/drain features 326N'/326P' are disposed on opposite sides of the respective dummy gate structures 408.

The merged source/drain features 326N'/326P' will be cut into the source/drain features 326N/326P discussed above. In other words, the source/drain features 326N and 326P discussed above are formed from the merged source/drain features 326N'/326P'. The merged source/drain features 326N'/326P' may be formed by using epitaxial growth as discussed above. Further, the merged source/drain features 326N'/326P' include epitaxially-grown material and dopants as that of source/drain features 326N'/326P' discussed above.

Figure 9A:
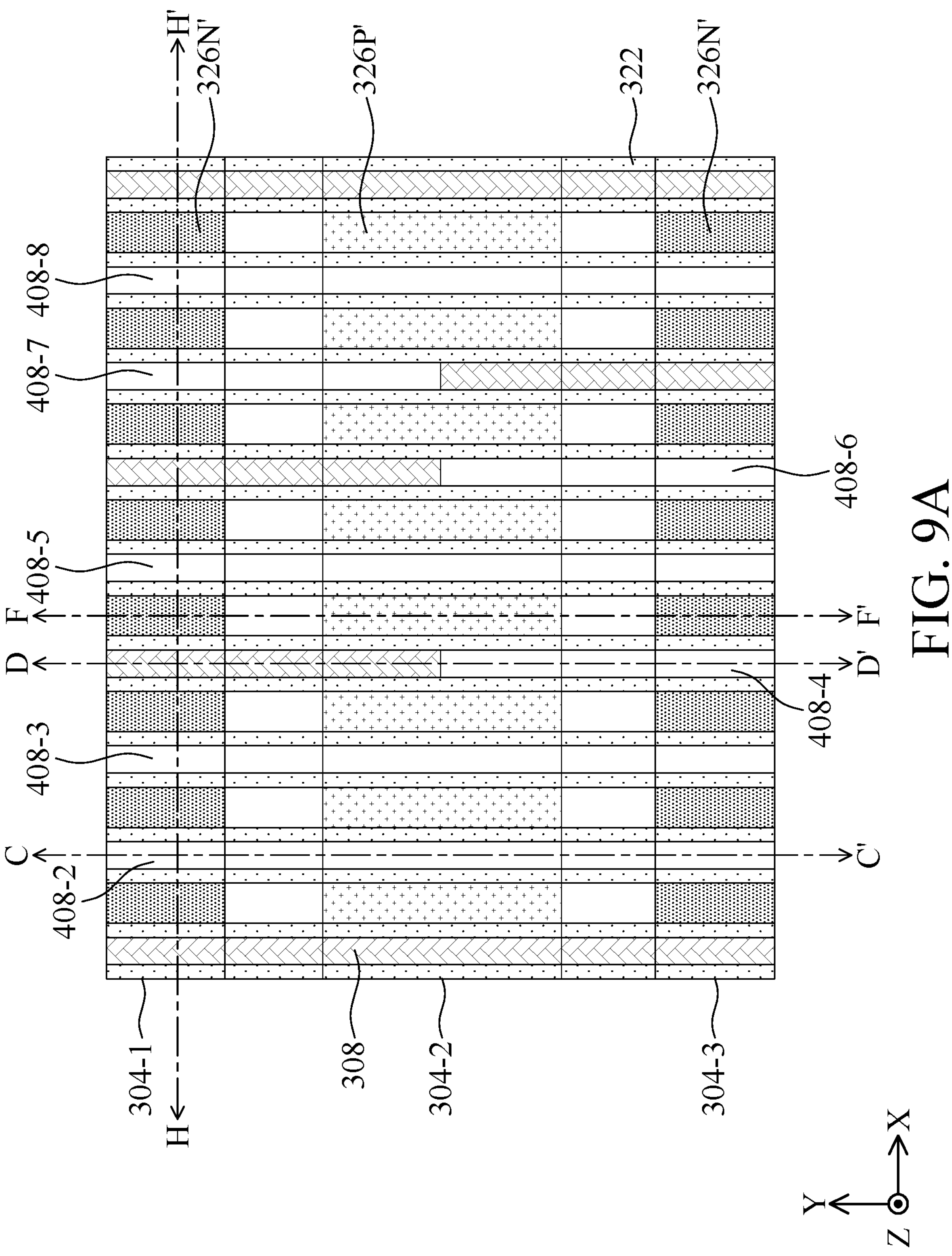
FIG. 9A is a fragmentary diagrammatic top view (or layout) of the array at a fabrication stage, in accordance with some embodiments of the present disclosure.
Figure 9B:
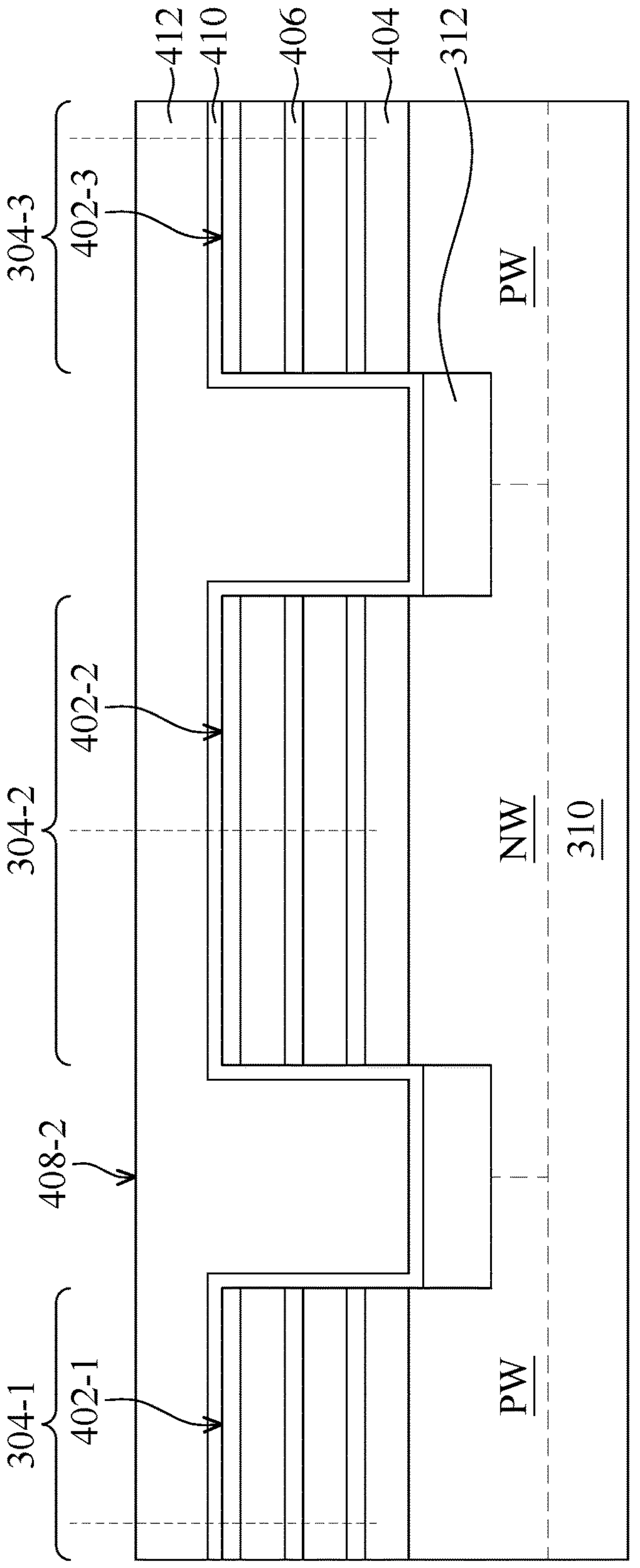
FIG. 9B is a Y-Z cross-sectional view of the array at the fabrication stage along a line C-C' of FIG. 9A, in accordance with some embodiments of the present disclosure.
Figure 9C:
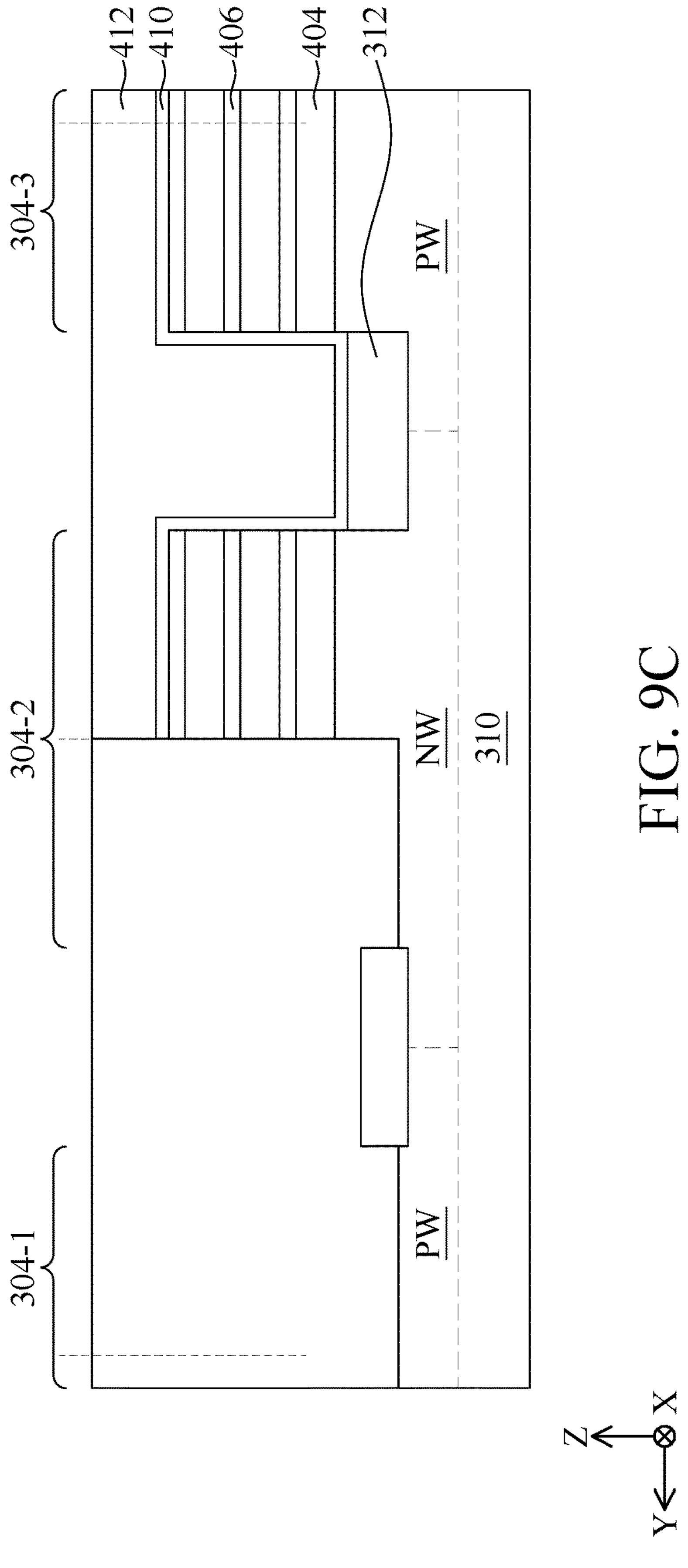
FIG. 9C is a Y-Z cross-sectional view of the array at the fabrication stage along a line D-D' of FIG. 9A, in accordance with some embodiments of the present disclosure.
Figure 9D:
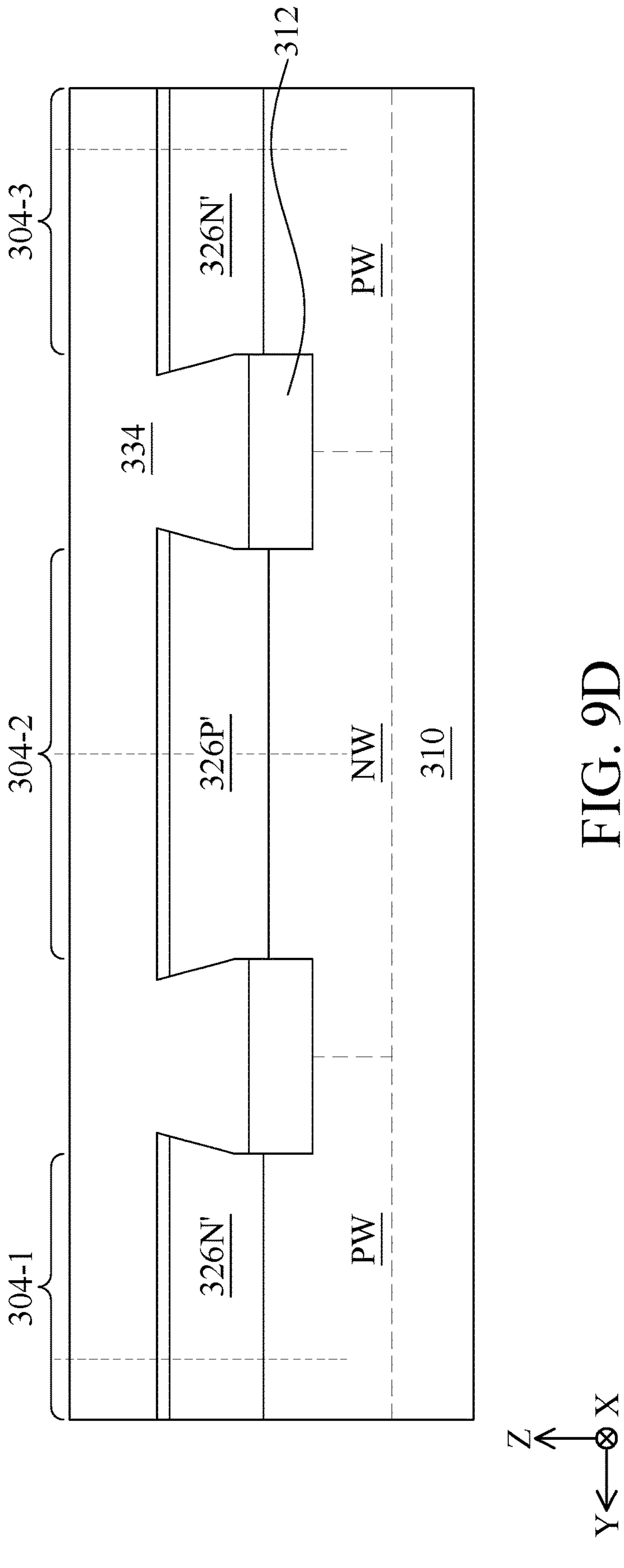
FIG. 9D is a Y-Z cross-sectional view of the array at the fabrication stage along a line F-F' of FIG. 9A, in accordance with some embodiments of the present disclosure.
Figure 9E:
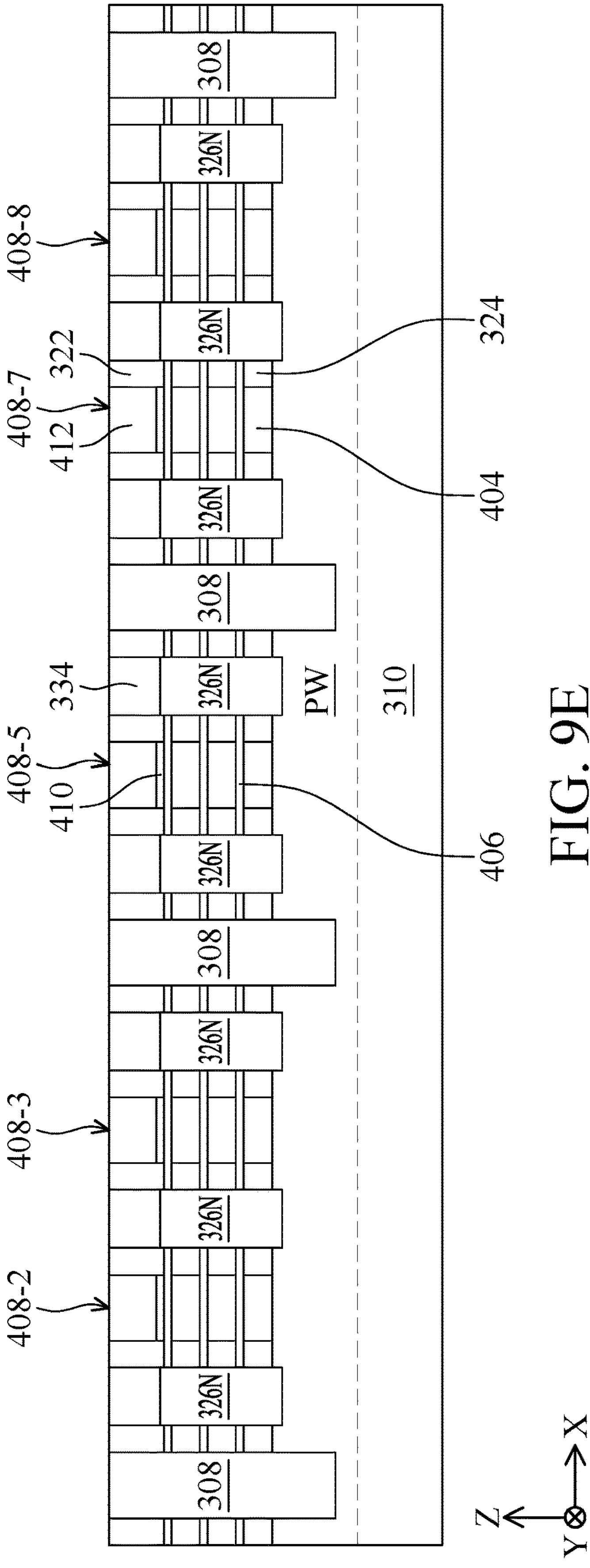
FIG. 9E is an X-Z cross-sectional view of the array at the fabrication stage along a line H-H' of FIG. 9A, in accordance with some embodiments of the present disclosure.

FIG. 9A is a fragmentary diagrammatic top view (or layout) of the array 300 at a fabrication stage, in accordance with some embodiments of the present disclosure. FIG. 9B is a Y-Z cross-sectional view of the array 300 at the fabrication stage along a line C-C' of FIG. 9A, in accordance with some embodiments of the present disclosure. FIG. 9C is a Y-Z cross-sectional view of the array 300 at the fabrication stage along a line D-D' of FIG. 9A, in accordance with some embodiments of the present disclosure. FIG. 9D is a Y-Z cross-sectional view of the array 300 at the fabrication stage along a line F-F' of FIG. 9A, in accordance with some embodiments of the present disclosure. FIG. 9E is an X-Z cross-sectional view of the array 300 at the fabrication stage along a line H-H' of FIG. 9A, in accordance with some embodiments of the present disclosure.

Referring to FIGS. 9A to 9E, the dielectric gate structures 308 are formed. More specifically, the dummy gate structures 408-1, 408-9, and portions of the dummy gate structures 408-4, 408-6, and 408-7 are replaced with dielectric gate structures 308, as shown in FIG. 9A. In order to form the dielectric gate structures 308, one or more lithography and etching processes may be performed to remove portions of the dummy gate structures 408 and the semiconductor layers 404 and 406 in regions to be formed the dielectric gate structures 308, and then the dielectric material for the dielectric gate structures 308 discussed above are formed in the regions to form the dielectric gate structures 308. As shown in FIG. 9C, portions of the substrate 310 and the isolation structure 312 in the regions to be formed the dielectric gate structures 308 are removed during the formation of the dielectric gate structures 308. Therefore, top surfaces of the isolation structure 312 and the substrate 310 in contact with the dielectric gate structures 308 are lower than other top surfaces of the isolation structure 312 and the substrate 310. Further, the dielectric gate structures 308 are in contact with the dummy gate structures 408 at this fabrication stage, as shown in FIGS. 9A and 9C. The dielectric gate structures 308 will be separated from the dummy gate structures 408 in sequent processes.

Figure 10A:
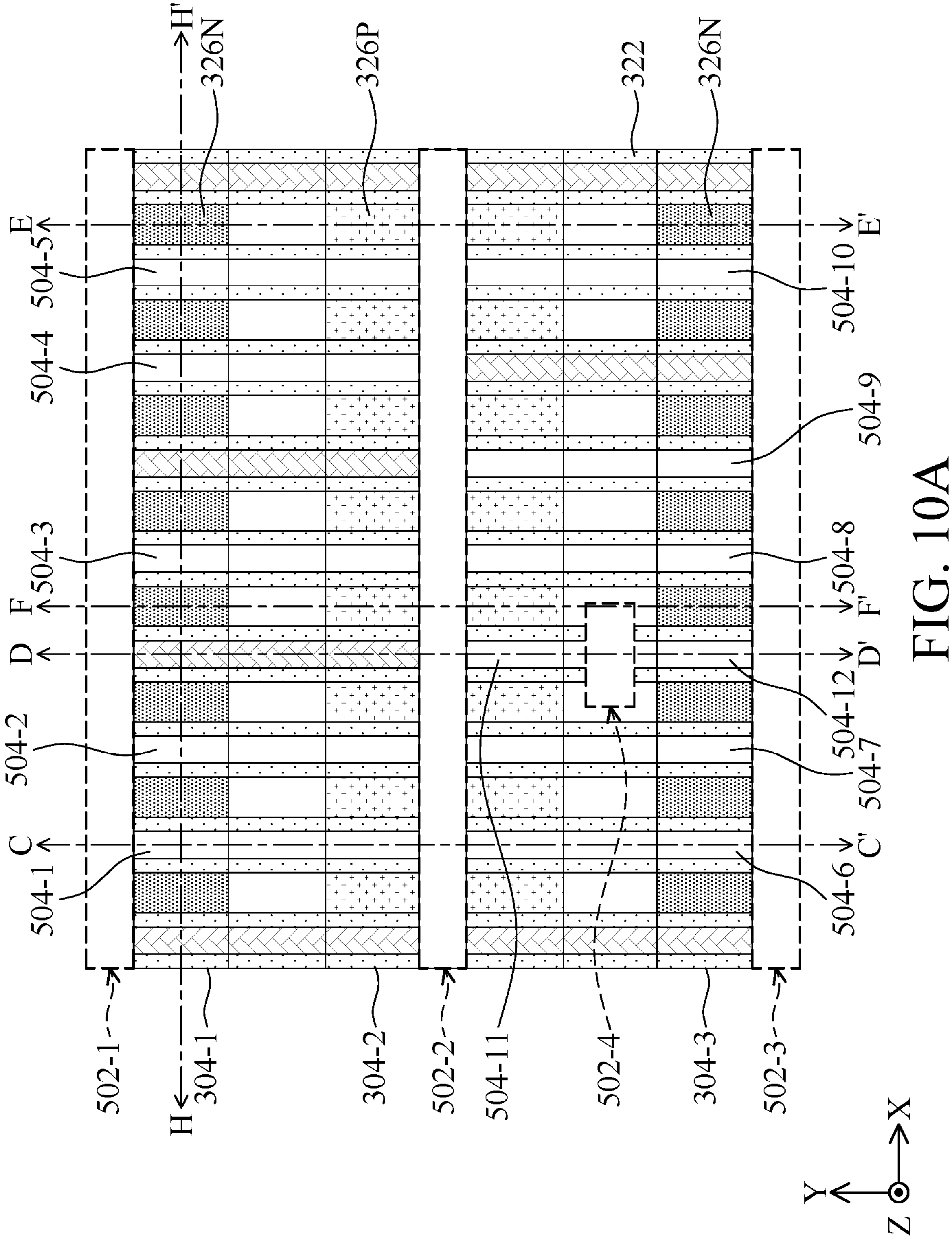
FIG. 10A is a fragmentary diagrammatic top view (or layout) of the array at a fabrication stage, in accordance with some embodiments of the present disclosure.
Figure 10B:
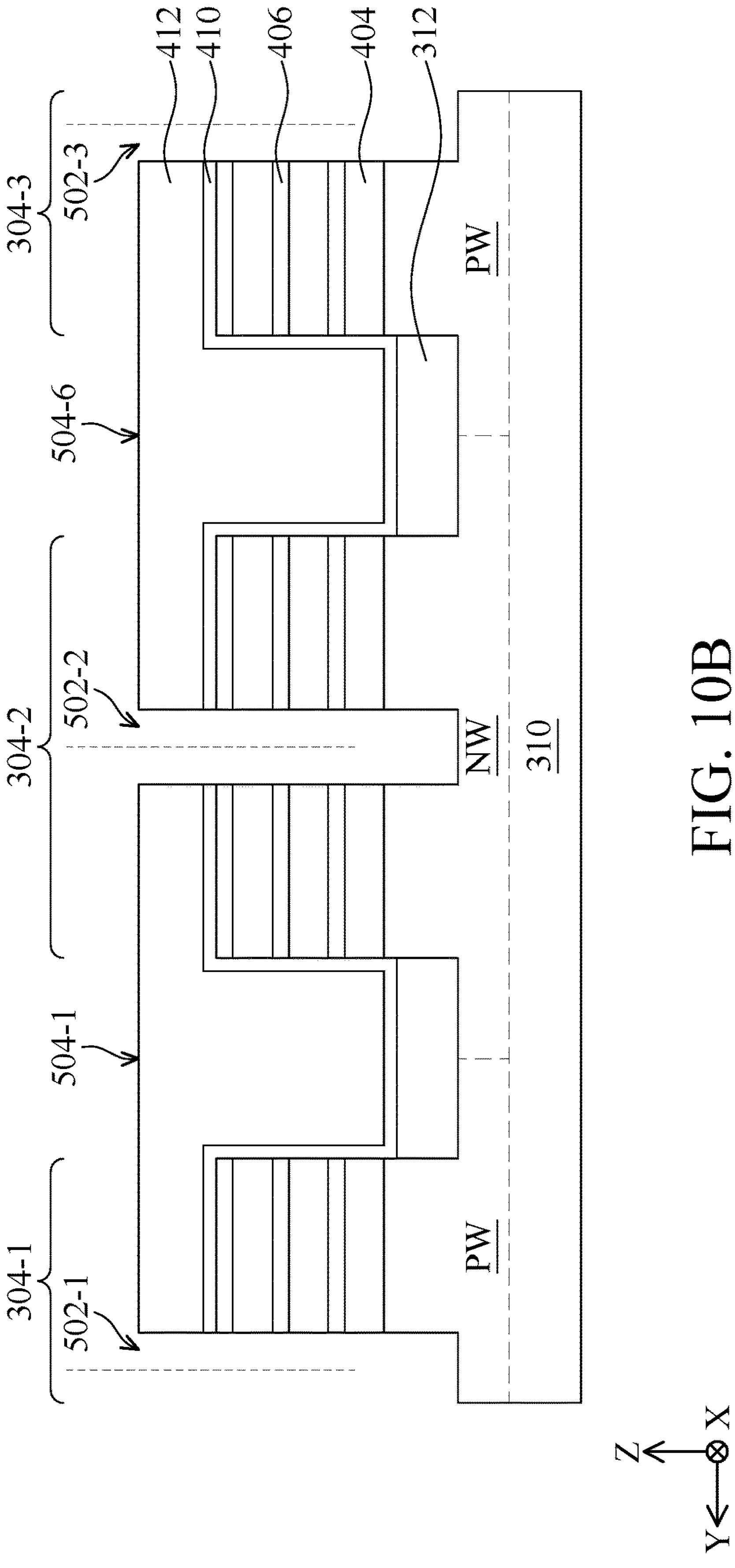
FIG. 10B is a Y-Z cross-sectional view of the array at the fabrication stage along a line C-C' of FIG. 10A, in accordance with some embodiments of the present disclosure.
Figure 10C:
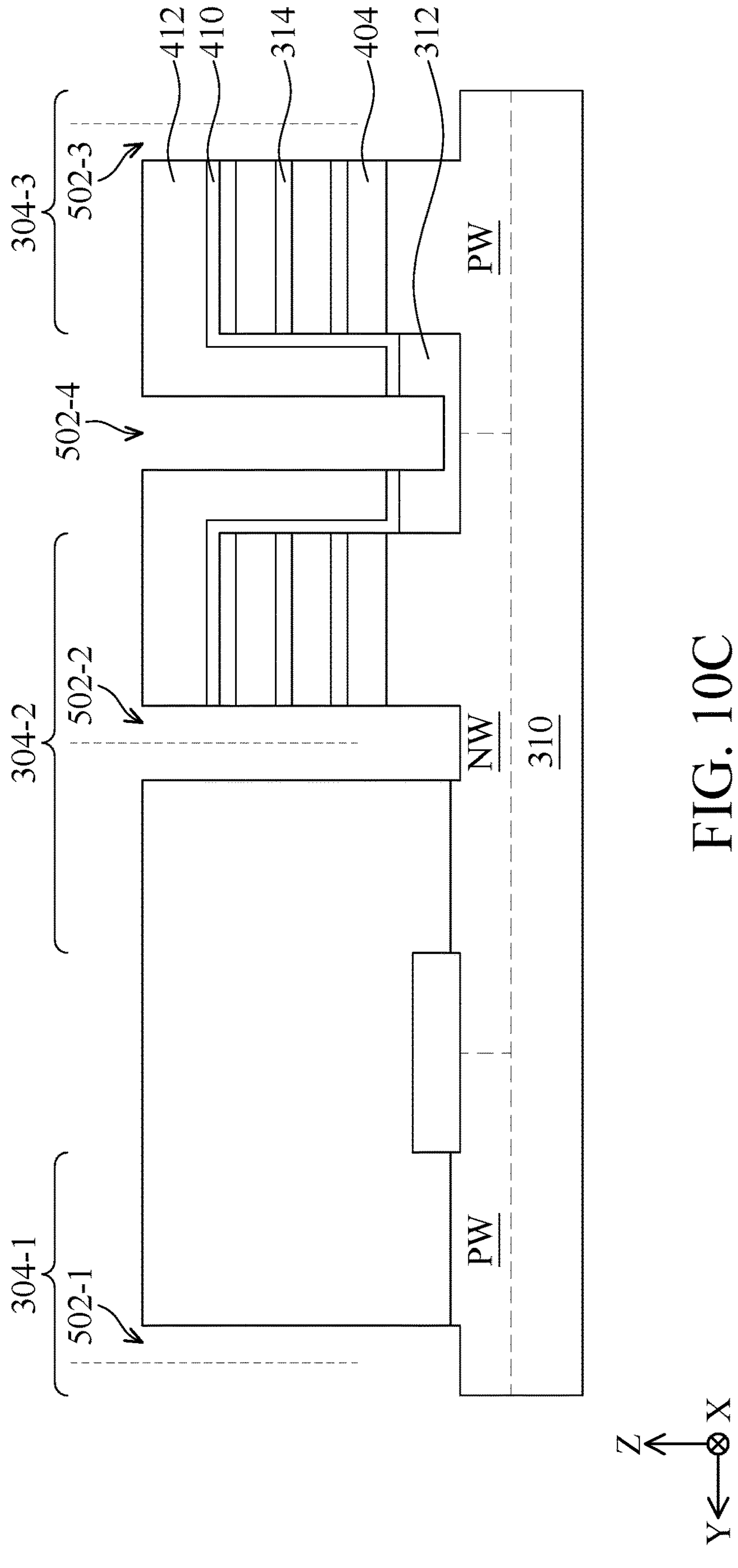
FIG. 10C is a Y-Z cross-sectional view of the array at the fabrication stage along a line D-D' of FIG. 10A, in accordance with some embodiments of the present disclosure.
Figure 10D:
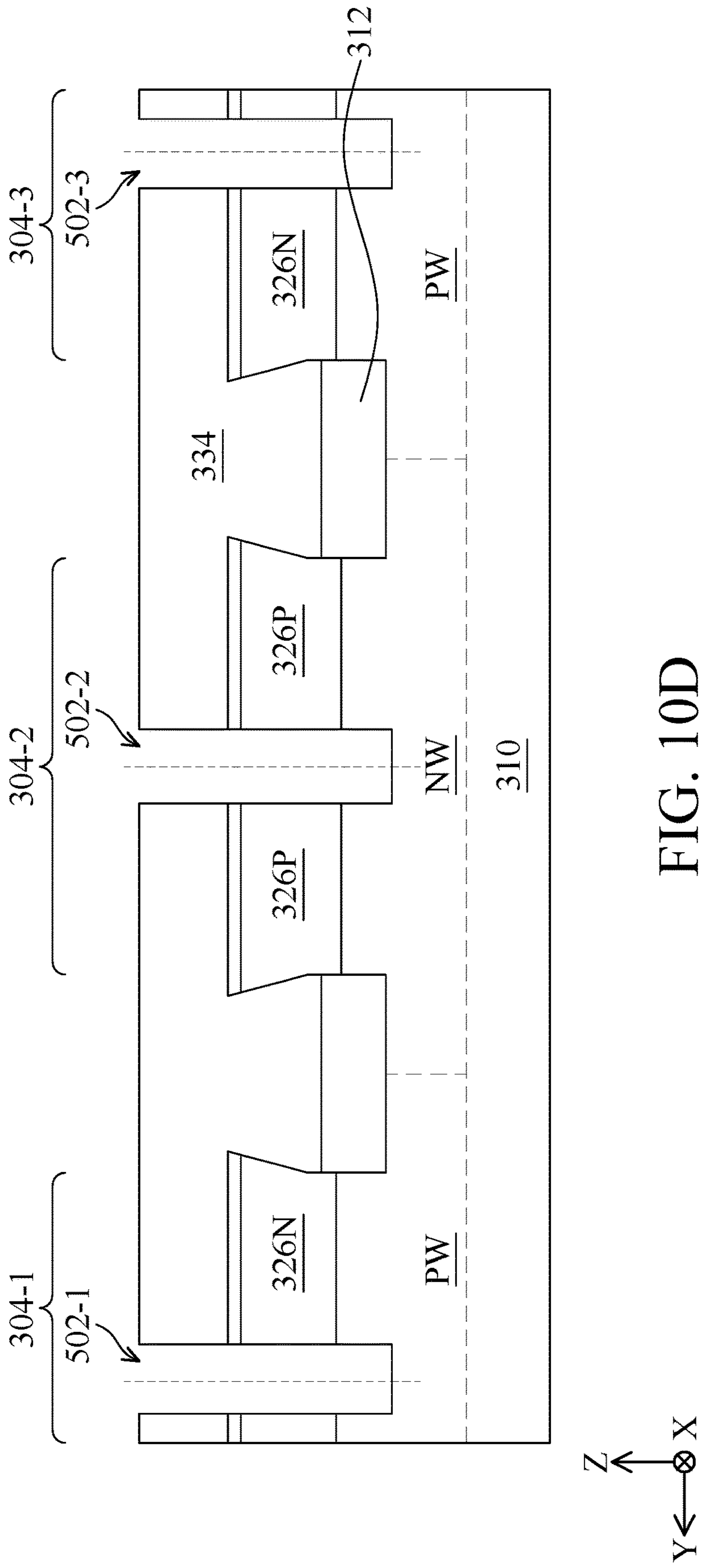
FIG. 10D is a Y-Z cross-sectional view of the array at the fabrication stage along a line E-E' of FIG. 10A, in accordance with some embodiments of the present disclosure.
Figure 10E:
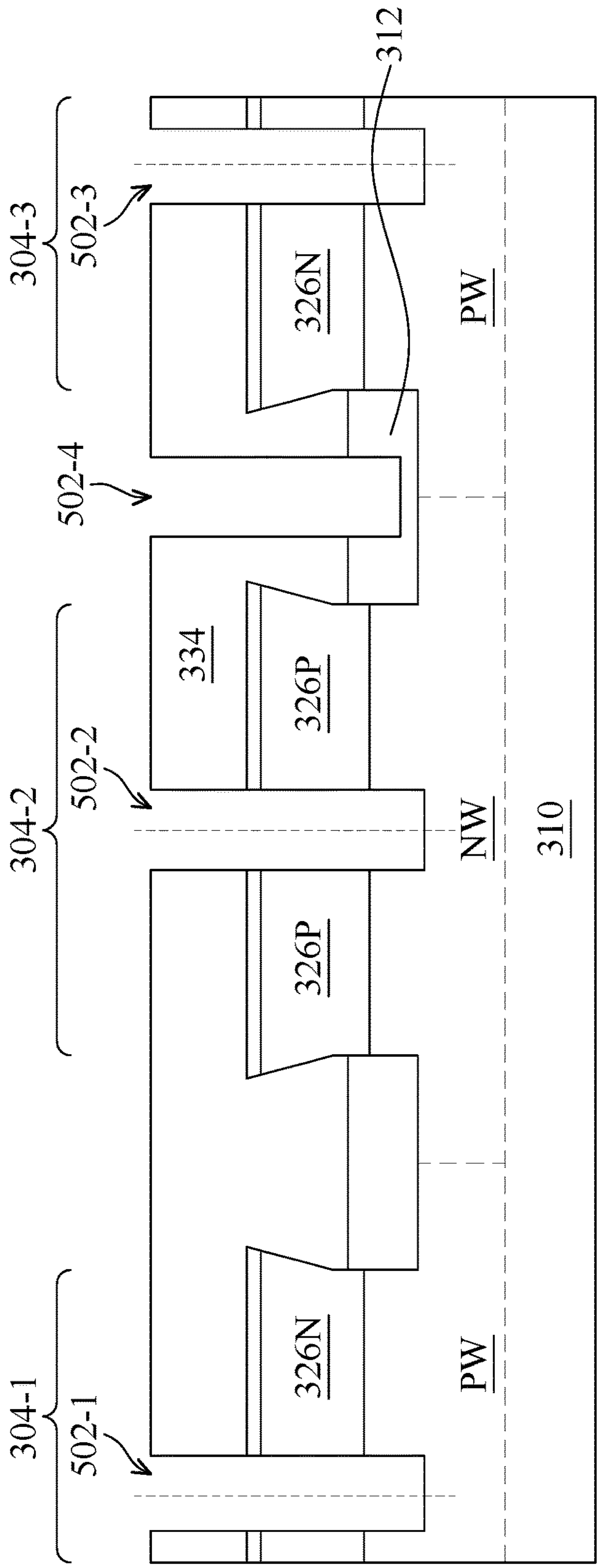
FIG. 10E is a Y-Z cross-sectional view of the array at the fabrication stage along a line F-F' of FIG. 10A, in accordance with some embodiments of the present disclosure.
Figure 10F:
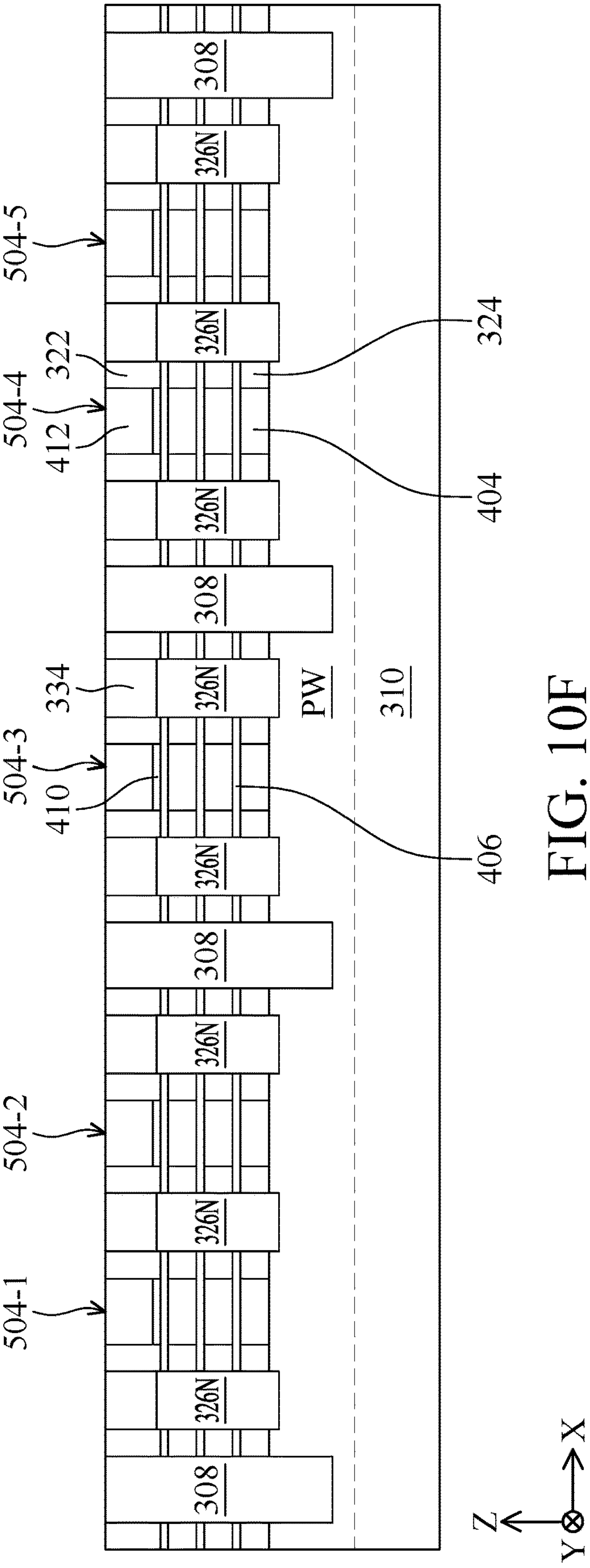
FIG. 10F is an X-Z cross-sectional view of the array at the fabrication stage along a line H-H' of FIG. 10A, in accordance with some embodiments of the present disclosure.

FIG. 10A is a fragmentary diagrammatic top view (or layout) of the array 300 at a fabrication stage, in accordance with some embodiments of the present disclosure. FIG. 10B is a Y-Z cross-sectional view of the array 300 at the fabrication stage along a line C-C' of FIG. 10A, in accordance with some embodiments of the present disclosure. FIG. 10C is a Y-Z cross-sectional view of the array 300 at the fabrication stage along a line D-D' of FIG. 10A, in accordance with some embodiments of the present disclosure. FIG. 10D is a Y-Z cross-sectional view of the array 300 at the fabrication stage along a line E-E' of FIG. 10A, in accordance with some embodiments of the present disclosure. FIG. 10E is a Y-Z cross-sectional view of the array 300 at the fabrication stage along a line F-F' of FIG. 10A, in accordance with some embodiments of the present disclosure. FIG. 10F is an X-Z cross-sectional view of the array 300 at the fabrication stage along a line H-H' of FIG. 10A, in accordance with some embodiments of the present disclosure.

Referring to FIGS. 10A to 10F, the ILD layer 332 discussed above is formed between the dummy gate structures 408 and over the merged source/drain features 326N'/326P'. After the formation of the ILD layer 332, one or more lithography and etching processes are performed to form trenches 502-1 to 502-4. The trenches 502-1 to 502-4 are used for the dielectric structures 320-1 to 320-4 discussed above. The trenches 502-1 to 502-3 are formed in the active areas 304 to cut the dummy gate structures 408, the semiconductor layers 404 and 406, and the merged source/drain features 326N'/326P'. The dummy gate structures 408 are cut into segments 504 (including segments 504-1 to 504-12), as shown in FIGS. 10A and 10B. The segments 504 may be referred to as dummy gate structure segments. The dielectric gate structures 308 in contact with the dummy gate structures 408 are separated after the formation of the trenches 502-1 to 502-3, as shown in FIGS. 10A and 10C. As discussed above, in each of the active areas 304, each of the merged source/drain features 326N'/326P' is cut by the trench (e.g., the trenches 502-1 to 502-3) into two source/drain features 326N/326P for different circuit cells in the adjacent two rows of the array 300, as discussed above. Further, in each of the active areas 304, each of the semiconductor layers 406 is also cut by the trench (e.g., the trenches 502-1 to 502-3) into two portions (will be formed into the nanostructures 314 in sequent processes) for different circuit cells. The trench 502-4 is formed between the active areas 304-2 and 304-3 to cut the dummy gate structure 408-4 in to segments 504-11 and 504-12. The formation of the trenches 502-1 to 502-3 also recesses the substrate 310 in the active areas 304, as shown in FIGS. 10B and 10C. The formation of the trench 502-4 also recesses the isolation structure 312 between the active areas 304, as shown in FIG. 10C. In some embodiments, the trench 502-4 passes through the isolation structure 312 and extend into the substrate 310.

Figure 11A:
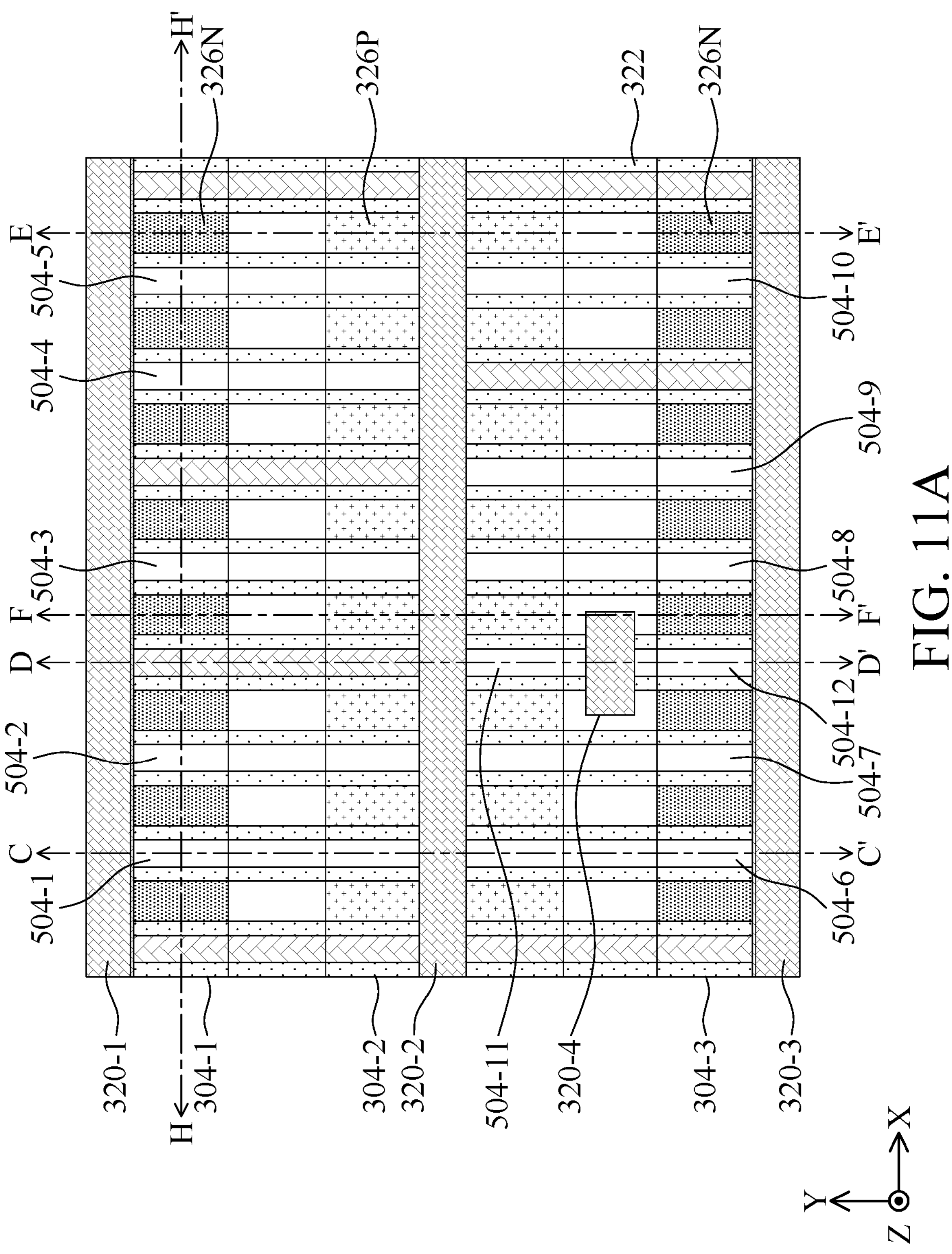
FIG. 11A is a fragmentary diagrammatic top view (or layout) of the array at a fabrication stage, in accordance with some embodiments of the present disclosure.
Figure 11B:
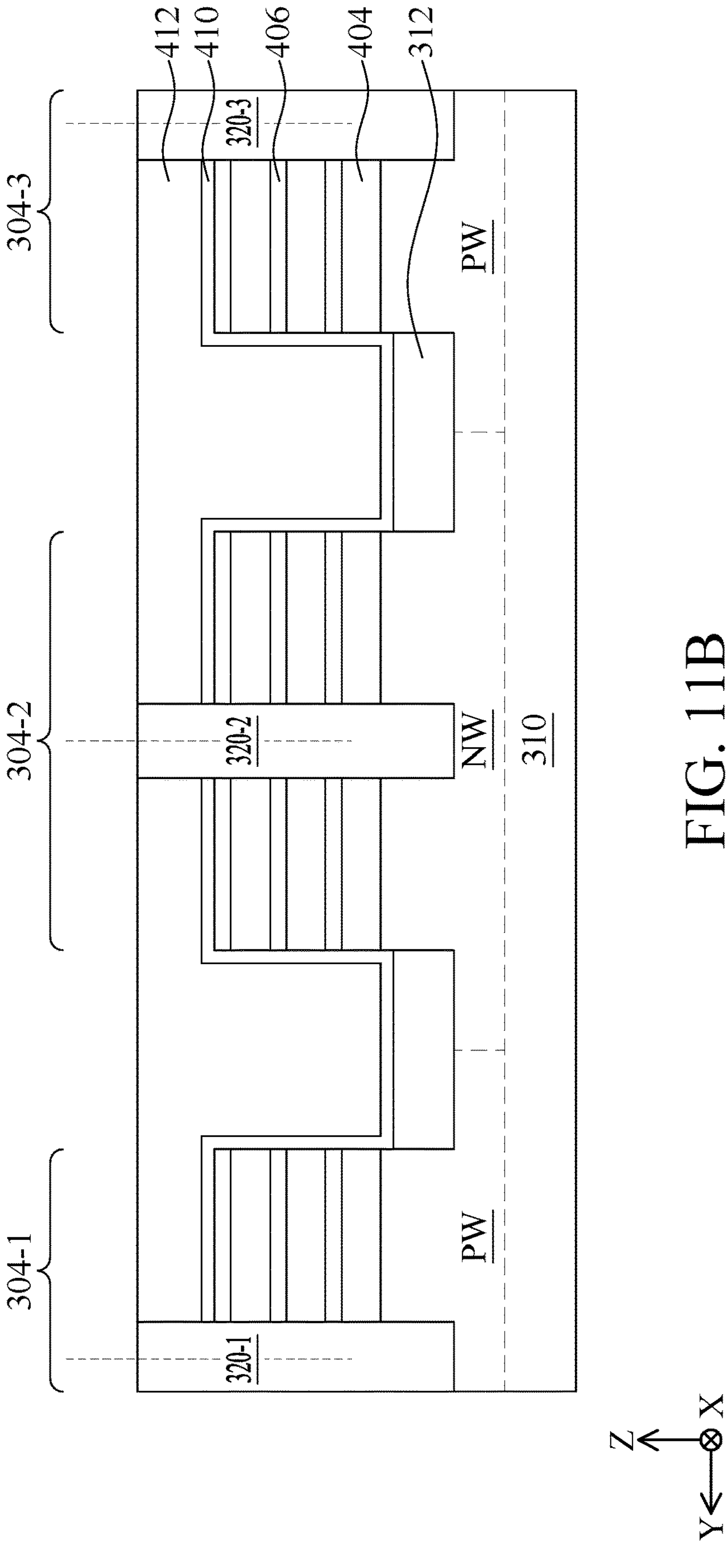
FIG. 11B is a Y-Z cross-sectional view of the array at the fabrication stage along a line C-C' of FIG. 11A, in accordance with some embodiments of the present disclosure.
Figure 11C:
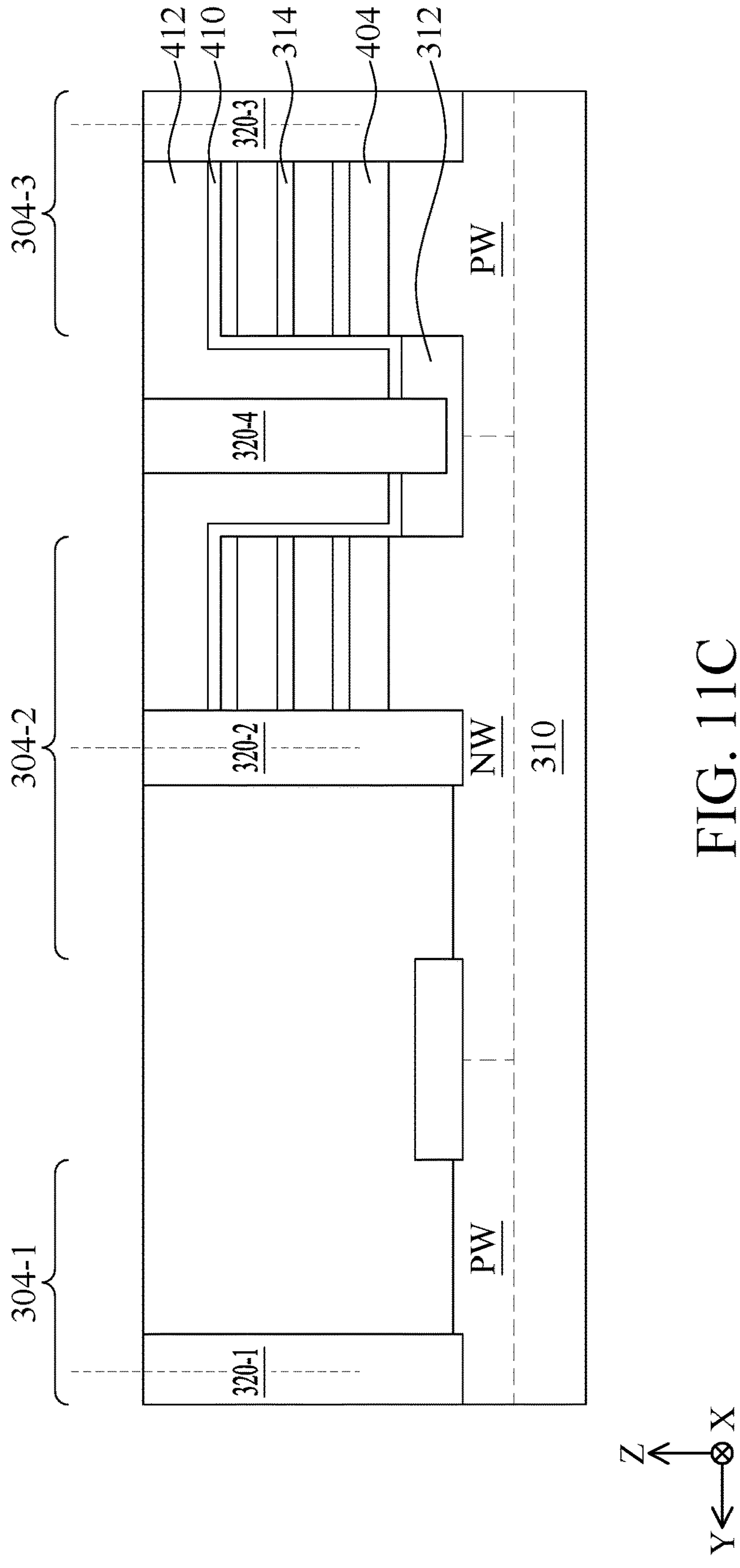
FIG. 11C is a Y-Z cross-sectional view of the array at the fabrication stage along a line D-D' of FIG. 11A, in accordance with some embodiments of the present disclosure.
Figure 11D:
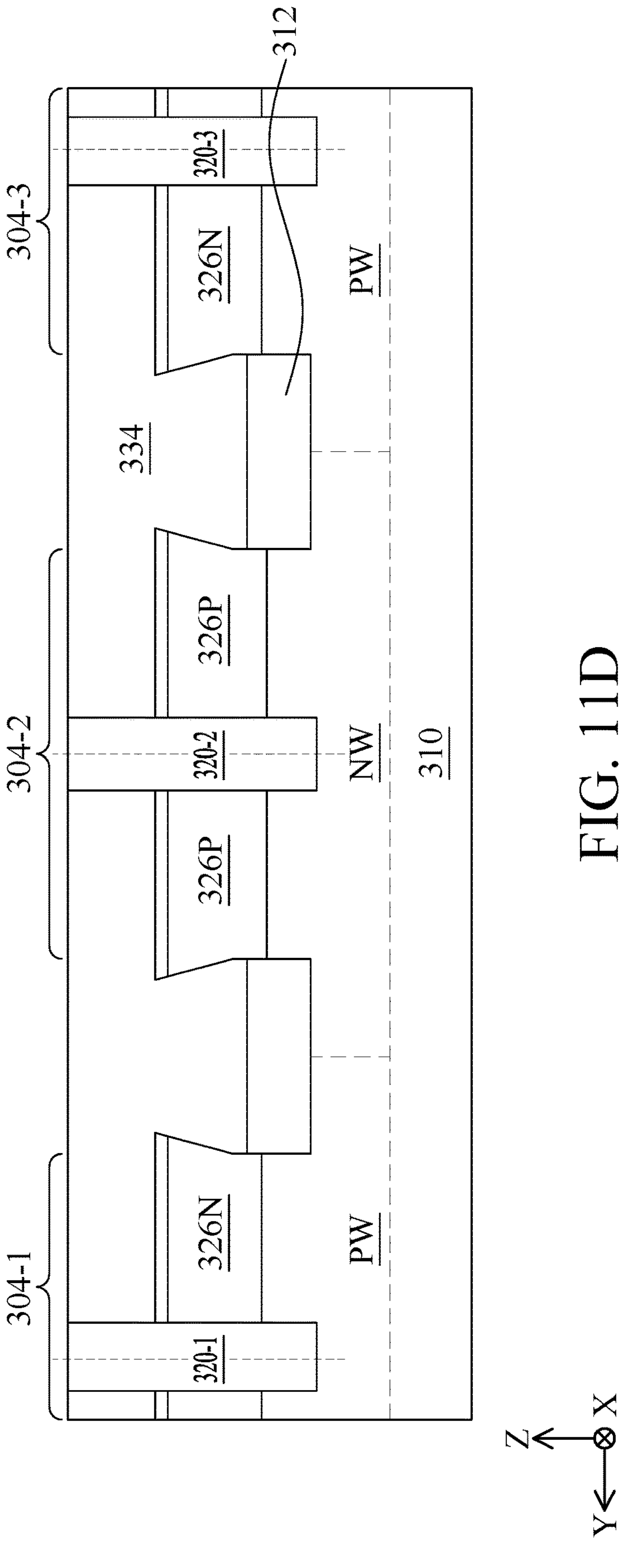
FIG. 11D is a Y-Z cross-sectional view of the array at the fabrication stage along a line E-E' of FIG. 11A, in accordance with some embodiments of the present disclosure.
Figure 11E:
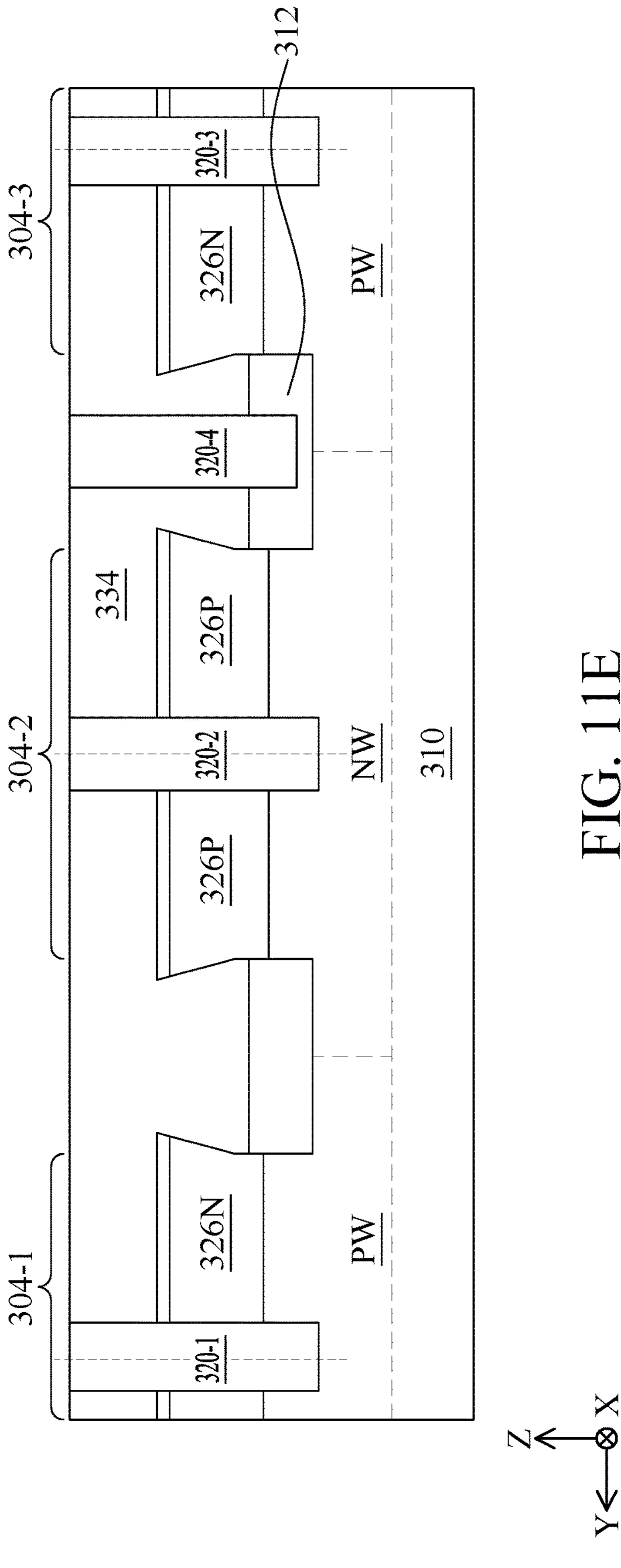
FIG. 11E is a Y-Z cross-sectional view of the array at the fabrication stage along a line F-F' of FIG. 11A, in accordance with some embodiments of the present disclosure.
Figure 11F:
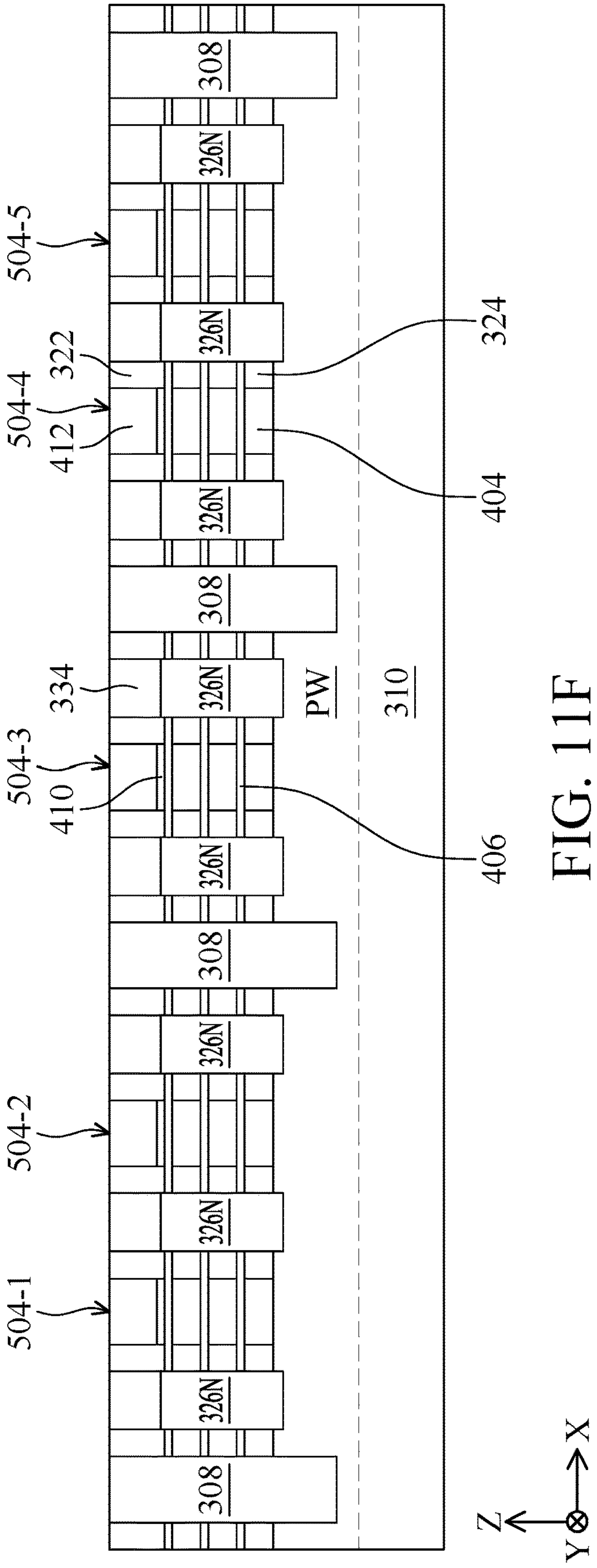
FIG. 11F is an X-Z cross-sectional view of the array at the fabrication stage along a line H-H' of FIG. 11A, in accordance with some embodiments of the present disclosure.

FIG. 11A is a fragmentary diagrammatic top view (or layout) of the array 300 at a fabrication stage, in accordance with some embodiments of the present disclosure. FIG. 11B is a Y-Z cross-sectional view of the array 300 at the fabrication stage along a line C-C' of FIG. 11A, in accordance with some embodiments of the present disclosure. FIG. 11C is a Y-Z cross-sectional view of the array 300 at the fabrication stage along a line D-D' of FIG. 11A, in accordance with some embodiments of the present disclosure. FIG. 11D is a Y-Z cross-sectional view of the array 300 at the fabrication stage along a line E-E' of FIG. 11A, in accordance with some embodiments of the present disclosure. FIG. 11E is a Y-Z cross-sectional view of the array 300 at the fabrication stage along a line F-F' of FIG. 11A, in accordance with some embodiments of the present disclosure. FIG. 11F is an X-Z cross-sectional view of the array 300 at the fabrication stage along a line H-H' of FIG. 11A, in accordance with some embodiments of the present disclosure.

Referring to FIGS. 11A to 11F, the dielectric structures 320-1 to 320-4 discussed above are formed in the trenches 502-1 to 502-4. More specifically, the material for the dielectric structures 320-1 to 320-4 discussed is formed to fill the trenches 502-1 to 502-4 and over the segments 504, the dielectric gate structures 308, and the ILD layer 332. Then, a CMP process is performed on the material until top surfaces of the segments 504 exposed to form the dielectric structures 320-1 to 320-4. As such, the dummy gate structures 408, the merged source/drain features 326N'/326P', and the semiconductor layers 406 are respectively cut into segments 504, the source/drain features 326N/326P, and the nanostructures 314 by the dielectric structures 320-1 to 320-4. The top surfaces of the dielectric structures 320-1 to 320-4 are substantially level with top surfaces of the segments 504, as shown in FIGS. 11B and 11C. The process for forming the dielectric structures 320-1 to 320-4 may be referred to as cutting process.

In existing technologies, as transistors and circuit cells continue to be scaled down, features in transistors are also scaled down. Such scaled down features may be easily suffered process variation or process error, so that yield and quality of the features are low, thereby degrading performance of the transistors. In some embodiments of the present disclosure, the features of the transistors are formed by cutting large features. For example, the source/drain features 326N/326P, the nanostructures 314 for different transistors are formed by cutting the merged source/drain features 326N'/326P' and the semiconductor layers 406 in the same active area 304, as discussed above. In other words, the small features (the source/drain features 326N/326P and the nanostructures 314, etc.) are formed from large features (the merged source/drain features 326N'/326P' and the semiconductor layers 406, etc.) that were formed at first with less (or no) impacts from process variation or process error. Therefore, the performance of the transistors herein is improved.

Figure 12A:
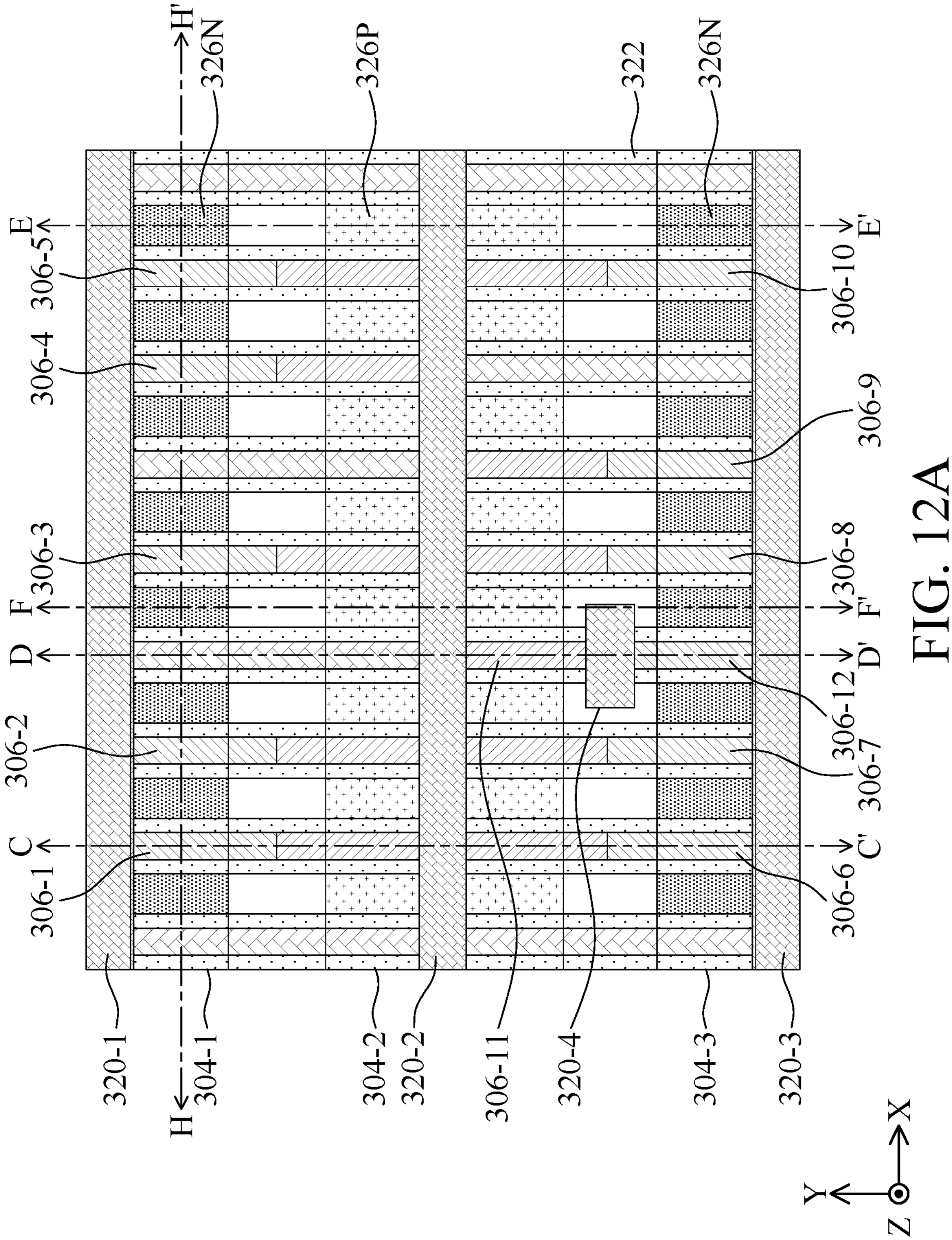
FIG. 12A is a fragmentary diagrammatic top view (or layout) of the array at a fabrication stage, in accordance with some embodiments of the present disclosure.
Figure 12B:
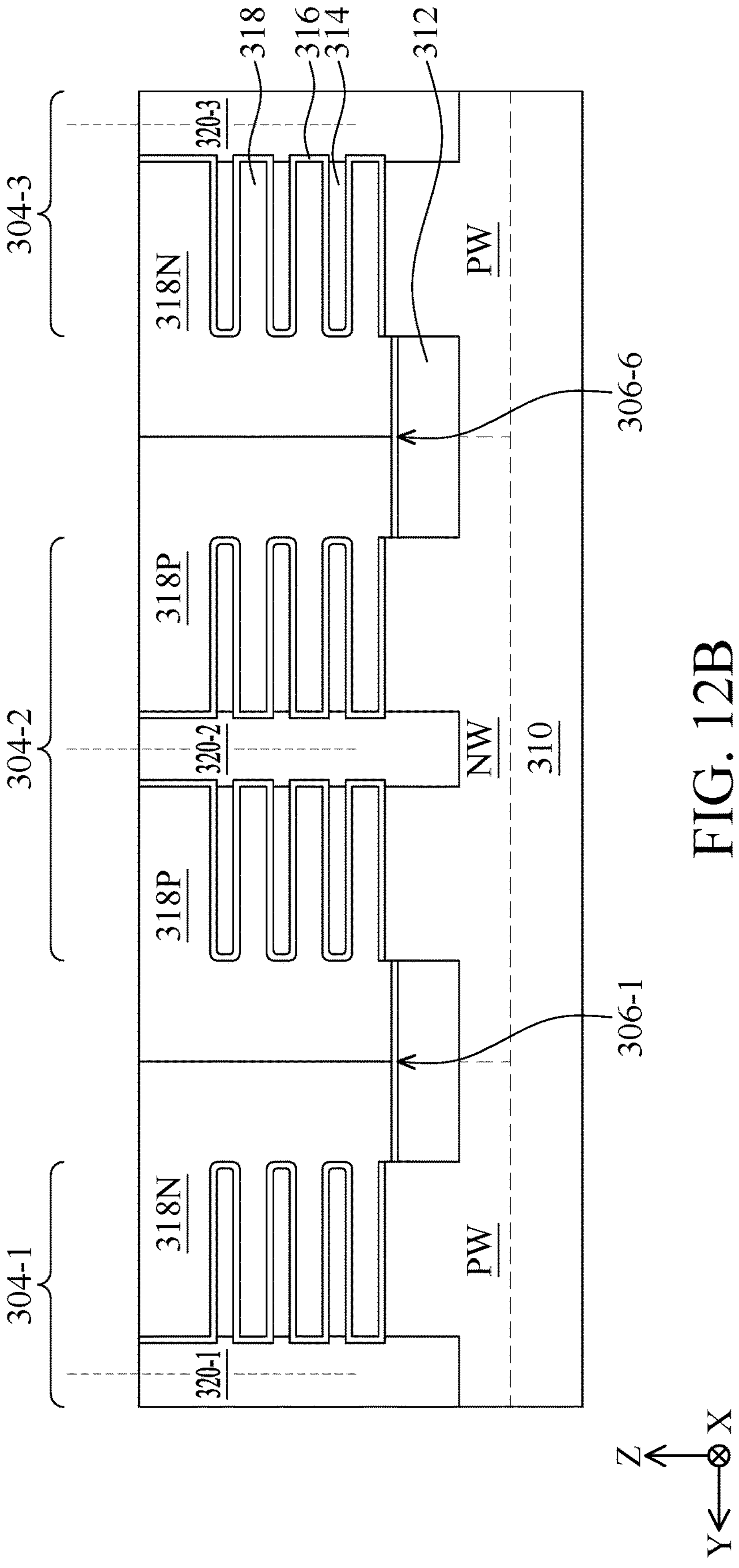
FIG. 12B is a Y-Z cross-sectional view of the array at the fabrication stage along a line C-C' of FIG. 12A, in accordance with some embodiments of the present disclosure.
Figure 12C:
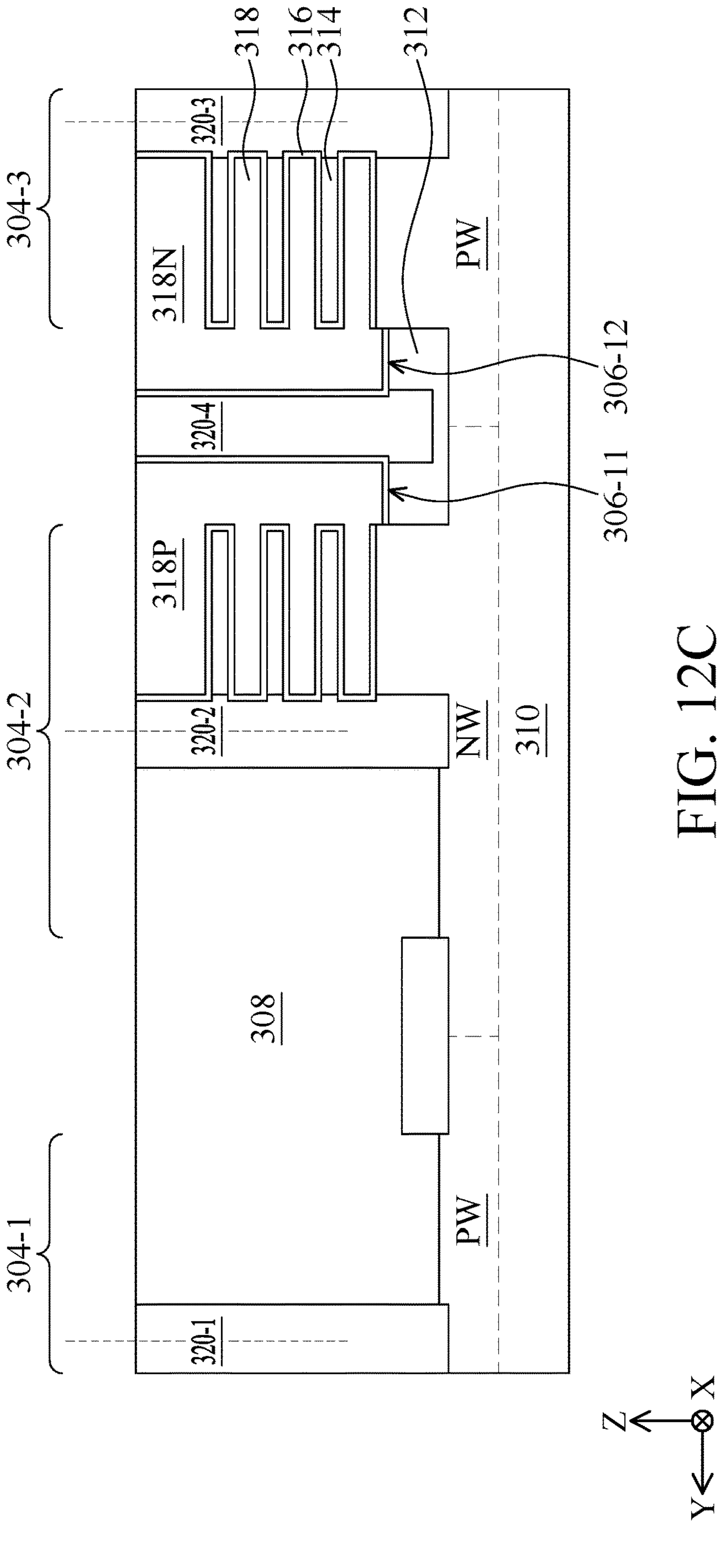
FIG. 12C is a Y-Z cross-sectional view of the array at the fabrication stage along a line D-D' of FIG. 12A, in accordance with some embodiments of the present disclosure.
Figure 12D:
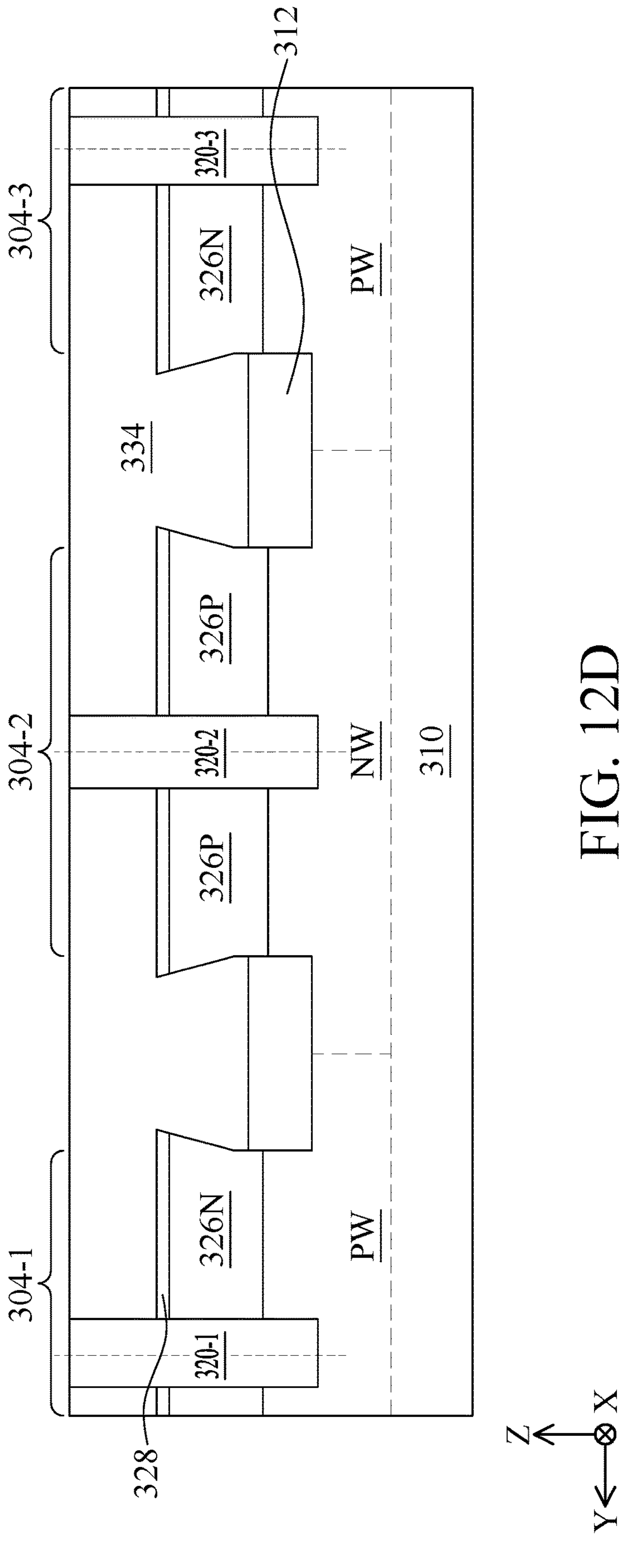
FIG. 12D is a Y-Z cross-sectional view of the array at the fabrication stage along a line E-E' of FIG. 12A, in accordance with some embodiments of the present disclosure.
Figure 12E:
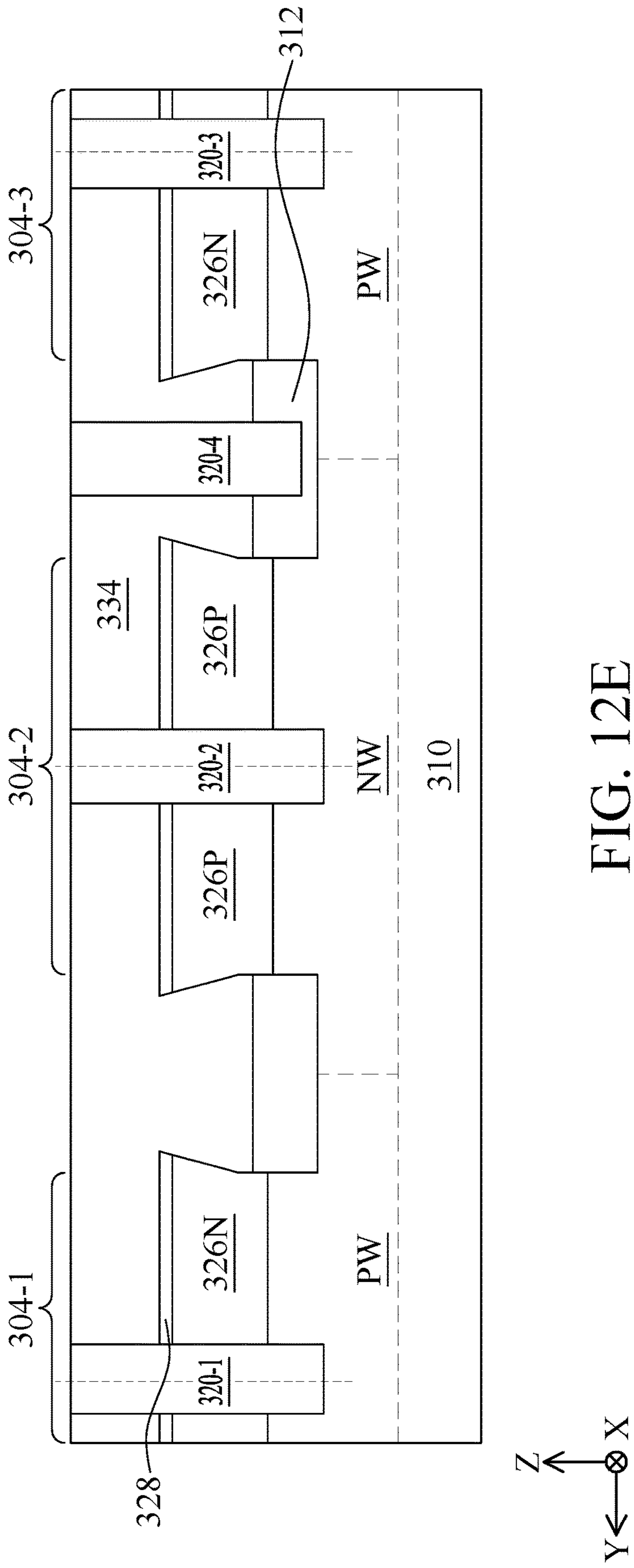
FIG. 12E is a Y-Z cross-sectional view of the array at the fabrication stage along a line F-F' of FIG. 12A, in accordance with some embodiments of the present disclosure.
Figure 12F:
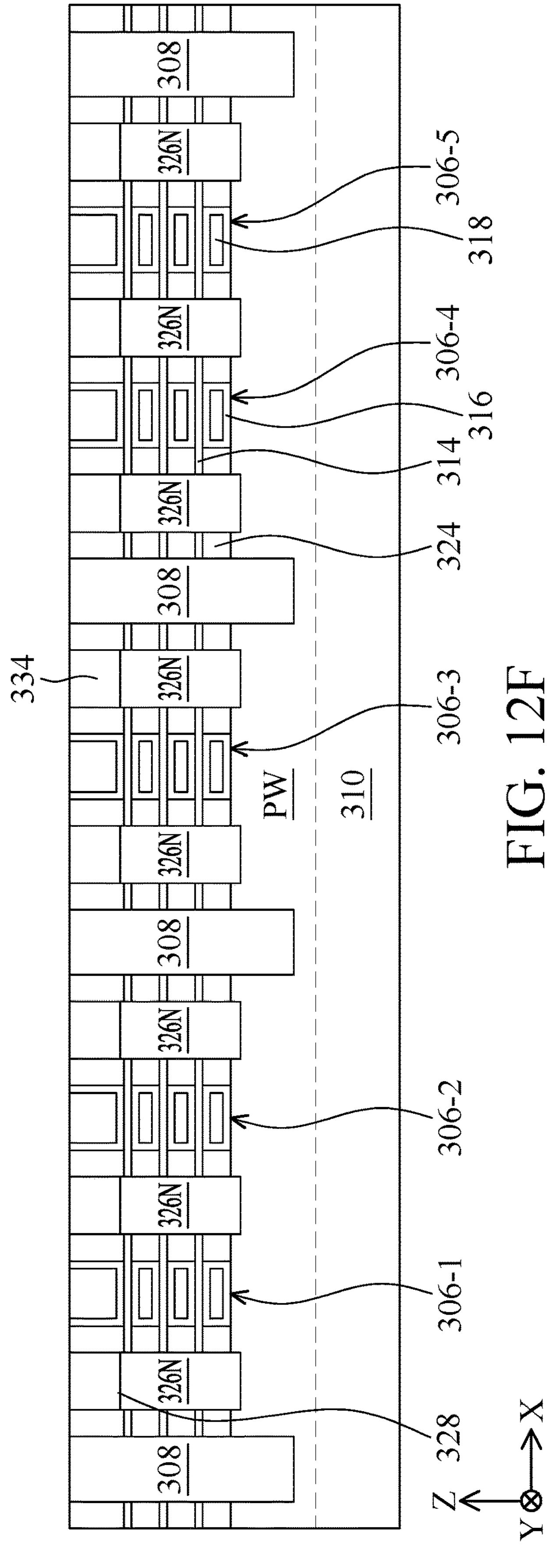
FIG. 12F is an X-Z cross-sectional view of the array at the fabrication stage along a line H-H' of FIG. 12A, in accordance with some embodiments of the present disclosure.

FIG. 12A is a fragmentary diagrammatic top view (or layout) of the array 300 at a fabrication stage, in accordance with some embodiments of the present disclosure. FIG. 12B is a Y-Z cross-sectional view of the array 300 at the fabrication stage along a line C-C' of FIG. 12A, in accordance with some embodiments of the present disclosure. FIG. 12C is a Y-Z cross-sectional view of the array 300 at the fabrication stage along a line D-D' of FIG. 12A, in accordance with some embodiments of the present disclosure. FIG. 12D is a Y-Z cross-sectional view of the array 300 at the fabrication stage along a line E-E' of FIG. 12A, in accordance with some embodiments of the present disclosure. FIG. 12E is a Y-Z cross-sectional view of the array 300 at the fabrication stage along a line F-F' of FIG. 12A, in accordance with some embodiments of the present disclosure. FIG. 12F is an X-Z cross-sectional view of the array 300 at the fabrication stage along a line H-H' of FIG. 12A, in accordance with some embodiments of the present disclosure.

Referring to FIGS. 12A to 12F, the segments 504 of the dummy gate structures 408 are replaced with the gate structures 306 discussed above. More specifically, the segments 504 of the dummy gate structures 408 and the semiconductor layers below the segments 504 are removed to form gate trenches (not shown), and then the gate structures 306 are formed in the gate trenches.

Figure 13:
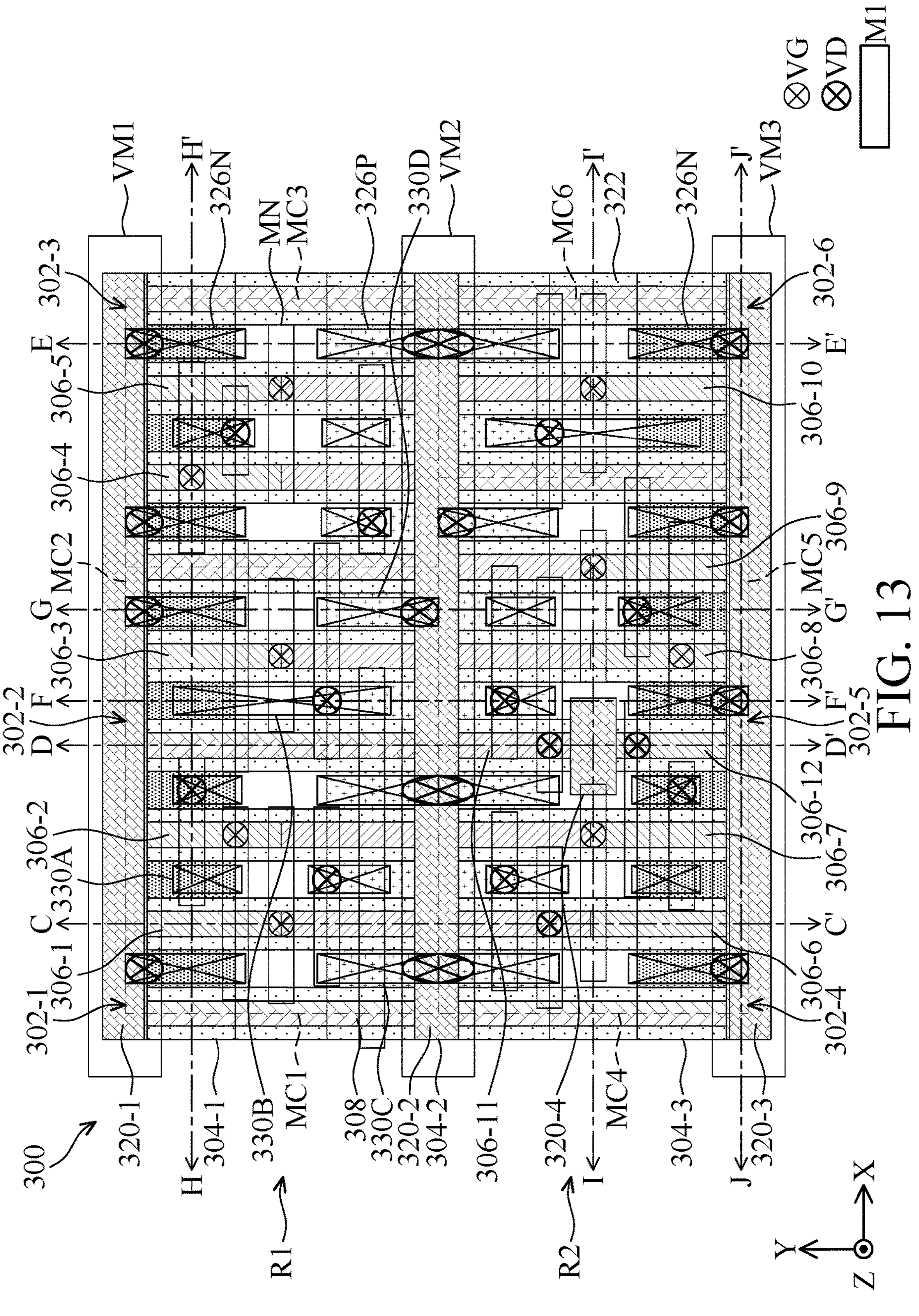
FIG. 13 is a fragmentary diagrammatic top view (or layout) of the array 300 at a fabrication stage, in accordance with some embodiments of the present disclosure.

FIG. 13 is a fragmentary diagrammatic top view (or layout) of the array 300 at a fabrication stage, in accordance with some embodiments of the present disclosure. FIG. 13 is also a combination of FIGS. 4A and 4B. As shown in FIGS. 4A to 4J and 13, the source/drain contacts 330, the vias VD, the vias VG, and the metal layer M1 (including the metal conductors MN, VM1, VM2, and VM3) discussed above are formed. As such, the circuit cells 302 of the array 300 discussed above are formed. The source/drain contacts 330 are respectively formed over the respective source/drain features 326N/326P, as discussed above. The vias VD, the vias VG, and the metal layer M1 are formed to construct connections of the transistors in the circuit cells 302-1 to 302-6, as discussed above.

FIGS. 14A to 14D are fragmentary diagrammatic top views (or layouts) of an array 600 at various fabrication stages, in accordance with some embodiments of the present disclosure. As discussed above, the dielectric structures 320-1 to 320-3 are formed to cut the merged source/drain features 326N'/326P' and the semiconductor layers 406 in to the source/drain features 326N/326P and the nanostructure 314 for different transistors. In some embodiments, the dielectric structures 320-1 to 320-3 are formed to cut some of the merged source/drain features 326N'/326P' and the semiconductor layers 406, and the other merged source/drain features 326N'/326P' and the semiconductor layers 406 which are not cut may be used for large transistors.

Referring to FIG. 4A, the array 600 includes active areas 602 (including active areas 602-1 to 602-3), dummy gate structures 604 (including dummy gate structures 604-1 to 604-5), merged source/drain features 606-1 and 606-2, and dielectric gate structures 608, which are similar to those discussed above. The formations of the active areas 602, the dummy gate structures 604, the merged source/drain features 606-1 and 606-2, and the dielectric gate structures 608 are similar to those discussed in FIGS. 7A to 7C, 8A to 8D, and 9A to 9D.

Referring to FIG. 4B, dielectric structures 610-1 to 610-3 are formed to cut some dummy gate structures 604, some source/drain features 606-1 and 606-2, and some nanostructures (not shown) in the active areas 602. As shown in FIG. 4B, the dielectric structure 610-2 cut the dummy gate structures 604-1 and 604-2 and some merged source/drain features 606-1 and 606-2 on opposite sides of the dummy gate structures 604-1 and 604-2 into segment 614-1 to 614-4 and source/drain features 612-1 and 612-2. The dummy gate structures 604-3 to 604-5 and the merged source/drain features 606-2 on opposite sides of the dummy gate structures 604-3 to 604-5 are not cut by the dielectric structure 610-2.

Referring to FIG. 4C, the segment 614-1 to 614-4 and the dummy gate structures 604-3 to 604-5 are replaced with gate structures 616-1 to 616-7, similar to the gate structures 306 discussed above. Referring to FIG. 4D, source/drain contacts 618, metal conductors 622, 620-1, 620-2, and 620-3, and vias VD and VG are formed, similar to the source/drain contacts 330, the metal conductors MN, VM1, VM2, and VM3, and the vias VD and VG discussed above. Therefore, circuit cells 624-1 to 624-3 of the array 600 are formed.

Figure 14A:
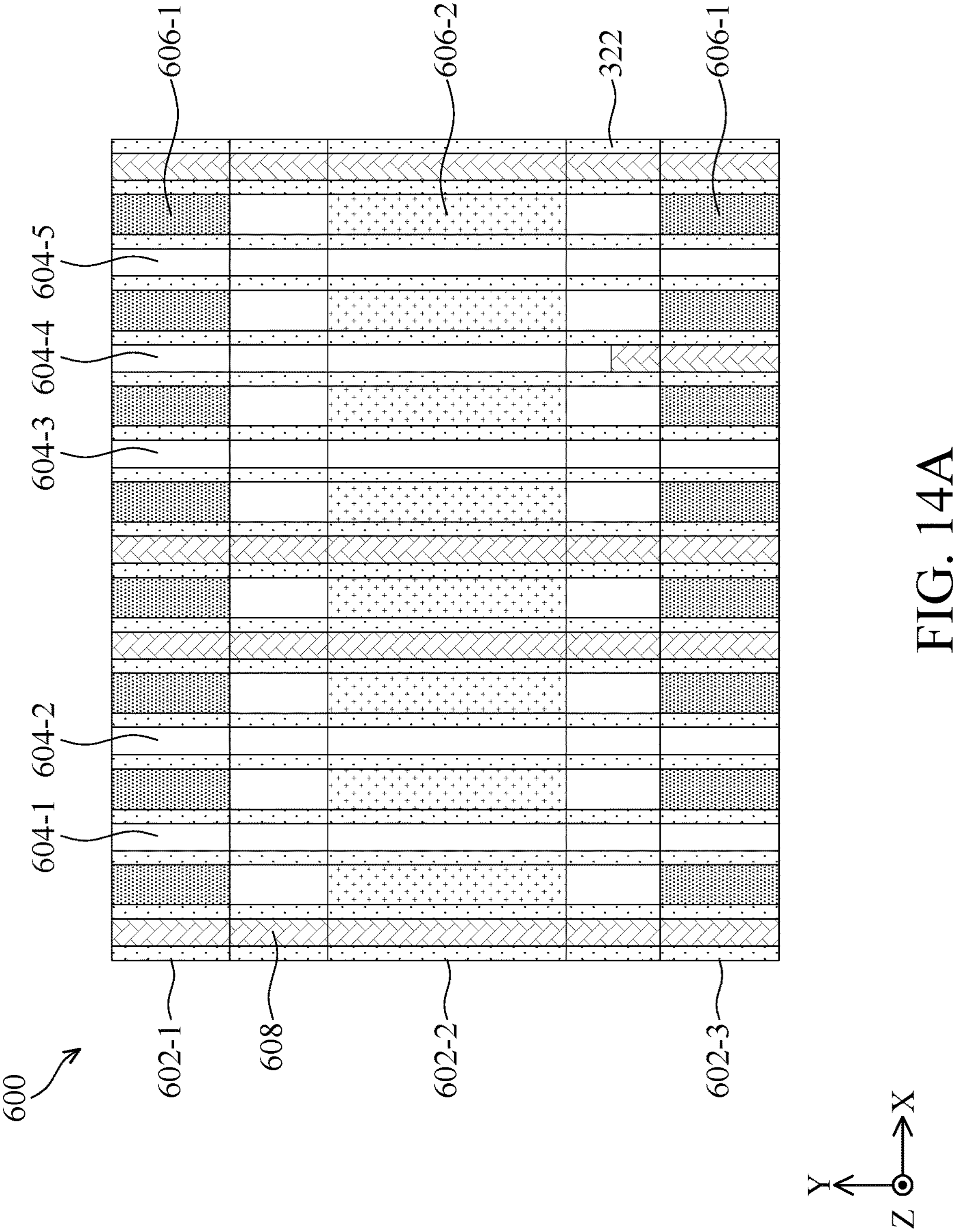
FIGS. 14A, 14B, 14C, and 14D are fragmentary diagrammatic top views (or layouts) of another array at various fabrication stages, in accordance with some embodiments of the present disclosure.
Figure 14B:
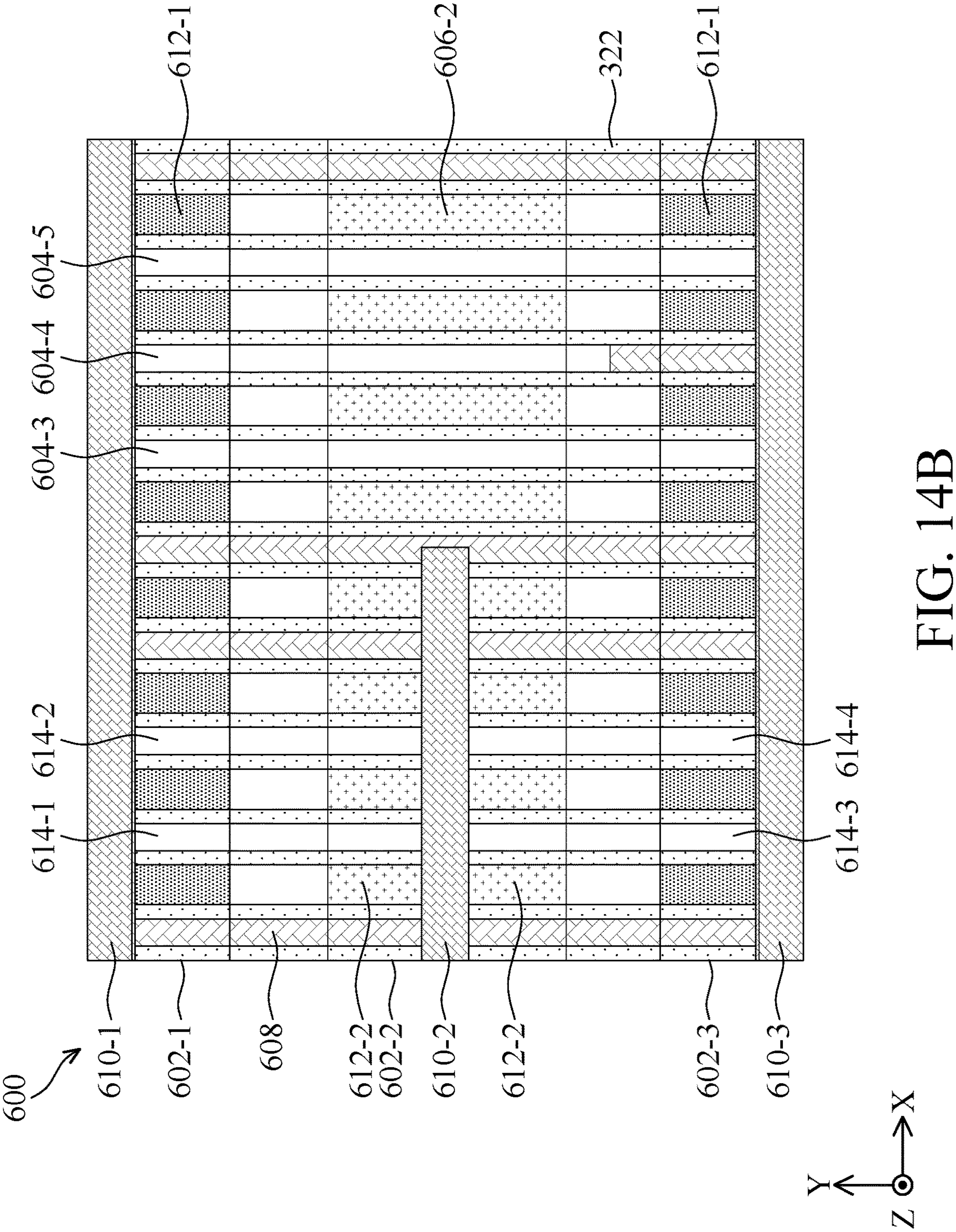
Figure 14C:
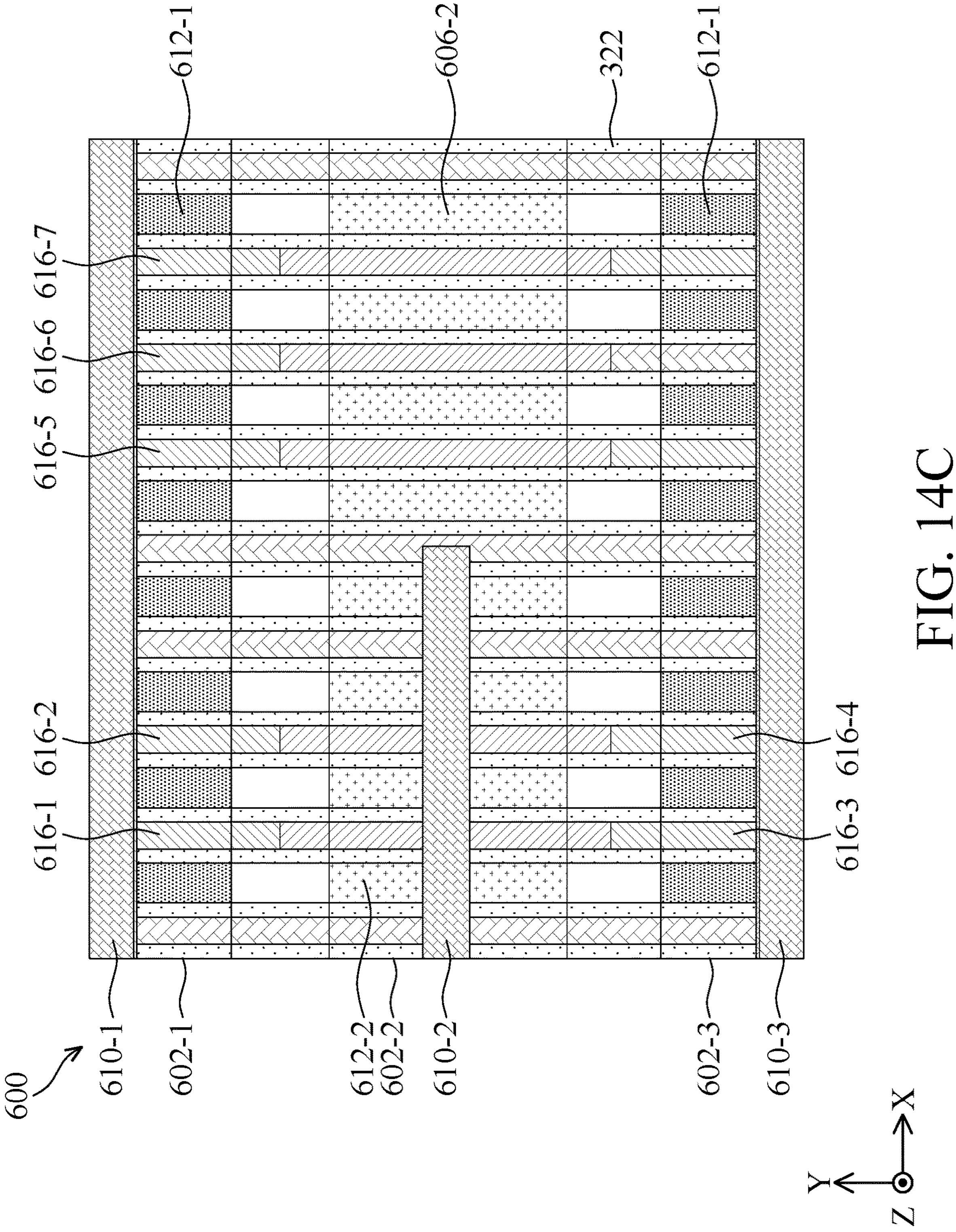
Figure 14D:
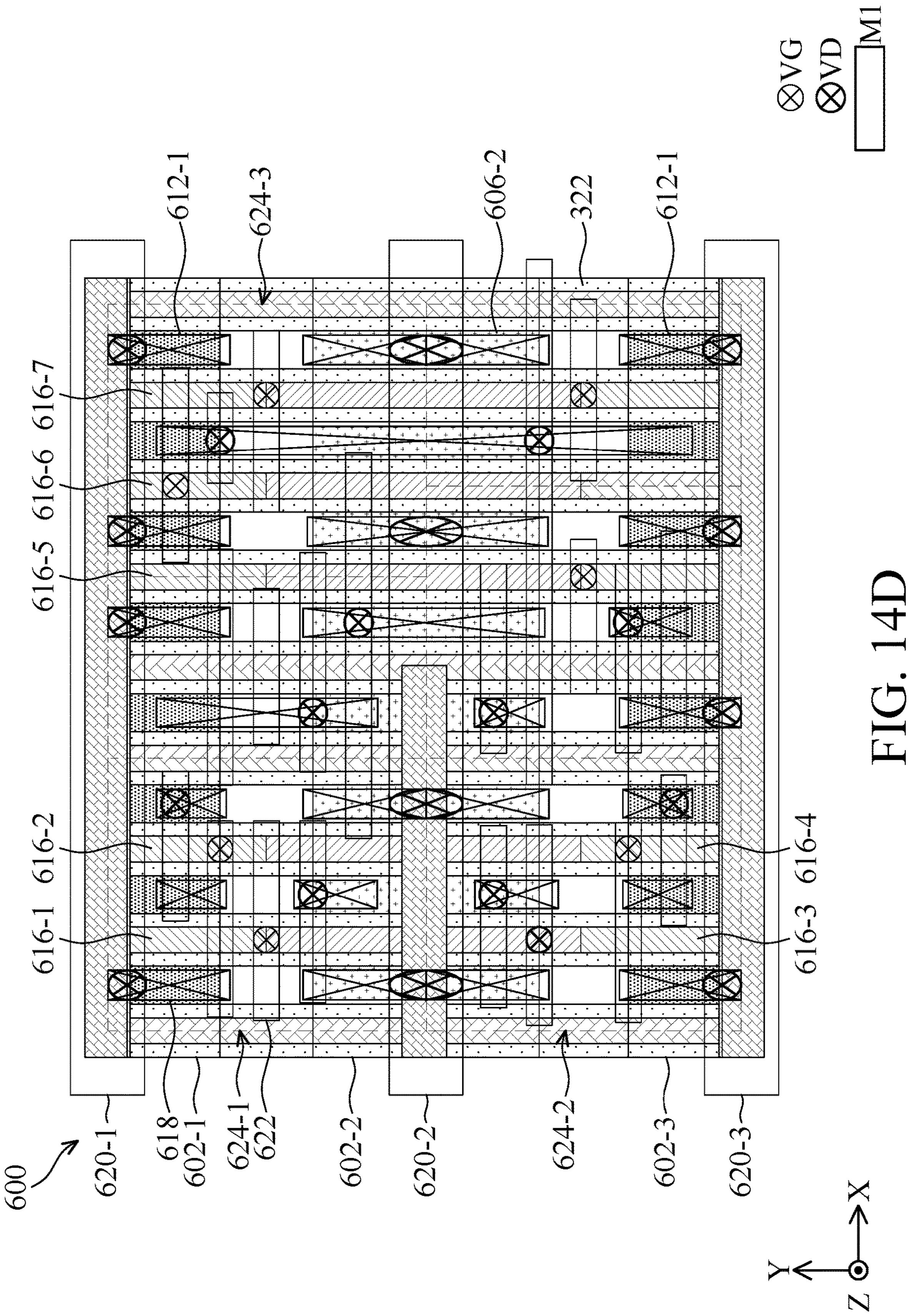

As shown in FIG. 14D, the circuit cell 624-3 has three transistors in the active areas 602-2. These transistors are formed from the gate structures 616-5 to 606-7 and the merged source/drain features 606-2. As such, these transistors have large size of the source/drain features (i.e., the merged source/drain features 606-2) and the nanostructures 314 (not shown) in the Y-direction. These transistors may provide about twice on-current ($I_{on}$), compared to other transistors formed from the source/drain features 612-2.

In some embodiments, the merged source/drain features 606-2 and the source/drain features 612-2 are doped with n-type dopants (such as phosphorus, arsenic, other n-type dopant, or combinations thereof) as n-type source/drain features, and the source/drain features 612-1 are doped with p-type dopants (such as boron, indium, other p-type dopant, or combinations thereof) as p-type source/drain features. As such, the transistors formed from the gate structures 616-5 to 606-7 and the merged source/drain features 606-2 in the circuit cell 624-3 are n-type transistors with twice size in the Y direction, compared to other n-type transistors formed from the source/drain features 612-2.

In other embodiments, the merged source/drain features 606-2 and the source/drain features 612-2 are doped with p-type dopants (such as boron, indium, other p-type dopant, or combinations thereof) as p-type source/drain features, and the source/drain features 612-1 are doped with n-type dopants (such as phosphorus, arsenic, other n-type dopant, or combinations thereof) as n-type source/drain features. As such, the transistors formed from the gate structures 616-5 to 606-7 and the merged source/drain features 606-2 in the circuit cell 624-3 are p-type transistors with twice size in the Y direction, compared to other p-type transistors formed from the source/drain features 612-2.

The embodiments disclosed herein relate to semiconductor structures and their manufacturing methods, and more particularly to methods and semiconductor structures including dielectric structure for cutting each of features (merged source/drain features and channels) in one large active area into two portions (or segments) for two transistors in different circuit cells, respectively, to prevent affect from process variation or process error. Furthermore, the present embodiments provide one or more of the following advantages. The features formed by cutting large features provides larger process window, which improves the performance of the transistors.

Thus, one of the embodiments of the present disclosure describes a method for manufacturing a semiconductor structure that includes defining active areas extending in an X-direction, arranged in a Y-direction, and on a substrate. Each of the active areas has nanostructures. The method further includes forming dummy gate structures across the active areas in the Y-direction, forming merged source/drain features in the active areas and on opposite sides of the dummy gate structures in the X-direction, forming dielectric structures in the active areas to cut each of the merged source/drain features into a first source/drain feature and a second source/drain feature, and to cut each of the dummy gate structures into segments, and replacing the segments of the dummy gate structures with gate structures wrapping around the nanostructures in the active areas. The dielectric structures are in contact with sidewalls of the first source/drain features, the second source/drain features, and the gate structures.

In some embodiments, the nanostructures are in contact with sidewalls of the dielectric structures.

In some embodiments, the nanostructures are separated from the dielectric structures in the Y-direction.

In some embodiments, bottom surfaces of the dielectric structures are in contact with the substrate.

In some embodiments, the method further includes forming a source/drain contact over one of the dielectric structures and one of the first source/drain features in contact with the one of the dielectric structures.

In some embodiments, the source/drain contact is over one of the second source/drain features in contact with the one of the dielectric structures.

In some embodiments, the source/drain contact is further over one of the second source/drain features in contact with another one of the dielectric structures.

In some embodiments, the dielectric structures are first dielectric structures, and the method further includes forming an isolation structure between the active areas, and forming a second dielectric structure between adjacent two of the active areas and in contact with the isolation structure.

In some embodiments, the second dielectric structure is in contact with the substrate.

In some embodiments, the dielectric structures comprise $Si_3N_4$, $SiO_2$, SiOC, SiON, SiOCN, or combinations thereof.

In another of the embodiments, discussed is a method for manufacturing a semiconductor structure including forming nanostructures in an active area extending in an X-direction and on a substrate, forming a merged source/drain feature attached to the nanostructures, forming a dielectric structure extending in the X-direction and in the active area to cut the merged source/drain feature into a first source/drain feature and a second source/drain feature on opposite sides of the dielectric structure in a Y-direction, and forming a first gate structure and a second gate structure extending in the Y-direction. Each of the first gate structure and the second gate structure wraps around the nanostructures. The method further includes forming a metal conductor over the dielectric structure. The dielectric structure is in contact with sidewalls of the first source/drain feature, the second source/drain feature, the first gate structure, and the second gate structure.

In some embodiments, the method further includes forming a dummy gate structure extending in the Y-direction and across the active area in a top view, cutting the dummy gate structure into a first segment and a second segment by the dielectric structure, and replacing the first segment and the second segment to form the first gate structure and the second gate structure.

In some embodiments, the method further includes forming a source/drain contact in contact with and over the dielectric structure and the first source/drain feature. The metal conductor is electrically connected to the source/drain contact.

In some embodiments, the source/drain contact partially covers the dielectric structure.

In some embodiments, a distance from a top surface of the dielectric structure to top surfaces of the first source/drain feature and the second source/drain feature in the Z-direction is in a range from about 5 nm to about 50 nm.

In some embodiments, a width of the dielectric structure in the Y-direction is in a range from about 10 nm to about 60 nm.

In some embodiments, a distance from a bottom surface of the dielectric structure to a topmost surface of the substrate in the Z-direction is in a range from about 10 nm to about 150 nm.

In yet another of the embodiments, discussed is a semiconductor structure that includes a first circuit cell and a second circuit cell, a dielectric structure, a first source/drain feature, and a second source/drain feature. The first circuit cell and the second circuit cell each has transistors. Each of the transistors includes nanostructures vertically stacked from each other in a Z-direction and a gate structure wrapping around the nanostructures and extending in a Y-direction. The dielectric structure extends in an X-direction and between the first circuit cell and the second circuit cell in the Y-direction. The first source/drain feature is in the first circuit cell. The second source/drain feature is in the second circuit cell. The first source/drain feature and the second source/drain feature are in contact with and on opposite sides of the dielectric structure in the Y-direction. The dielectric structure is in contact with the gate structures of the first circuit cell and the second circuit cell.

In some embodiments, the first source/drain feature and the second source/drain feature have the same type of dopant.

In some embodiments, a top surface of the dielectric structure is substantially level with top surfaces of the gate structures of the first circuit cell and the second circuit cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
- defining active areas extending in a first direction, arranged in a second direction, and on a substrate, wherein each of the active areas has nanostructures;
- forming dummy gate structures across the active areas in the second direction;
- forming merged source/drain features in the active areas and on opposite sides of the dummy gate structures in the first direction;
- forming dielectric structures in the active areas to cut each of the merged source/drain features into a first source/drain feature and a second source/drain feature, and to cut each of the dummy gate structures into segments; and
- replacing the segments of the dummy gate structures with gate structures wrapping around the nanostructures in the active areas, wherein the dielectric structures are in contact with sidewalls of the first source/drain features, the second source/drain features, and the gate structures.

2. The method of claim 1, wherein the nanostructures are in contact with sidewalls of the dielectric structures.

3. The method of claim 1, wherein the nanostructures are separated from the dielectric structures in the second direction.

4. The method of claim 1, wherein bottom surfaces of the dielectric structures are in contact with the substrate.

5. The method of claim 1, further comprising:
- forming a source/drain contact over one of the dielectric structures and one of the first source/drain features in contact with the one of the dielectric structures.

6. The method of claim 5, wherein the source/drain contact is over one of the second source/drain features in contact with the one of the dielectric structures.

7. The method of claim 5, wherein the source/drain contact is further over one of the second source/drain features in contact with another one of the dielectric structures.

8. The method of claim 1, wherein the dielectric structures are first dielectric structures, and the method further comprises:
- forming an isolation structure between the active areas; and
- forming a second dielectric structure between adjacent two of the active areas and in contact with the isolation structure.

9. The method of claim 8, wherein the second dielectric structure is in contact with the substrate.

10. The method of claim 1, wherein the dielectric structures comprise Si3N4, SiO2, SiOC, SION, SiOCN, or combinations thereof.

11. A method for manufacturing a semiconductor structure, comprising:
- forming nanostructures in an active area extending in a first direction and on a substrate;
- forming a dummy gate structure extending in a second direction and across the active area in a top view;
- forming a merged source/drain feature attached to the nanostructures;
- forming a dielectric structure extending in the first direction and in the active area to cut the merged source/drain feature into a first source/drain feature and a second source/drain feature on opposite sides of the dielectric structure in the second direction and to cut the dummy gate structure into a first segment and a second segment by the dielectric structure;
- replacing the first segment and the second segment to form a first gate structure and a second gate structure extending in the second direction, wherein each of the first gate structure and the second gate structure wraps around the nanostructures; and
- forming a metal conductor over the dielectric structure,
- wherein the dielectric structure is in contact with sidewalls of the first source/drain feature, the second source/drain feature, the first gate structure, and the second gate structure.

12. The method of claim 11, further comprising:
- forming a source/drain contact in contact with and over the dielectric structure and the first source/drain feature, wherein the metal conductor is electrically connected to the source/drain contact.

13. The method of claim 12, wherein the source/drain contact partially covers the dielectric structure.

14. The method of claim 11, wherein a distance from a top surface of the dielectric structure to top surfaces of the first source/drain feature and the second source/drain feature in a third direction is in a range from about 5 nm to about 50 nm.

15. The method of claim 11, wherein a width of the dielectric structure in the second direction is in a range from about 10 nm to about 60 nm.

16. The method of claim 11, wherein a distance from a bottom surface of the dielectric structure to a topmost surface of the substrate in a third direction is in a range from about 10 nm to about 150 nm.

17. The method of claim 11, wherein a bottom surface of the dielectric structure is in contact with the substrate.

18. A method, comprising:

forming a first dummy gate structure extending in a first direction across a cell boundary and a second dummy gate structure extending in the first direction across the cell boundary and offset from the first dummy gate structure;

replacing a first portion of the second dummy gate structure on a first side of the cell boundary with a dielectric gate structure;

forming a merged source/drain feature extending in the first direction across the cell boundary and positioned between the first dummy gate structure, the second dummy gate structure, and the dielectric gate structure; and forming a trench that extends in the first direction along the cell boundary to define:

a first source/drain feature and a second source/drain feature each formed from the merged source/drain feature, a first segment and a second segment each formed from the first dummy gate structure, and a third segment formed from a second portion of the second dummy gate structure on a second side of the cell boundary.

19. The method of claim 18, comprising:

forming a dielectric structure in the trench.

20. The method of claim 18, comprising:

forming vertically stacked semiconductor layers extending across the cell boundary;

wherein forming the trench comprises:

defining first nanostructures and second nanostructures from the vertically stacked semiconductor layers.

* * * * *